(12) United States Patent
Wakabayashi et al.

(10) Patent No.: US 7,459,340 B2
(45) Date of Patent: Dec. 2, 2008

(54) SEMICONDUCTOR DEVICE AND MANUFACTURING METHOD THEREOF

(75) Inventors: Takeshi Wakabayashi, Sayama (JP); Ichiro Mihara, Tachikawa (JP)

(73) Assignee: Casio Computer Co., Ltd., Tokyo (JP)

( * ) Notice: Subject to any disclaimer, the term of this patent is extended or adjusted under 35 U.S.C. 154(b) by 470 days.

(21) Appl. No.: 11/302,592

(22) Filed: Dec. 12, 2005

(65) Prior Publication Data

US 2006/0125082 A1 Jun. 15, 2006

(30) Foreign Application Priority Data

Dec. 14, 2004 (JP) ............................. 2004-361092
Dec. 15, 2004 (JP) ............................. 2004-362117

(51) Int. Cl.
*H01L 21/44* (2006.01)
*H01L 21/48* (2006.01)
*H01L 21/50* (2006.01)

(52) U.S. Cl. .................. 438/107; 438/106; 438/597; 257/698; 257/E21.499

(58) Field of Classification Search ........... 257/E21.499
See application file for complete search history.

(56) References Cited

U.S. PATENT DOCUMENTS 7,183,639 B2 * 2/2007 Mihara et al. ............... 257/690
2005/0051886 A1 * 3/2005 Mihara et al. ............... 257/690

FOREIGN PATENT DOCUMENTS

| JP | 08-088248 A | 4/1996 |
| JP | 11-168112 A | 6/1999 |
| JP | 2000-058592 A | 2/2000 |
| JP | 2002-134653 A | 5/2002 |
| JP | 2003-142528 A | 5/2003 |
| JP | 2004-072032 A | 3/2004 |
| JP | 2004-221417 A | 8/2004 |
| JP | 2004-221418 A | 8/2004 |
| JP | 2004-288959 A | 10/2004 |

\* cited by examiner

*Primary Examiner*—Walter L Lindsay, Jr.
*Assistant Examiner*—Mohsen Ahmadi
(74) *Attorney, Agent, or Firm*—Frishauf, Holtz, Goodman & Chick, P.C.

(57) ABSTRACT

A semiconductor device includes a base plate made of a material including at least a thermosetting resin, and having an opening, a vertical conductor filled and provided in the opening of the base plate, at least one semiconductor construct having a semiconductor substrate and a plurality of external connection electrodes provided on one side of the semiconductor substrate, and an insulating layer secured to and provided on a periphery of the semiconductor construct. The insulating layer is secured to the base plate, and the external connection electrodes of the semiconductor construct are bonded to the vertical conductor.

16 Claims, 50 Drawing Sheets

SEMICONDUCTOR DEVICE AND MANUFACTURING METHOD THEREOF

CROSS-REFERENCE TO RELATED APPLICATIONS

This application is based upon and claims the benefit of priority from prior Japanese Patent Applications No. 2004-361092, filed Dec. 14, 2004; and No. 2004-362117, filed Dec. 15, 2004, the entire contents of both of which are incorporated herein by reference.

BACKGROUND OF THE INVENTION

1. Field of the Invention

This invention relates to a semiconductor device and a manufacturing method thereof.

2. Description of the Related Art

Conventional semiconductor devices include one called a chip size package (CSP). The CSP literally means a semiconductor package having substantially the same plane size as that of a semiconductor chip. Recently, a semiconductor chip has emerged in which external connection electrodes can not be disposed within about the same plane size as that of the semiconductor chip, along with an increase in the number of external connection electrodes. For such a semiconductor chip, a structure is employed in which the external connection electrodes are disposed within a plane size that is one size larger than that of the semiconductor chip. Jpn. Pat. Appln. KOKAI Publication No. 2004-221417 describes semiconductor device having such a structure. In this patent, in order to provide solder balls as connection terminals outside a size of a semiconductor construct, there is provided a device having following structures the semiconductor construct having a plurality of columnar electrodes on an upper surface side is bonded to an upper surface of a base plate via a bonding layer. An insulating layer is provided on the upper surface of the base plate around the semiconductor construct. An upper layer insulating film is provided on upper surfaces of the semiconductor construct and the insulating layer. Openings are provided in the upper layer insulating film on the columnar electrodes of the semiconductor construct. Upper layer wiring line are provided on an upper surface of the upper layer insulating film in such a manner as to connect the respective upper layer wiring lines to the columnar electrodes of the semiconductor construct via the openings of the upper layer insulating film a part except for a connection pad portion of each of the upper layer wiring lines is covered with an overcoat film. The solder ball is provided on the connection pad portion of each the upper layer wiring line.

In the meantime, in the conventional semiconductor device described above, the upper layer wiring line is formed by electrolytic plating, but a part of the upper layer wiring line is formed in the opening of the upper layer insulating film so that it is connected to the columnar electrode of the semiconductor construct via the opening of the upper layer insulating film. On the other hand, if a diameter of the columnar electrode is reduced due to higher density of the semiconductor construct called the CSP, a diameter of the opening formed in the upper layer insulating film on the columnar electrode is also reduced accordingly. Further, if air bubbles or the like enter the opening of the upper layer insulating film having a small diameter when the electrolytic plating is performed to form the upper layer wiring line, the air bubbles or the like that entered are not easily discharged, so that there is a problem that a plating solution does not infiltrate into the opening containing the air bubbles or the like, that voids are produced, and that breaking of the wiring lines and a loose connection are caused.

BRIEF SUMMARY OF THE INVENTION

It is therefore an object of this invention to provide a semiconductor device and a manufacturing method thereof which can prevent air bubbles or the like from entering an opening for vertical conduction formed in an insulating layer or the like when electrolytic plating is performed to form a wiring line even if a diameter of the opening is reduced.

According to a first aspect of this invention there is provided a semiconductor device comprising:

a base plate made of a material including at least a thermosetting resin, and having an opening;

a vertical conductor filled and provided in the opening of the base plate;

at least one semiconductor construct having a semiconductor substrate and a plurality of external connection electrodes provided on one side of the semiconductor substrate; and an insulating layer secured to and provided on a periphery of the semiconductor construct, wherein the insulating layer is secured to the base plate, and the external connection electrodes of the semiconductor construct are bonded to the vertical conductor.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate embodiments of the invention, and together with the general description given above and the detailed description of the embodiments given below, serve to explain the principles of the invention.

DETAILED DESCRIPTION OF THE INVENTION

First Embodiment

Figure 1:
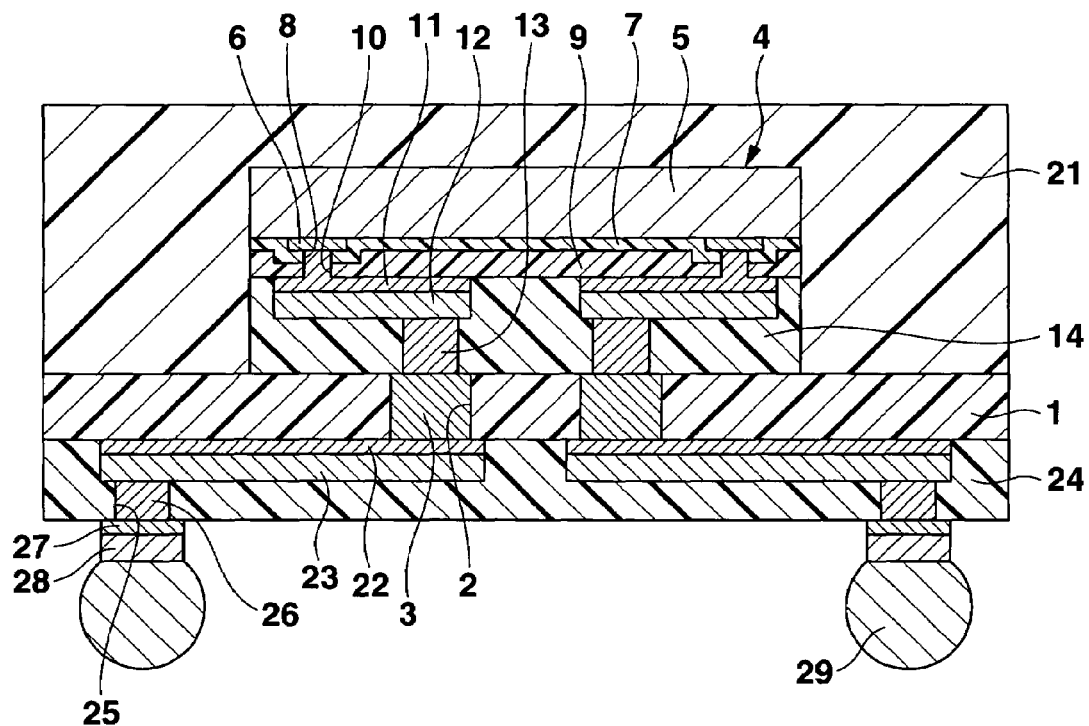
FIG. 1 is a sectional view of a semiconductor device as a first embodiment of this invention.

FIG. 1 shows a sectional view of a semiconductor device as a first embodiment of this invention. The semiconductor device includes a planar square base plate 1. The base plate 1 is made of a material in which reinforcing materials such as glass fibers or aramid fibers are mixed into a thermosetting resin such as an epoxy-based resin, a polyimide-based resin or the like. In this case, openings 2 for vertical conduction are provided at a plurality of predetermined places of the base plate 1, and a vertical conductor 3 formed by curing a conductive paste such as copper paste in an uncured state is provided in the opening 2. The conductor 3 may have a columnar shape having a circular cross-section.

A planar square semiconductor construct 4 having a size somewhat smaller than that of the base plate 1 is directly secured face down at a predetermined central place onto an upper surface of the base plate 1. The semiconductor construct 4 has elongated wiring lines 12, columnar electrodes preferably having a circular cross-section 13 and a sealing film 14 which will be described later. This semiconductor construct 4 is generally called a CSP, and in particular, is also called a wafer level CSP (W-CSP) when a method is employed in which the respective semiconductor constructs 4 are obtained by dicing after forming the wiring lines 12, the columnar electrodes 13 and the sealing films 14 under silicon substrates 5 in a wafer state. A configuration of the semiconductor construct 4 will be described below.

The semiconductor construct 4 includes the silicon substrate (semiconductor substrate) 5. An integrated circuit (not shown) having a predetermined function is provided on a lower surface of the silicon substrate 5, and a plurality of connection pads 6 made of an aluminum-based metal or the like are provided in a peripheral portion of the lower surface in such a manner as to be connected to the integrated circuit. An insulating film 7 made of silicon oxide or the like is provided on the lower surface of the silicon substrate 5 except for a central portion of each connection pad 6. The central portion of the connection pad 6 is exposed via an opening 8 formed through the insulating film 7.

A protective film 9 made of an epoxy-based resin or a polyimide-based resin is provided on a lower surface of the insulating film 7. In this case, an opening 10 is provided through the protective film 9 in a portion corresponding to each of the openings 8 of the insulating film 7. Plurality of a foundation metal layers 11 made of copper or the like are provided on a lower surface of the protective film 9. A wiring line 12 made of copper is provided on an entire lower surface of each of the foundation metal layers 11. One end (external end) of the foundation metal layer 11 is connected to the connection pad 6 via both the openings 8 and 10, and the wiring line 12 is thus electrically connected to the connection pad.

The columnar electrode (external connection electrode) 13 made of copper is provided on a lower surface of a connection pad portion (internal end opposite to the connection 6) of the wiring line 12. The sealing film 14 made of an epoxy-based resin or a polyimide-based resin is provided on the lower surfaces of the wiring lines 12 and the protective film 9 so that a lower surface thereof may form the same plane with lower surfaces of the columnar electrodes 13. Thus, the semiconductor construct 4 called the W-CSP includes the silicon substrate 5, the connection pads 6 and the insulating film 7, and further comprises the protective film 9, the wiring lines 12, the columnar electrodes 13 and the sealing film 14.

This semiconductor construct 4 called the W-CSP is directly secured face down at a predetermined central place onto the upper surface of the base plate 1. That is, the lower surface of the columnar electrode 13 is directly secured (bonded) substantially at the center of the vertical conductor 3, and a lower surface of the sealing film 14 is directly secured mainly onto the upper surface of the base plate 1. In this case, a diameter of the vertical conductor 3 (opening 2) is slightly larger than a diameter of the columnar electrode 13, but may be substantially the same as or slightly smaller than the diameter of the columnar electrode 13.

An insulating layer 21 made of an epoxy-based resin or a polyimide-based resin is provided on an upper surface of the semiconductor construct 4 and the upper surface of the base plate 1 around the semiconductor construct 4 in such a manner that an upper surface of the insulating layer 21 is flat. A plurality of first lower layer foundation metal layers 22 made of copper or the like are provided on lower surfaces of the vertical conductors 3 and the base plate 1. A first lower surface wiring line (wiring line) 23 made of copper is provided on an entire lower surface of the first lower layer foundation metal layer 22. The first elongated layer 22 and wiring line 23 are connected at one end to a lower surface of each of the vertical conductors 3.

A lower layer insulating film 24 made of the same material as that of the base plate 1 is provided on lower surfaces of the first lower surface wiring lines 23 and the base plate 1. An opening 25 for vertical conduction is provided in the lower layer insulating film 24 in a portion corresponding to a connection pad portion of each of wiring lines 23, and a vertical conductor 26 preferably having a circular cross-section formed by curing a conductive paste such as copper paste in an uncured state is provided in the opening 25 in such a manner as to be electrically connected to a lower surface of the connection pad portion of the first lower surface wiring line 23.

A plurality of second lower layer foundation metal layers 27 made of copper or the like are provided on lower surfaces of the vertical conductors 26 and the lower layer insulating film 24. A second lower layer wiring line 28 made of copper is provided on an entire lower surface of the lower layer foundation metal layer 27. The second-metal layer 27 and the wiring line 28 are electrically connected at one end to the lower surface of the vertical conductor 26. A solder ball 29 is provided on a lower surface of a connection pad portion of the second lower layer wiring line 28. A plurality of solder balls 29 are arranged in a matrix form substantially in the whole area under the lower layer insulating film 24.

Figure 2:
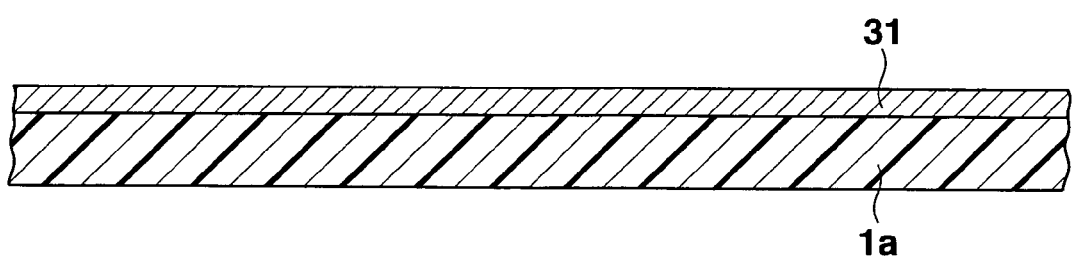
FIG. 2 is a sectional view of an assembly to explain an initial step in one example of a manufacturing method of the semiconductor device shown in FIG. 1.

Next, one example of a manufacturing method of this semiconductor device will be described. First, as shown in FIG. 2, a planar square base plate forming sheet 1a not limited to but made of a thermosetting resin containing a reinforcing material is prepared which has an area allowing a plurality of completed semiconductor devices shown in FIG. 1 to be formed. In this case, the thermosetting resin including an epoxy-based resin or the like which constitutes the base plate forming sheet 1a is in a semi-cured state. Next, a sheet 31 for formation of a protrusion described later is affixed onto an upper surface of the base plate forming sheet 1a. In this case, as described later, the protrusion forming sheet 31 is released from the sheet 1a in a subsequent step, so that it is desirable that a release agent be applied to one of the protrusion forming sheet 31 and the base plate forming sheet 1a.

Figure 3:
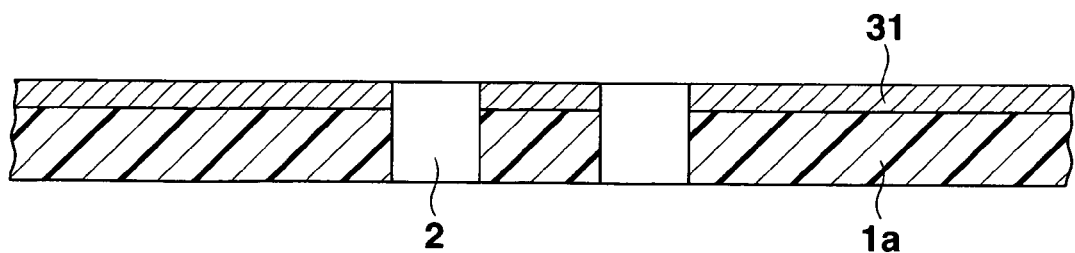
FIG. 3 is a sectional view of the assembly to explain a step following the step shown in FIG. 2.
Figure 4:
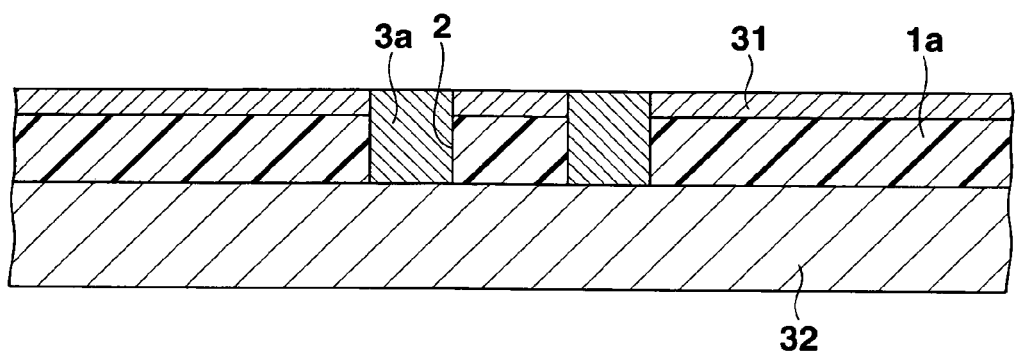
FIG. 4 is a sectional view of the assembly to explain a step following the step shown in FIG. 3.

Next, as shown in FIG. 3, the openings 2 are formed at a plurality of predetermined places of the base plate forming sheet 1a and the protrusion forming sheet 31 by laser processing which applies laser beam such as $CO_2$ laser. Next, as shown in FIG. 4, a protective sheet 32 is prepared, and the base plate forming sheet 1a is mounted on an upper surface of the protective sheet 32. Then, a vertical conductor forming paste 3a including a conductive paste such as copper paste is filled into the opening 2 of the base plate forming sheet 1a and the protrusion forming sheet 31 by screen printing or the like. The vertical conductor forming paste 3a completely fills the opening 2 so that voids or the like are not created in the opening 2.

Figure 5:
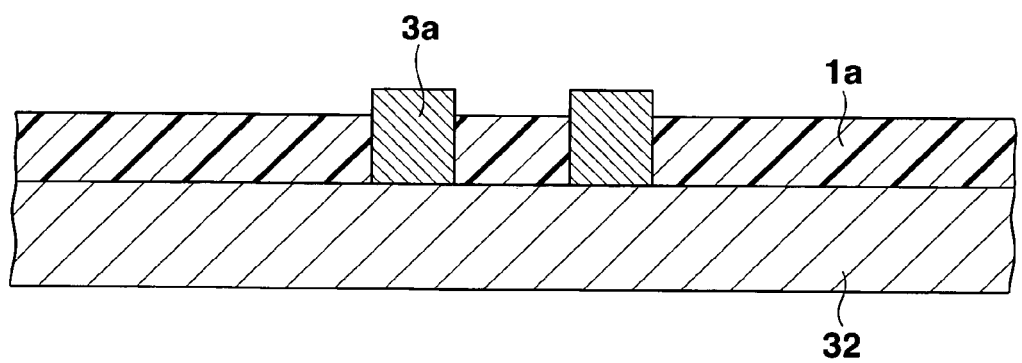
FIG. 5 is a sectional view of the assembly to explain a step following the step shown in FIG. 4.
Figure 6:
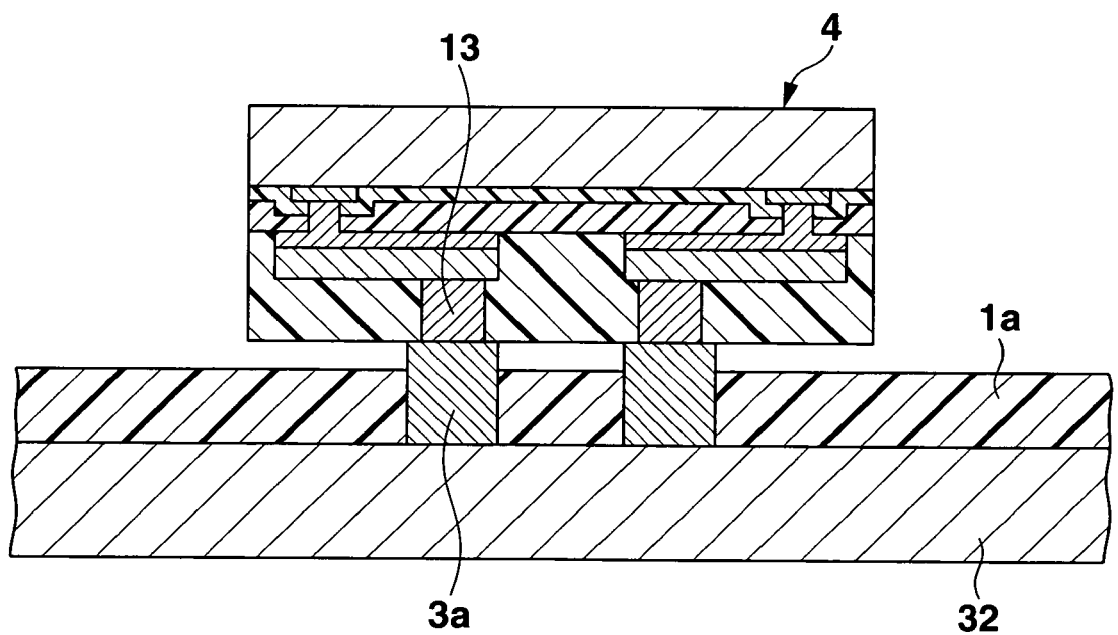
FIG. 6 is a sectional view of the assembly to explain a step following the step shown in FIG. 5.

Next, the protrusion forming sheet 31 is released, so that an upper portion of the vertical conductor forming paste 3a is in a state protruding from the upper surface of the base plate forming sheet 1a to the extent corresponding to thickness of the protrusion forming sheet 31, as shown in FIG. 5. Next, as shown in FIG. 6, the lower surfaces of the columnar electrodes 13 of a plurality of semiconductor constructs only one semiconductor construct is shown 4 are respectively aligned with a portion substantially at the center of an upper surface of the vertical conductor forming pastes 3a protruding from the upper surface of the base plate forming sheet 1a, and then temporarily press-bonded (temporarily secured) thereto. That is, the lower surface of the columnar electrode 13 of the semiconductor construct 4 is temporarily press-bonded to the portion substantially at the center of the upper surface of the vertical conductor forming paste 3a in a preheated state together with application of a relatively low pressure by use of a bonding tool (not shown) with a heating mechanism. In this state, a plurality of semiconductor constructs 4 are temporarily secured onto the base plate forming sheet 1a in such a manner as to leave space between them.

Figure 7:
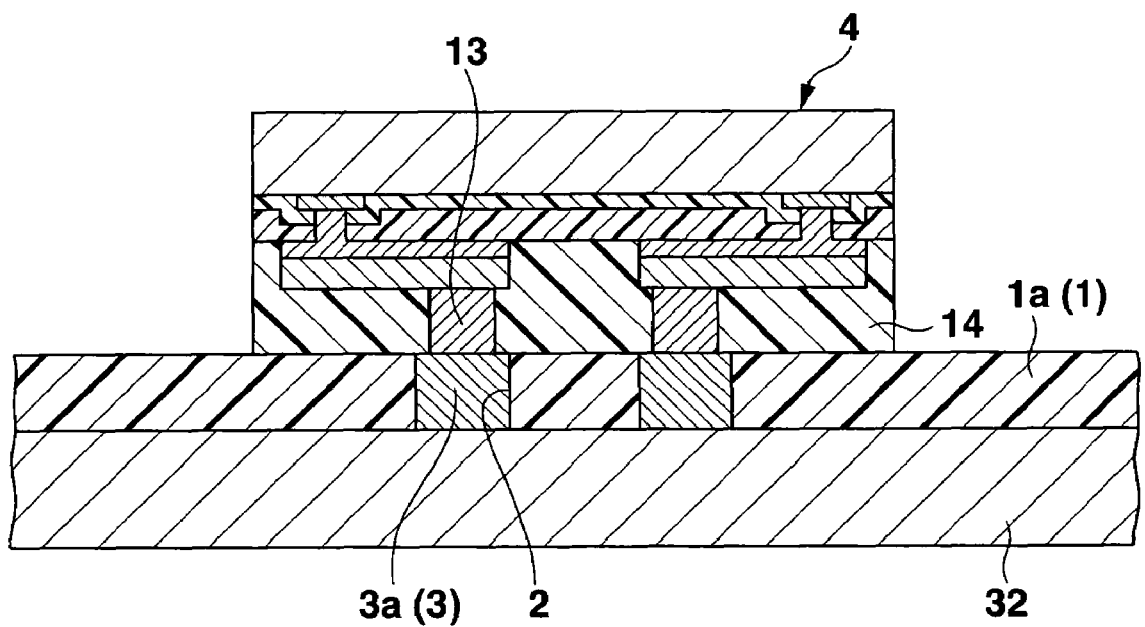
FIG. 7 is a sectional view of the assembly to explain a step following the step shown in FIG. 6.

Next, hot pressing is carried out from above and beneath using a pair of hot pressing plates (not shown). Then, as shown in FIG. 7, first, the protrusion of the paste 3a protruding from the upper surface of the sheet 1a is completely pressed into the opening 2 of the sheet 1a by the lower surface of the semiconductor construct 4. The lower surface of the semiconductor construct 4 is thus in a state pressure-welded to the upper surfaces of the pastes 3a and the sheet 1a. Then, the thermosetting resin such as an epoxy-based resin thus in the base plate forming sheet 1a cures, and the base plate 1 is formed. Simultaneously, the vertical conductor forming paste 3a cures, and thus the vertical conductor 3 is formed.

Consequently, the semiconductor construct 4 is directly secured face down at the predetermined place onto the upper surface of the base plate 1. That is, the lower surface of the columnar electrode 13 is directly secured (bonded) substantially at the center of the vertical conductor 3, and the lower surface of the sealing film 14 is directly secured mainly onto the upper surface of the base plate 1. Here, in a state shown in FIG. 6, the upper portion of the vertical conductor forming paste 3a protrudes from the upper surface of the base plate forming sheet 1a such that the lower surface of the columnar electrode 13 which forms the same surface with the lower surface of the sealing film 14 is reliably and rigidly secured substantially at the center of an upper surface of the vertical conductor 3.

Figure 8:
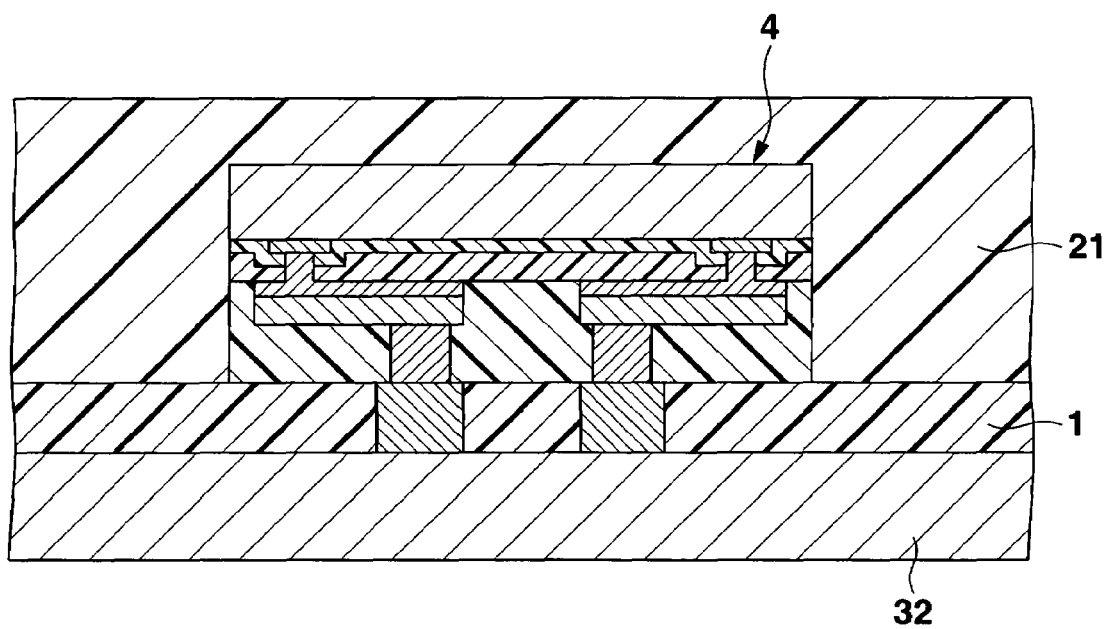
FIG. 8 is a sectional view of the assembly to explain a step following the step shown in FIG. 7.

Next, as shown in FIG. 8, a liquid thermosetting resin such as an epoxy-based resin is applied onto the upper surface of the semiconductor construct 4 and the upper surface of the base plate 1 around the semiconductor construct 4 by a screen printing method, a spin coat method or the like, and then cured, thereby securing the insulating layer 21 onto the upper surface of the base plate 1 and also securing it onto the upper surface and side surface of the semiconductor construct 4 except for the lower surface thereof. In this case, it is preferable to flatten the upper surface of the insulating layer 21 by carrying out the hot pressing from above and beneath using the pair of hot pressing plates after the liquid thermosetting resin is applied thereto. In this state, since the base plate 1 and the insulating layer 21 are cured, the protective sheet 32 is then released.

Figure 9:
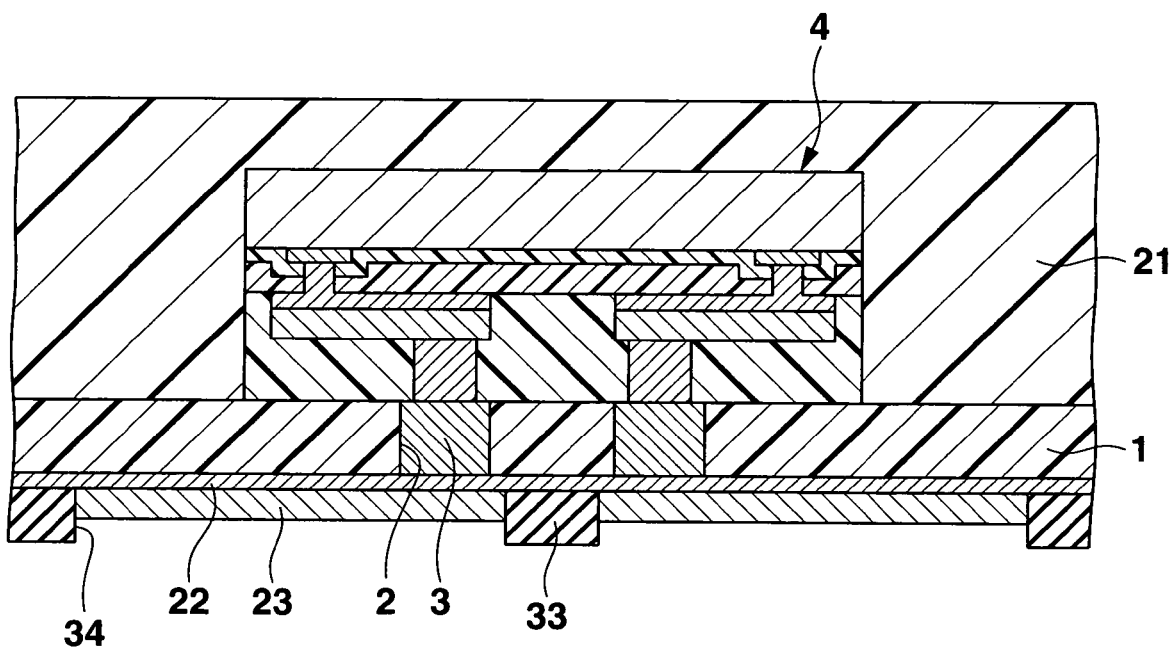
FIG. 9 is a sectional view of the assembly to explain a step following the step shown in FIG. 8.

Next, as shown in FIG. 9, the first lower layer foundation metal layer 22 is formed on the entire lower surfaces of the vertical conductor 3 and the base plate 1. In this case, the metal layer 22 may only be a copper layer formed by electroless plating, may only be a copper layer formed by sputtering, or may be a layer in which a copper layer is formed by sputtering on a thin film layer such as titanium formed by sputtering.

Next, a plating resist film 33 is formed on a lower surface of the first lower layer foundation metal layer 22, and patterned to form. Openings 34 in the plating resist film 33 in a portion corresponding to areas where the first lower surface wiring lines 23 are to be formed. Next, the first lower layer foundation metal layer 22 is used as a plating current passage to electrolytically plate copper, thereby forming the first lower surface wiring lines 23 on a lower surface of the first lower layer foundation metal layer 22 in the openings 34 of the plating resist film 33.

In this case, since the cured vertical conductors 3 are formed in the openings 2 of the base plate 1, the lower surfaces of the vertical conductors 3 and the base plate 1 are flat. As a result, the lower surface of the first lower layer foundation metal layer 22 formed on the entire lower surfaces of the vertical conductors 3 and the base plate 1 is also flat. Therefore, even if a diameter of the opening 2 of the base plate 1 is reduced, it is possible to completely prevent air bubbles or the like from entering the opening 2 of the base plate 1 when the wiring line 23 is formed on the metal layer 22 in the opening 34 of the plating resist film 33 by electrolytic plating.

Figure 10:
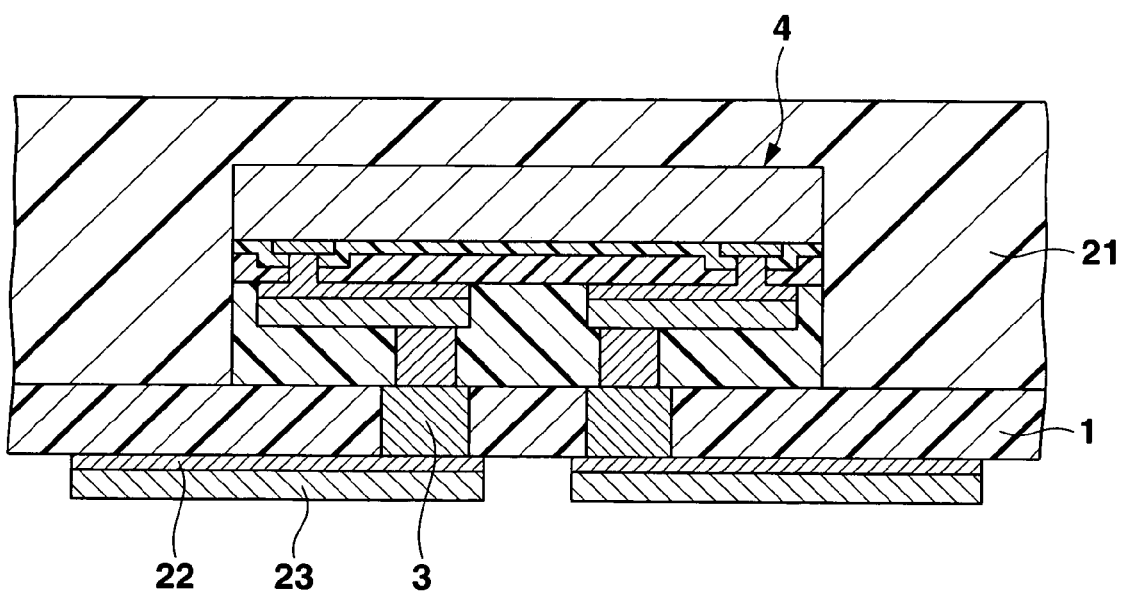
FIG. 10 is a sectional view of the assembly to explain a step following the step shown in FIG. 9.

Next, the plating resist film 33 is removed, and then unnecessary portions of the first lower layer foundation metal layer 22 are etched and removed using the first lower surface wiring lines 23 as a mask, with the result that the metal layers 22 remain only under the wiring lines 23, as shown in FIG. 10. In this state, the first metal layer 22 and wiring line 23 are electrically connected at one end to the lower surface of the vertical conductor 3.

Figure 11:
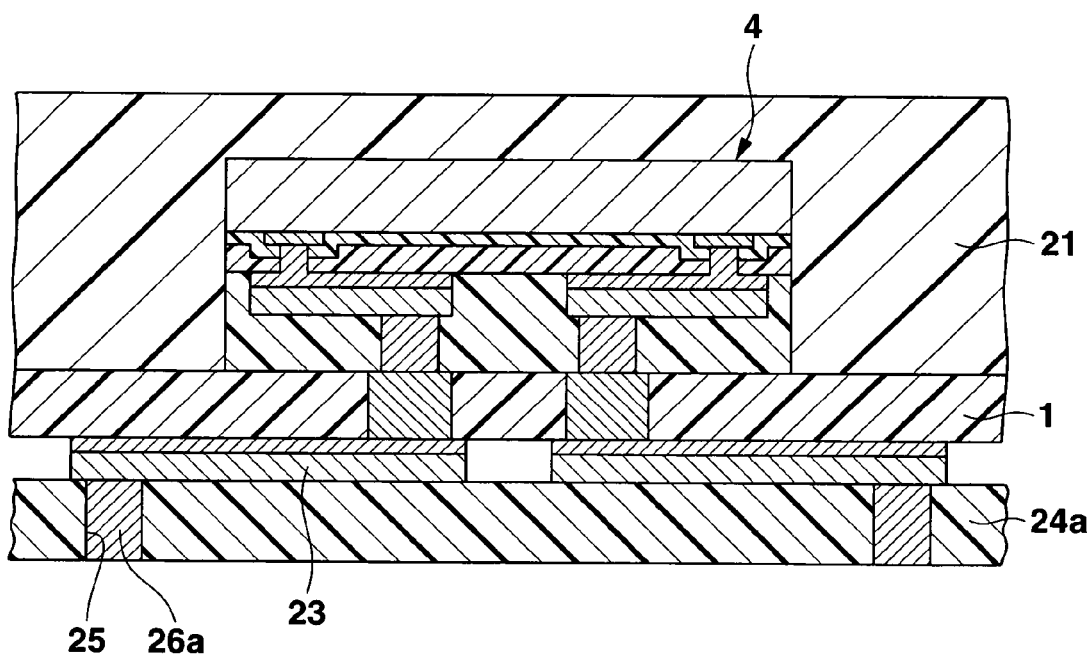
FIG. 11 is a sectional view of the assembly to explain a step following the step shown in FIG. 10.

Next, as shown in FIG. 11, a planar square lower layer insulating film forming sheet 24a is prepared which is made of a thermosetting resin containing reinforcing materials. In this case, the thermosetting resin such as an epoxy-based resin constituting the insulating film forming sheet 24a is in a semi-cured state. Further, the openings 25 are formed in a plurality of predetermined places of the insulating film forming sheet 24a by laser processing which applies laser beam such as $CO_2$ laser. A vertical conductor forming paste 26a such as a conductive paste mad of, for example copper paste is filled in the opening 25 by the screen printing method or the like. The paste 26a is completely filled into the opening 25 so that voids or the like are not created in the opening 25 in the same manner as the vertical conductor forming paste 3a described above. The expression "to fill the vertical conductor forming paste into the opening" will hereinafter mean the same thing as the above.

Furthermore, the first lower surface wiring line 23 formed under the base plate 1 is aligned with and disposed on upper surfaces of the vertical conductor forming paste 26a and the lower layer insulating film forming sheet 24a. In this state, a portion substantially at the center of a lower surface of the connection pad portion of the wiring line 23 is disposed on the upper surface of the vertical conductor forming paste 26a.

Figure 12:
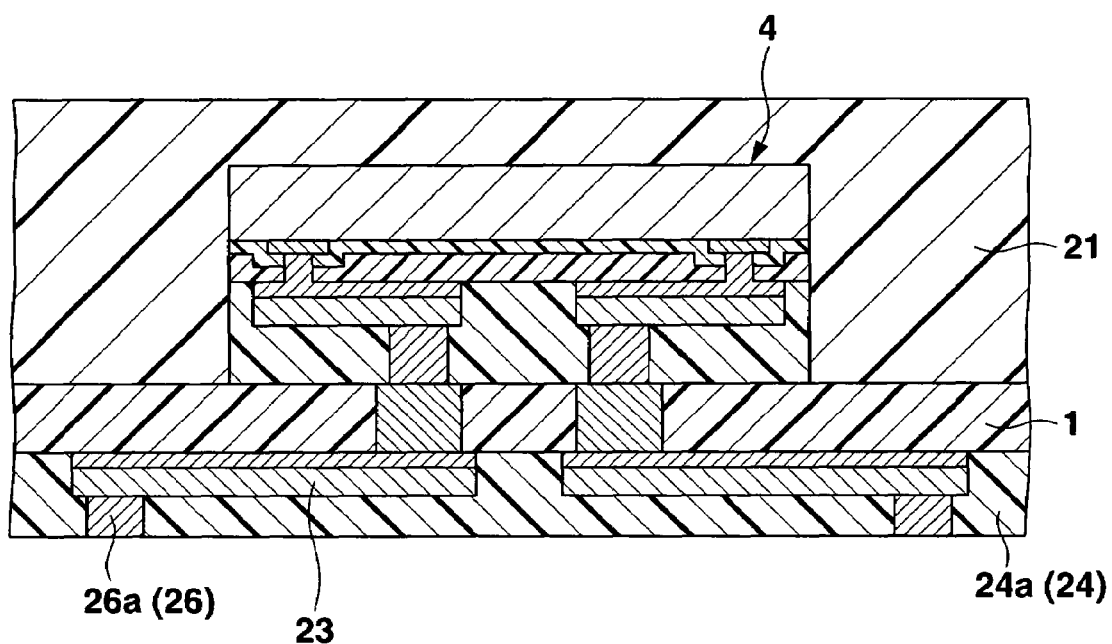
FIG. 12 is a sectional view of the assembly to explain a step following the step shown in FIG. 11.

Next, hot pressing is carried out from above and beneath using a pair of hot pressing plates (not shown). Then, as shown in FIG. 12, the thermosetting resin such as an epoxy-based resin in the lower layer insulating film forming sheet 24a cures, and thus the lower layer insulating film 24 is formed on the lower surfaces of the first lower surface wiring lines 23 and the base plate 1. Moreover, the vertical conductor forming paste 26a cures, so that the vertical conductor 26 is formed. In this state, an upper surface of the vertical conductor 26 is connected substantially to the center of a lower surface of the connection pad portion of the first lower surface wiring line 23.

Figure 13:
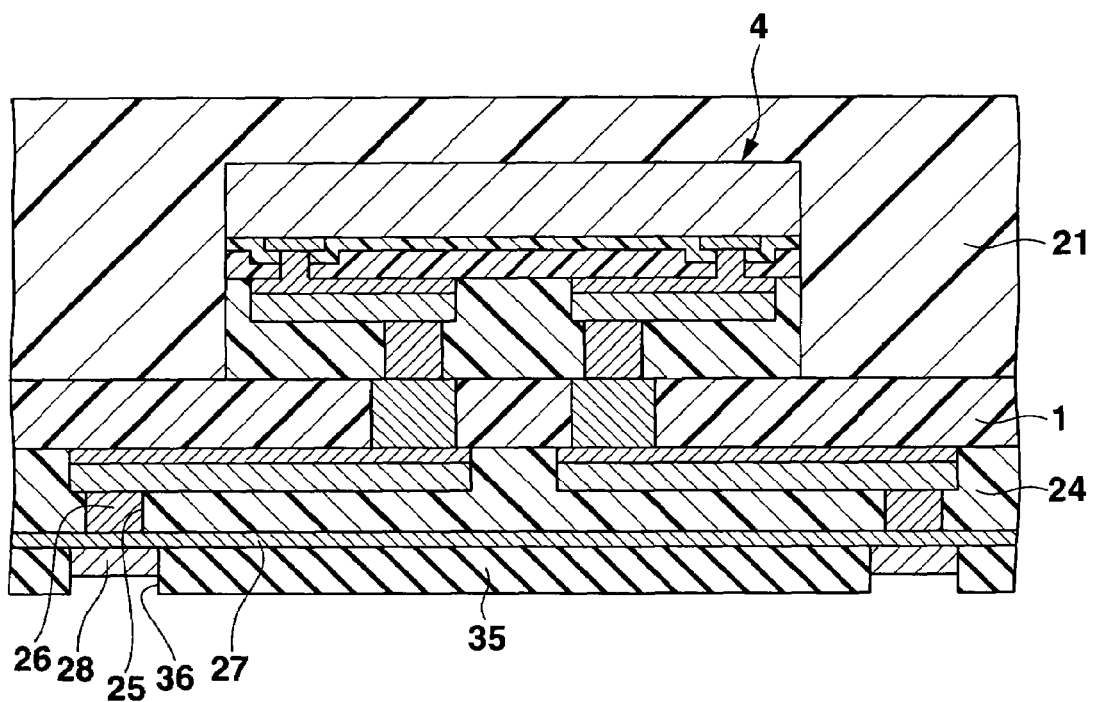
FIG. 13 is a sectional view of the assembly to explain a step following the step shown in FIG. 12.

Next, as shown in FIG. 13, the second lower layer foundation metal layer 27 is formed on the entire lower surfaces of the vertical conductors 26 and the lower layer insulating film 24 by, for example, electroless plating of copper. Next, a plating resist film 35 is formed on the lower surface of the metal layer 27, and patterned so that openings are formed in the plating resist film 35 in a portion corresponding to areas where the second lower layer wiring lines 28 are formed. Next, electrolytic plating of copper is carried out using the second lower layer foundation metal layer 27 as a plating current passage, thereby forming the second lower layer wiring lines 28 on the lower surface of the second lower layer foundation metal layer 27 in the openings 36 of the resist film 35.

In this case as well, since the cured vertical conductors 26 are formed in the openings 25 of the lower layer insulating film 24, the lower surfaces of the vertical conductors 26 and the lower layer insulating film 24 are flat. As a result, the lower surface of the second lower layer foundation metal layer 27 formed on the entire lower surfaces of the vertical conductors 26 and the lower layer insulating film 24 is also flat. Therefore, even if a diameter of the opening 25 of the lower layer insulating film 24 is reduced, it is possible to completely prevent air bubbles or the like from entering the opening 25 of the insulating film 24 when the second lower layer wiring line 28 is formed on the lower surface of the second lower layer foundation metal layer 27 in the opening 36 of the plating resist film 35 by electrolytic plating.

Figure 14:
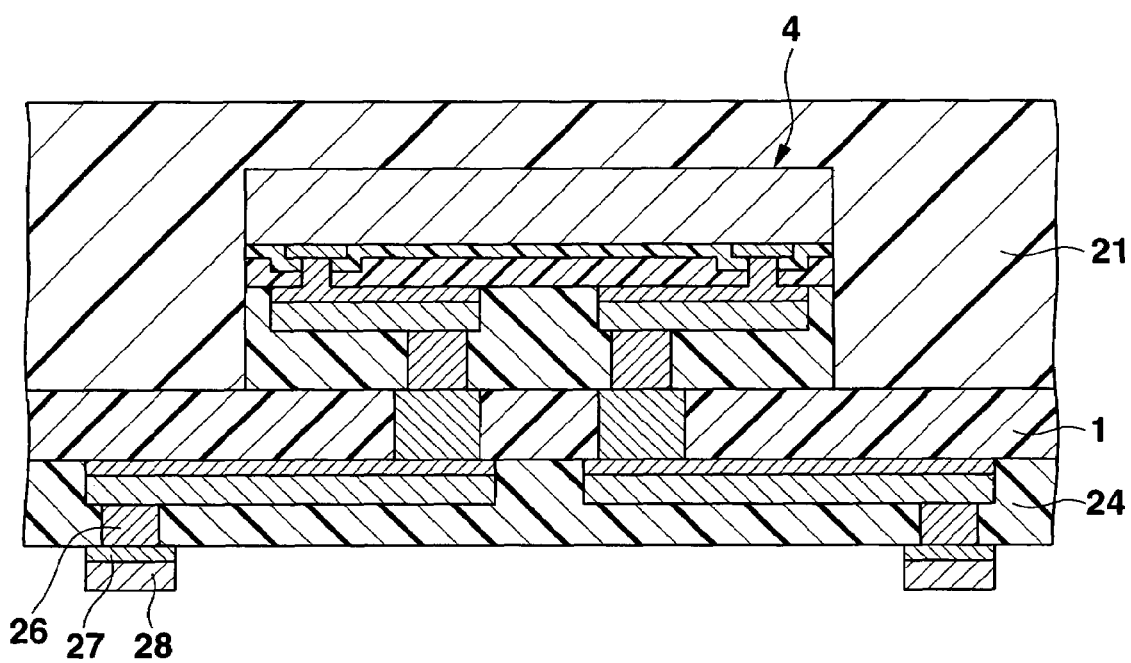
FIG. 14 is a sectional view of the assembly to explain a step following the step shown in FIG. 13.

Next, the plating resist film 35 is removed, and then unnecessary portions of the second lower layer foundation metal layer 27 are etched and removed using the second lower layer wiring lines 28 as a mask, with the result that the metal layer 27 remains only on the second lower layer wiring line 28, as shown in FIG. 14. In this state, the second lower layer foundation metal layer 27 and the second lower layer wiring lines 28 are connected at one end to the lower surface of the vertical conductor 26.

Figure 15:
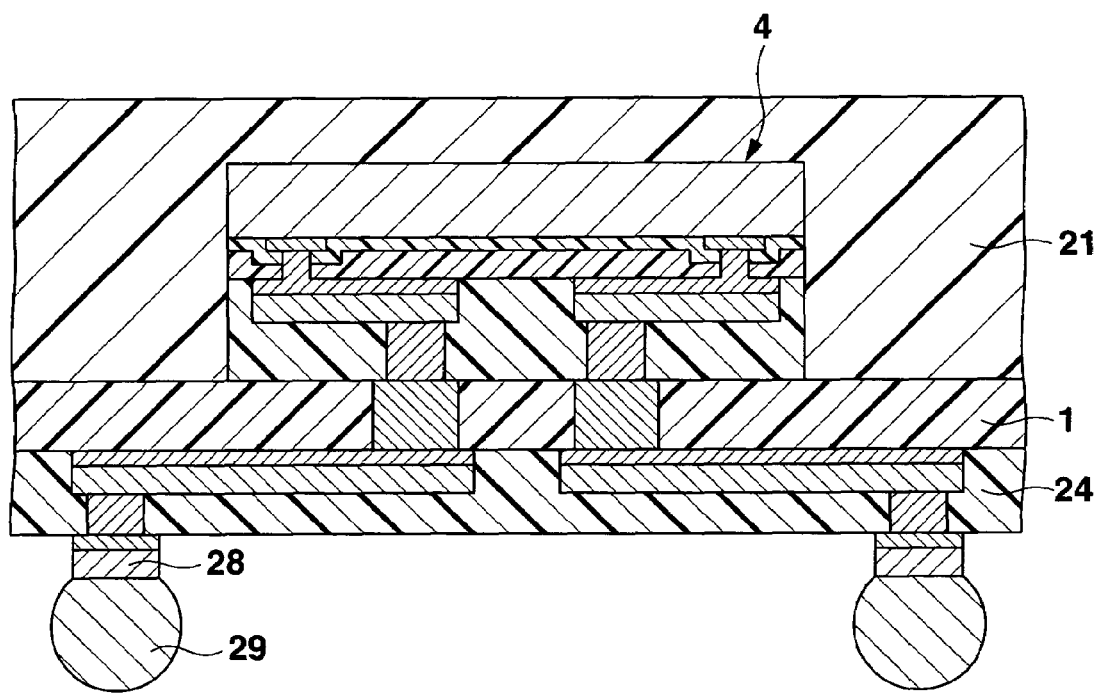
FIG. 15 is a sectional view of the assembly to explain a step following the step shown in FIG. 14.

Next, as shown in FIG. 15, the solder ball 29 is formed on a lower surface of the connection pad portion of the second lower layer wiring line 28. Then, if the insulating layer 21, the base plate 1 and the lower layer insulating film 24 are cut between the semiconductor constructs 4 adjacent to each other, a plurality of semiconductor devices shown in FIG. 1 are obtained. It is to be noted that they may be cut before the formation of the solder ball 29 and the solder ball 29 may be formed after cutting them.

Second Embodiment

Figure 16:
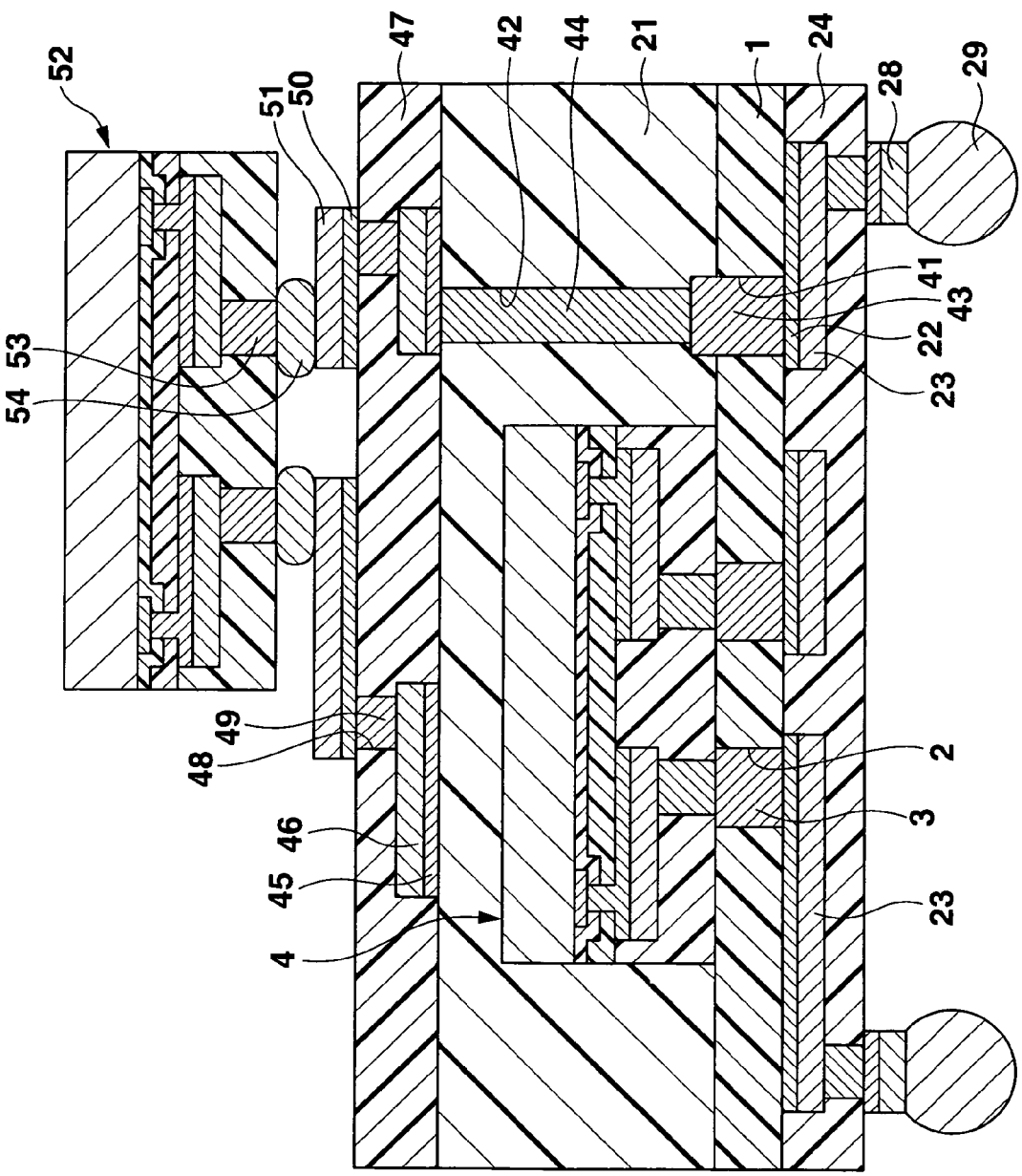
FIG. 16 is a sectional view of a semiconductor device as a second embodiment of this invention.

FIG. 16 shows a sectional view of a semiconductor device as a second embodiment of this invention. This semiconductor device is largely different from the semiconductor device shown in FIG. 1 in that a lower conductor 43 and an upper conductor 44 are provided to be connected to each other in vertical openings 41, 42 which are formed in communication with each other in a base plate 1 and an insulating layer 21 around a semiconductor construct 4, and in that an additional semiconductor construct 52 is provided on the insulating layer 21 in such a manner as to be electrically connected to a first lower surface wiring line 23 via a vertical conductor comprising, for example, the lower conductor 43 and the upper conductor 44.

That is, the lower conductor 43 and the upper conductor 44 formed by curing a conductive paste such as copper paste in an uncured state are provided to be connected with each other in the openings 41, 42 which are provided in communication with each other in the base plate 1 and the insulating layer 21 around the semiconductor construct 4. In this case, a lower surface of the lower conductor 43 is connected to a first lower layer foundation metal layer 22 and the first lower surface wiring line 23 at one end. Further, an upper portion of the lower conductor 43 protrudes from an upper surface of the base plate 1 and is disposed in the insulating layer 21. Moreover, a diameter of the upper conductor 44 (opening 42) is slightly smaller than a diameter of the lower conductor 43 (opening 41).

A first upper layer foundation metal layer 45 made of copper or the like is provided on upper surfaces of the upper conductor 44 and the insulating layer 21. A first upper layer wiring line 46 made of copper is provided on an entire upper surface of the first upper layer foundation metal layer 45. The metal layer 45 and the wiring line 46 are electrically connected at one end to the upper surface of the upper conductor 44.

An upper layer insulating film 47 made of a pre-preg material similar to the lower layer insulating film 24 is provided on upper surfaces of the first upper layer wiring lines 46 and the insulating layer 21. An opening 48 is provided in the upper layer insulating film 47 in a portion substantially corresponding to the center of an upper surface of a connection pad portion of the first upper layer wiring line 46. A vertical conductor 49 made of a conductive paste such as copper paste is provided in the opening 48 in such a manner as to be connected substantially to the center of the upper surface of the connection pad portion of the first upper layer wiring line 46.

A second upper layer foundation metal layer 50 made of copper or the like is provided on upper surfaces of the vertical conductor 49 and the upper layer insulating film 47. A second upper layer wiring line 51 made of copper is provided on an entire upper surface of the second upper layer foundation metal layer 50. The second metal layer 50 and wiring line 51 are electrically connected at one end to the upper surface of the vertical conductor 49. A solder ball 54 provided under a columnar electrode 53 of the additional semiconductor construct 52 is bonded to an upper surface of a connection pad portion of the wiring line 51. A basic configuration of the additional semiconductor construct 52 is the same as that of the semiconductor construct 4, and will not be described in detail.

Figure 17:
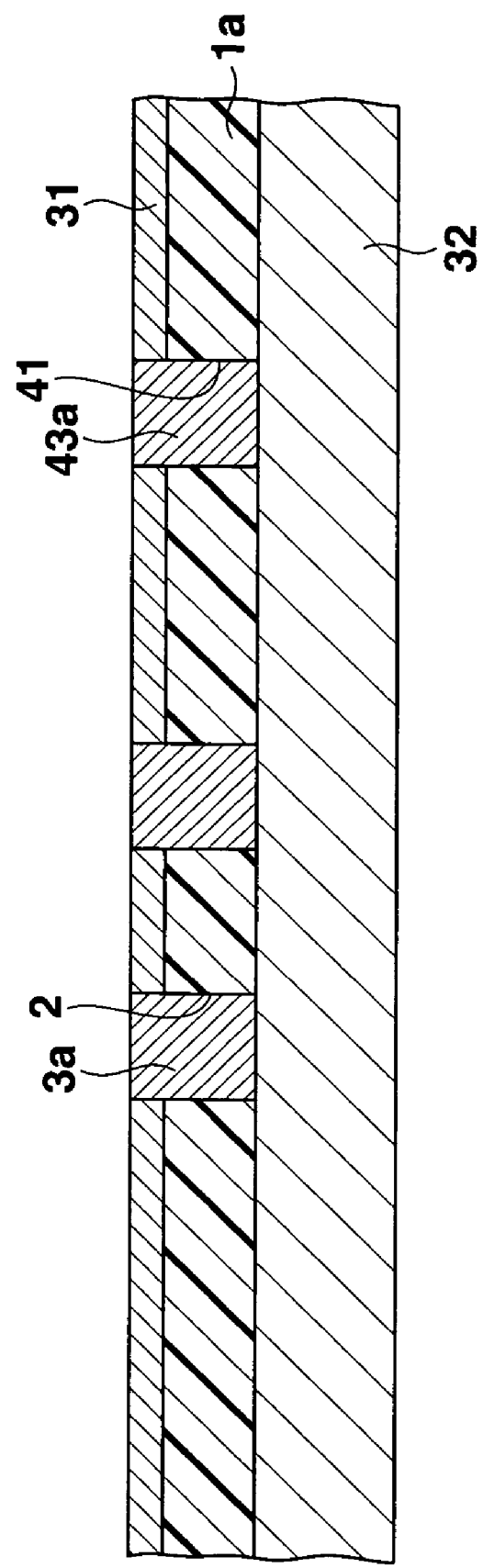
FIG. 17 is a sectional view of a predetermined step in one example of a manufacturing method of the semiconductor device shown in FIG. 16.

Next, one example of a manufacturing method of this semiconductor device will be described. First, in a step of forming a vertical conductor forming paste 3a in an opening 2 of a base plate forming sheet 1a and a protrusion forming sheet 31 shown in FIG. 4, another method can be employed. As shown in FIG. 17, the openings 2 are formed in advance in the base plate forming sheet 1a, and the opening 41 is provided in advance in the protrusion forming sheet 31. Thus, the vertical conductor forming pastes 3a and a lower conductor forming paste 43a made of a conductive paste such as copper paste are filled into the openings 2 of the base plate forming sheet 1a and the opening 41 of the protrusion forming sheet 31 by a screen printing method or the like. Then, the protrusion forming sheet 31 is removed, so that upper portions of the vertical conductor forming pastes 3a and the lower conductor forming paste 43a are in a state protruding from an upper surface of the base plate forming sheet 1a.

Figure 18:
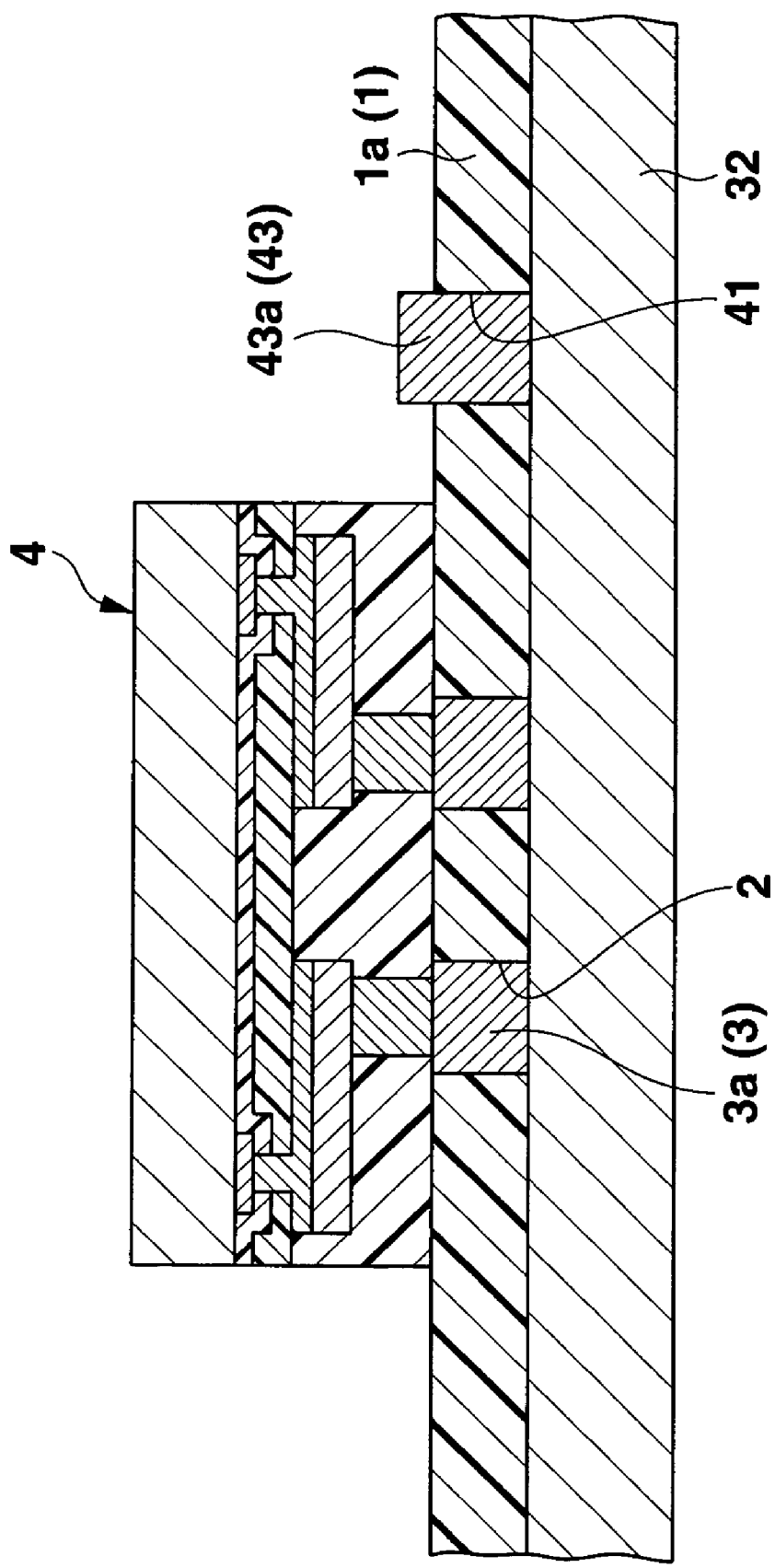
FIG. 18 is a sectional view of the assembly to explain a step following the step shown in FIG. 17.

Next, as shown FIG. 18, the lower conductor forming paste 43a is out of an area where the semiconductor construct 4 is disposed, so that, in a manner similar to that described with reference to FIG. 7, if hot pressing is carried out from above and beneath using a pair of hot pressing plates (not shown), a lower surface of the semiconductor construct 4 will first be in a state pressure-welded to upper surfaces of the vertical conductor forming paste 3a and the base plate forming sheet 1a. Then, a thermosetting resin such as an epoxy-based resin in the base plate forming sheet 1a cures, and thus the base plate 1 is formed. The vertical conductor forming paste 3a and the lower conductor forming paste 43a cure, so that the vertical conductor 3 and the lower conductor 43 are formed. In this case, the lower conductor 43 is only heated and not pressurized, and its upper portion is therefore still protruding from an upper surface of the base plate 1.

Figure 19:
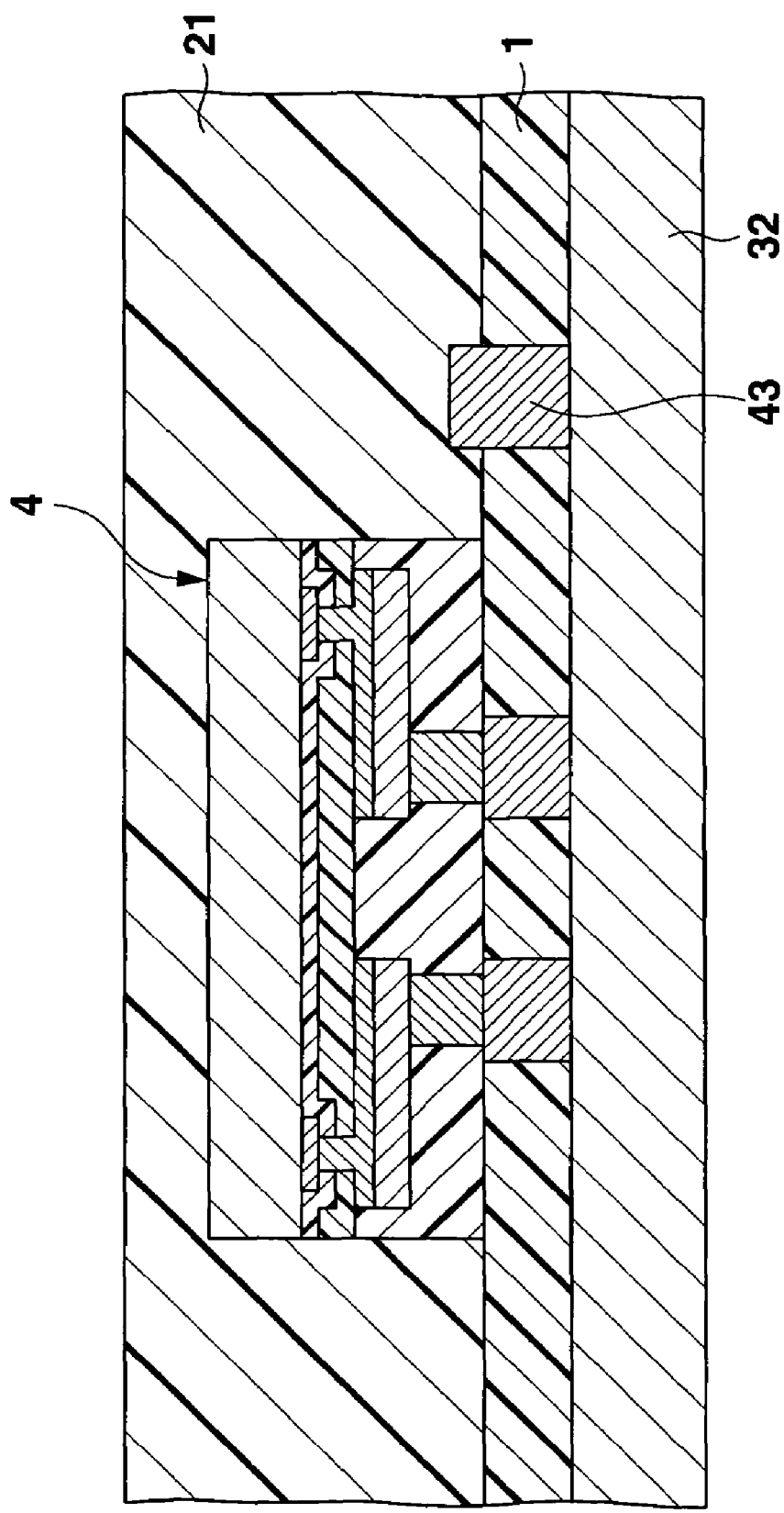
FIG. 19 is a sectional view of the assembly to explain a step following the step shown in FIG. 18.

Next, as shown in FIG. 19, a liquid thermosetting resin such as an epoxy-based resin is applied onto an upper surface of the semiconductor construct 4 and the upper surfaces of the lower conductor 43 and the base plate 1 around the semiconductor construct 4 by a screen printing method, a spin coat method or the like, and cured, thereby forming the insulating layer 21 so that its upper surface may be flat. In this case as well, hot pressing may be carried out from above and beneath using the pair of hot pressing plates.

Figure 20:
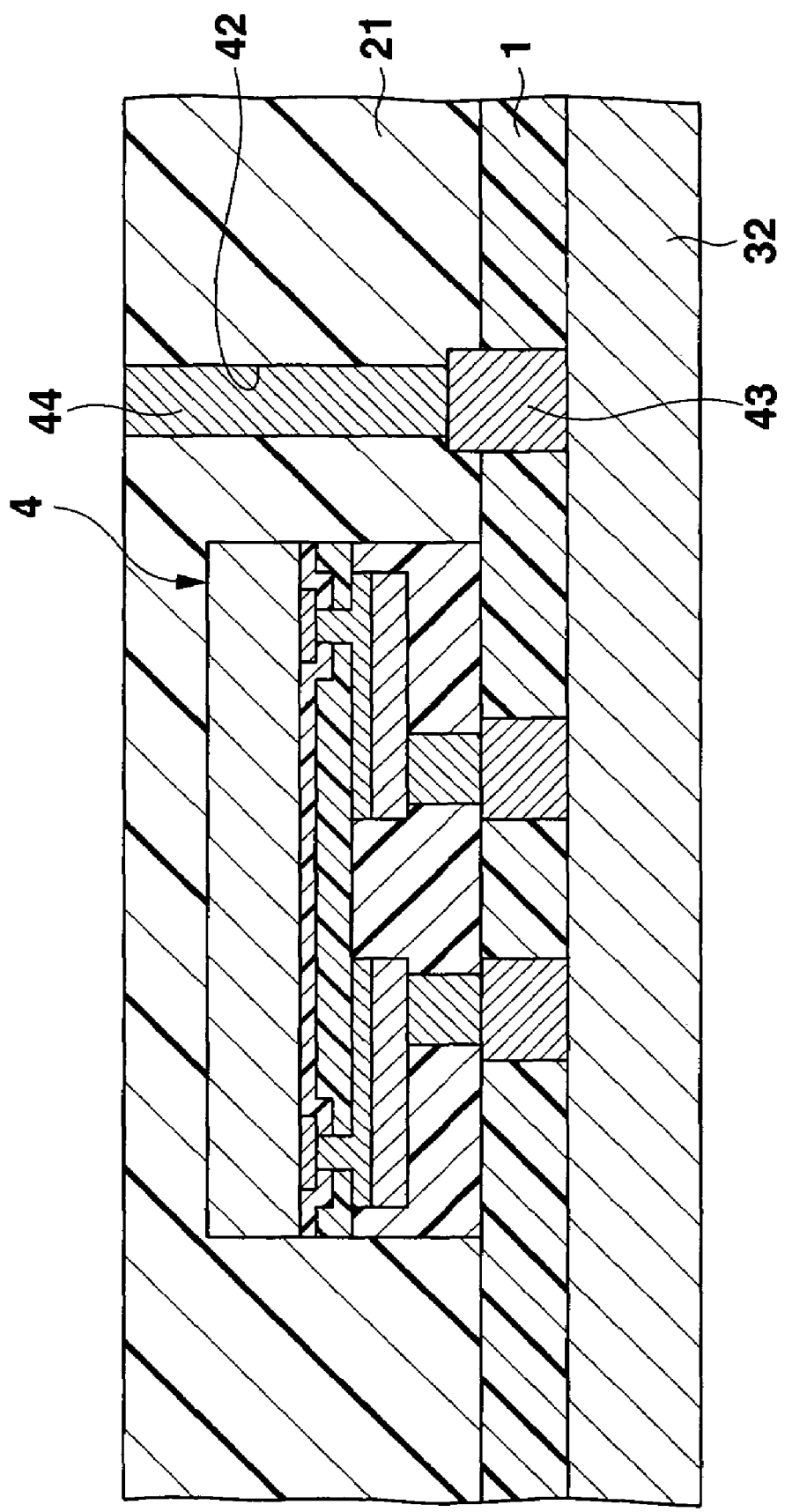
FIG. 20 is a sectional view of the assembly to explain a step following the step shown in FIG. 19.

Next, as shown in FIG. 20, the elongated opening or through hole 42 is formed in the insulating layer 21 substantially at the center of the upper surface of the lower conductor 43 by laser processing which applies laser beam such as $CO_2$ laser. Then, an upper conductor forming paste made of a conductive paste such as copper paste is filled into the opening 42 of the insulating layer 21, and cured, thereby forming the upper conductor 44 so that it is connected to the upper surface of the lower conductor 43. Then, the protective sheet 32 is removed.

Figure 21:
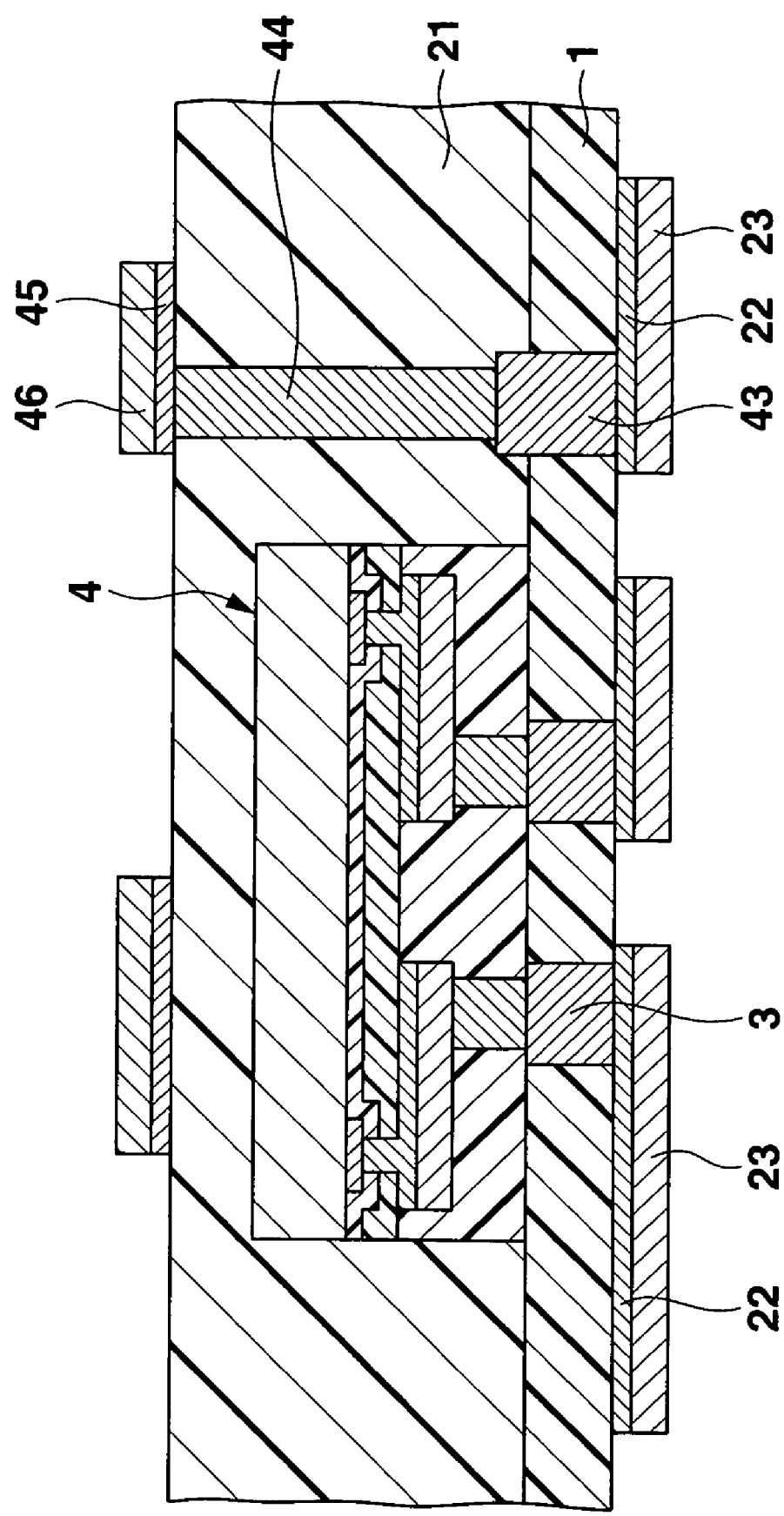
FIG. 21 is a sectional view of the assembly to explain a step following the step shown in FIG. 20.

Next, as shown in FIG. 21, the first lower layer foundation metal layers 22 and then the first lower surface wiring lines 23 are formed at predetermined places on the lower surfaces of the vertical conductor 3, the lower conductor 43 and the base plate 1. Moreover, the first upper layer foundation metal layer 45 and then the first upper layer wiring line 46 are formed at predetermined places on the upper surfaces of the upper conductor 44 and the insulating layer 21.

Figure 22:
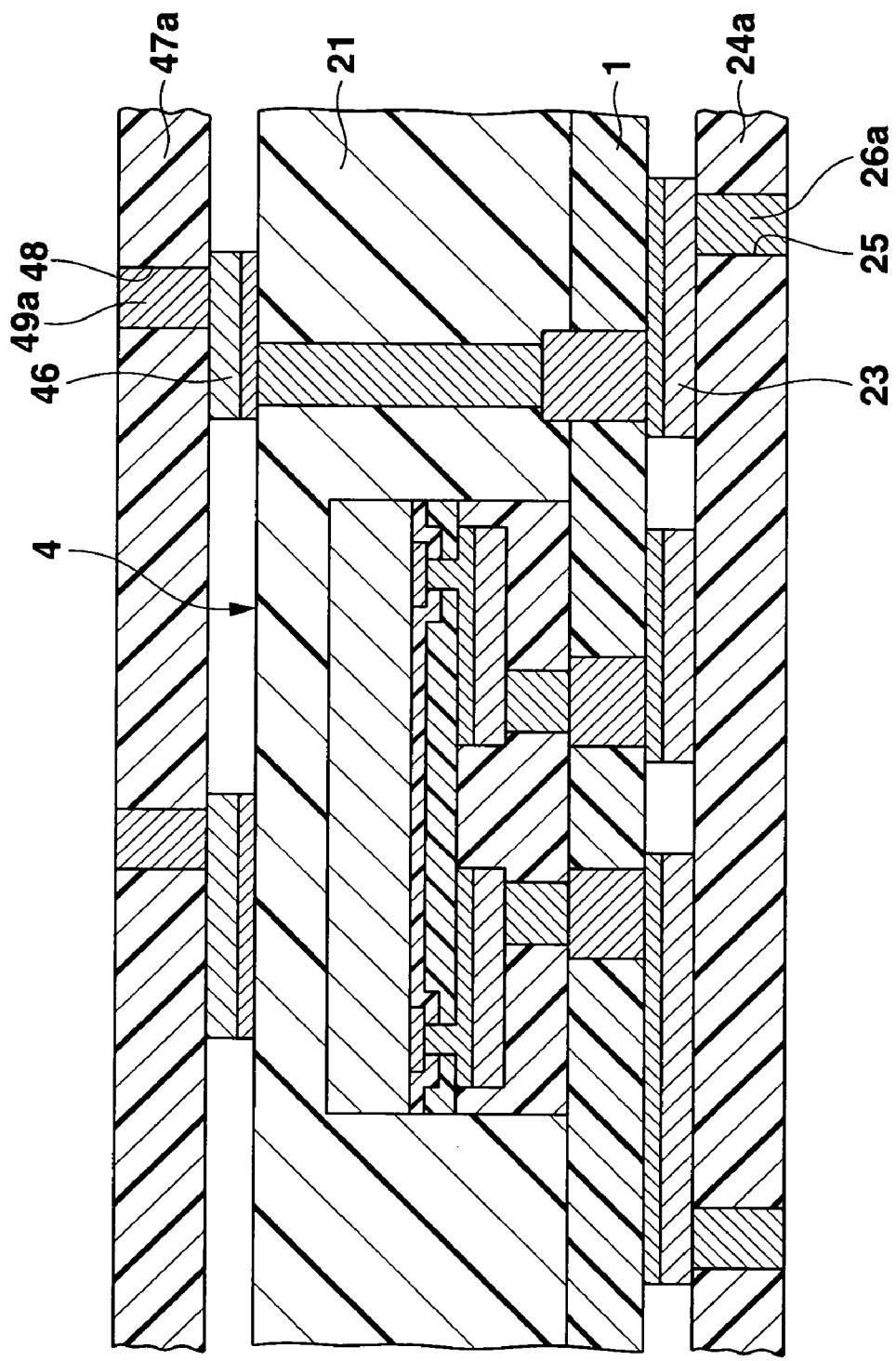
FIG. 22 is a sectional view of the assembly to explain a step following the step shown in FIG. 21.

Next, as shown in FIG. 22, planar square lower layer insulating film forming sheet 24a and upper layer insulating film forming sheet 47a are prepared which are made of a thermosetting resin containing reinforcing materials. In this case, the thermosetting resin such as an epoxy-based resin constituting the sheets 24a and 47a is in a semi-cured state. Further, vertical conductor forming pastes 26a and 49a made of a conductive paste such as copper paste are filled by the screen printing method or the like in the openings 25, 48 formed at a plurality of predetermined places of the sheets 24a and 47a by laser processing.

Furthermore, the first lower surface wiring line 23 formed under the base plate 1 is aligned with and disposed on upper surfaces of the vertical conductor forming paste 26a and the lower layer insulating film forming sheet 24a. The vertical conductor forming paste 49a and the upper layer insulating film forming sheet 47a are aligned with and disposed on the upper surface of the first upper layer wiring line 46 formed on the insulating layer 21. In this state, a portion substantially at the center of a lower surface of the connection pad portion of the wiring line 23 is disposed on the upper surface of the vertical conductor forming paste 26a. Further, a lower surface of the vertical conductor forming paste 49a is disposed substantially at the center of the upper surface of the connection pad portion of the first upper layer wiring line 46.

Figure 23:
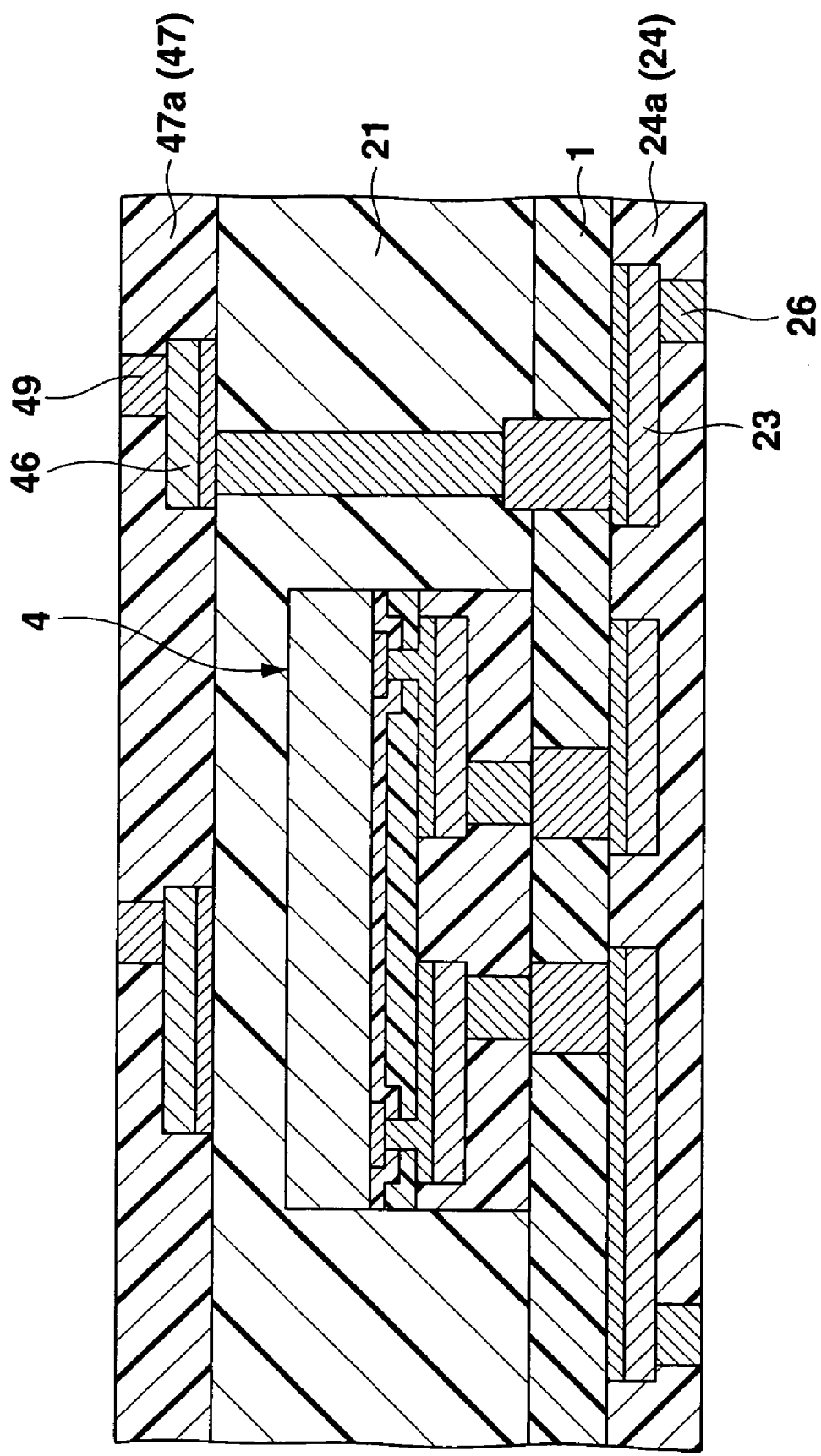
FIG. 23 is a sectional view of the assembly to explain a step following the step shown in FIG. 22.

Next, hot pressing is carried out from above and beneath using a pair of hot pressing plates (not shown). Then, as shown in FIG. 23, the lower layer insulating film 24 having a vertical conductor 26 therein is formed on lower surfaces of the first lower surface wiring line 23 and the base plate 1, and the upper layer insulating film 47 having the vertical conductor 49 is formed on upper surfaces of the first upper layer wiring line 46 and the insulating layer 21. In this state, an upper surface of the vertical conductor 26 is connected to the center of the lower surface of the connection pad portion of the wiring line 23. Further, a lower surface of the vertical conductor 49 is connected to the center of the upper surface of the connection pad portion of the first upper layer wiring line 46.

Figure 24:
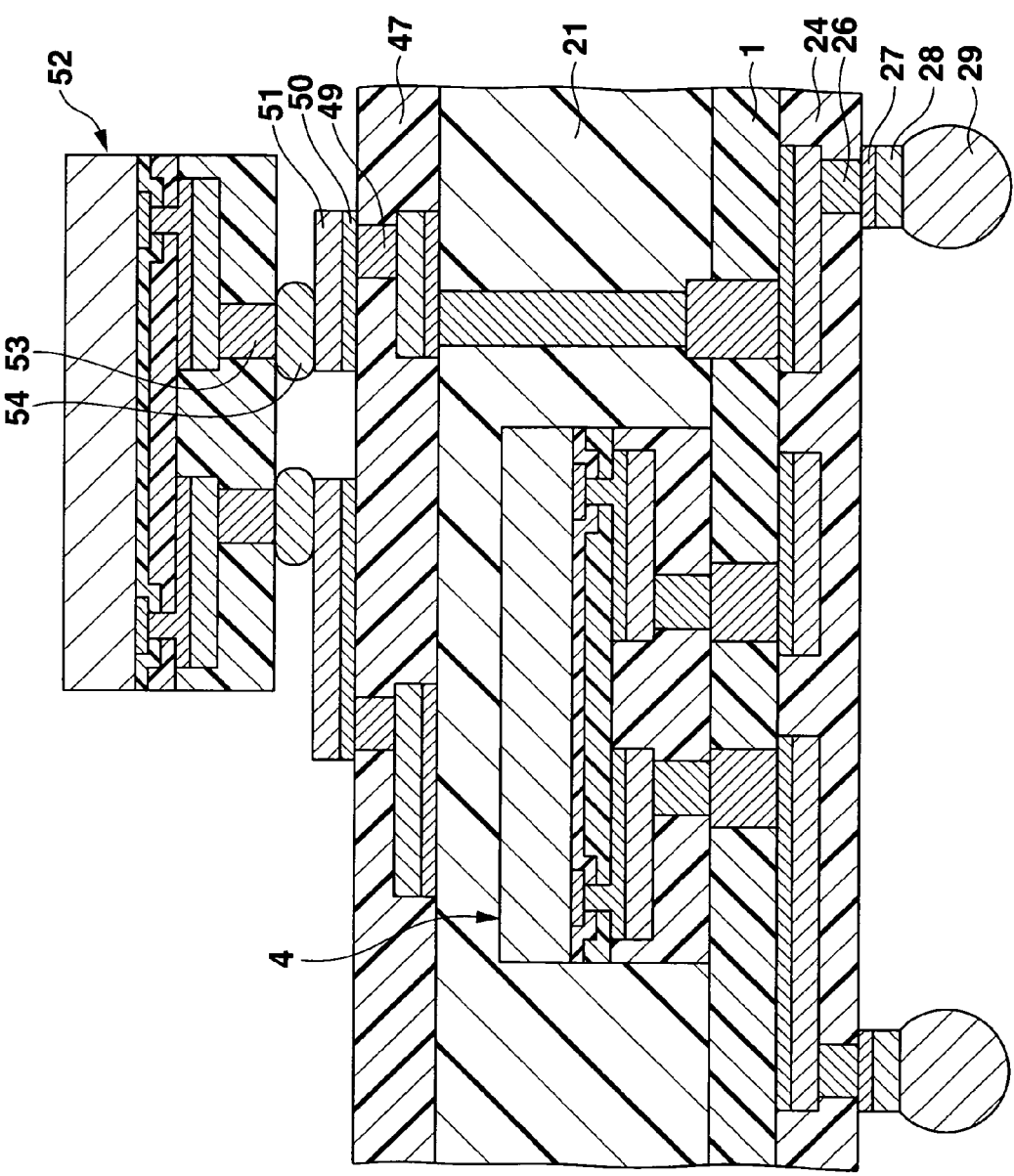
FIG. 24 is a sectional view of the assembly to explain a step following the step shown in FIG. 23.

Next, as shown in FIG. 24, second lower layer foundation metal layers 27 and then a second lower layer wiring lines 28 are formed at a plurality of predetermined places of lower surfaces of the vertical conductor 26 and the lower layer insulating film 24. Moreover, the second upper layer foundation metal layers 50 and the second upper layer wiring lines 51 are formed at a plurality of predetermined places of the upper surfaces of the vertical conductor 49 and the upper layer insulating film 47. Next, a solder ball 29 is formed on a lower surface of a connection pad portion of the second lower layer wiring line 28, and the solder ball 54 under the columnar electrode 53 of the separately manufactured semiconductor construct 52 is bonded to the upper surface of the connection pad portion of the second upper layer wiring line 51. Then, the upper layer insulating film 47, the insulating layer 21, the base plate 1 and the lower layer insulating film 24 are cut between the semiconductor constructs 4 adjacent to each other, so that a plurality of semiconductor devices shown in FIG. 16 is obtained. It is to be noted that the upper layer insulating film 47, the insulating layer 21, the base plate 1 and the lower layer insulating film 24 may be cut before the semiconductor construct 52 is installed, and the semiconductor construct 52 may be installed after cutting them.

Third Embodiment

Figure 25:
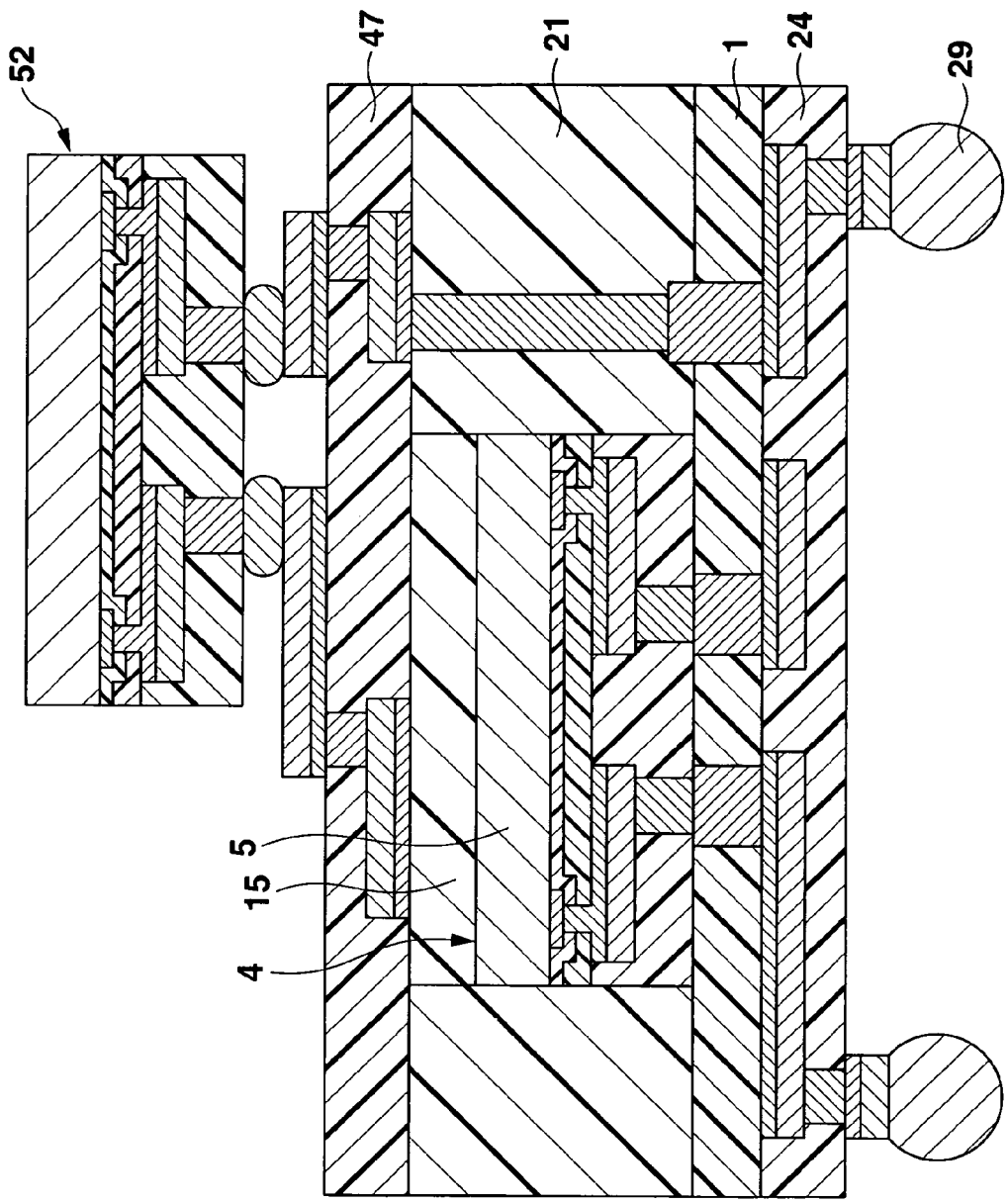
FIG. 25 is a sectional view of a semiconductor device as a third embodiment of this invention.

FIG. 25 shows a sectional view of a semiconductor device as a third embodiment of this invention. This semiconductor device is different from the semiconductor device shown in FIG. 16 in that an insulating film 15 made of a thermosetting resin such as an epoxy-based resin or a polyimide-based resin is provided in advance on an upper surface of a silicon substrate 5 of a semiconductor construct 4.

In this case, after the insulating film 15 is formed on the upper surface of the silicon substrate 5 in a wafer state, a plurality of semiconductor constructs 4 having the insulating films 15 may be obtained by dicing. Then, in a step as shown in FIG. 19, an insulating layer 21 is formed on an upper surface of the base plate 1 around the semiconductor construct 4 having the insulating films 15 so that its upper surface may substantially form the same surface with an upper surface of the insulating films 15.

Fourth Embodiment

Figure 26:
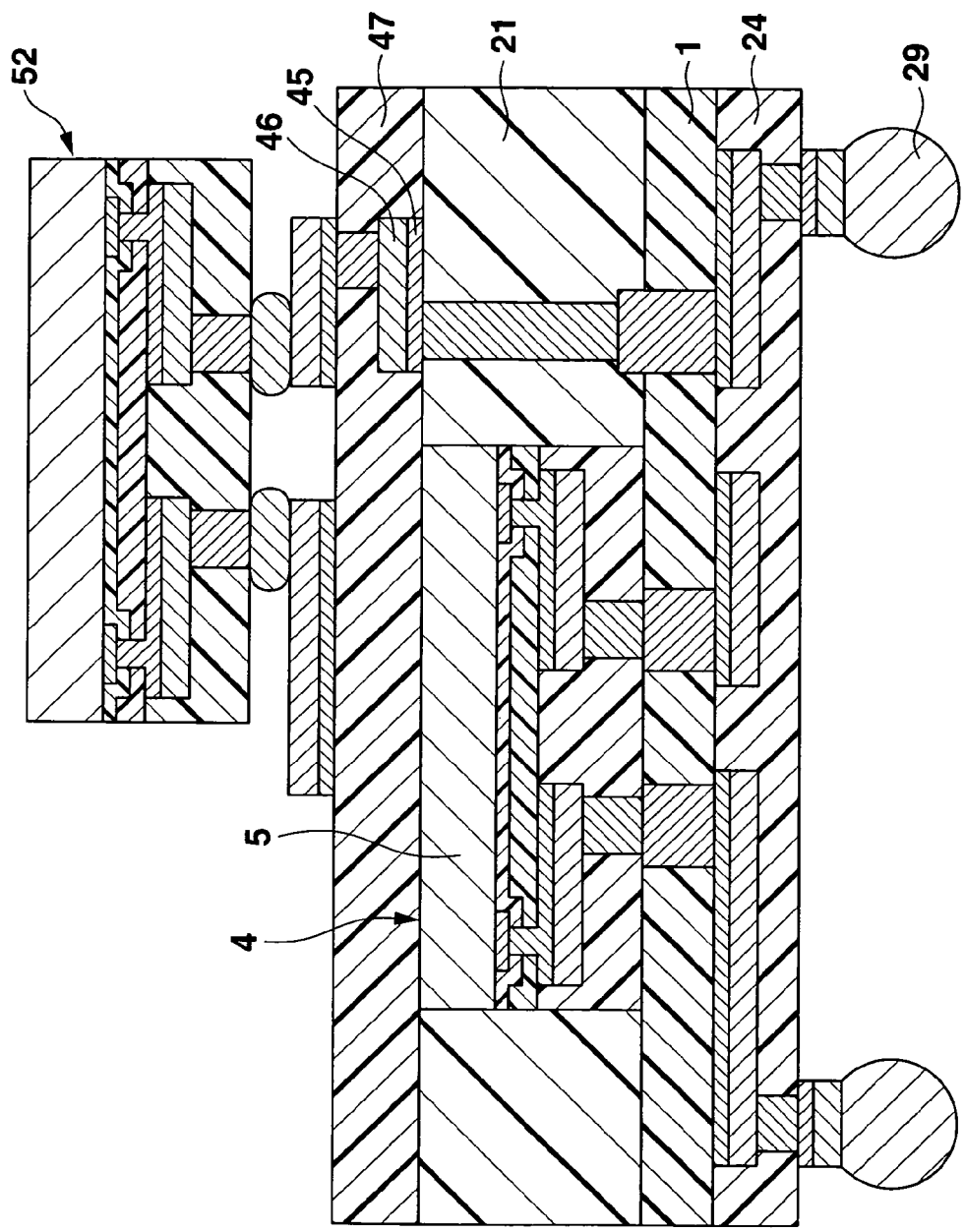
FIG. 26 is a sectional view of a semiconductor device as a fourth embodiment of this invention.

FIG. 26 shows a sectional view of a semiconductor device as a fourth embodiment of this invention. This semiconductor device is different from the semiconductor device shown in FIG. 16 in that an insulating layer 21 is formed on an upper surface of the base plate 1 around a semiconductor construct 4 so that its upper surface may substantially form the same plane with an upper surface of a silicon substrate 5 of the semiconductor construct 4.

In this case, it is desirable to form a first upper layer foundation metal layer 45 and a first upper layer wiring line 46 only on an upper surface of the insulating layer 21. Then, in a step as shown in FIG. 19, the insulating layer 21 is formed on the upper surface of the base plate 1 around the semiconductor construct 4 so that its upper surface may substantially form the same surface with an upper surface of the semiconductor construct 4.

Fifth Embodiment

Figure 27:
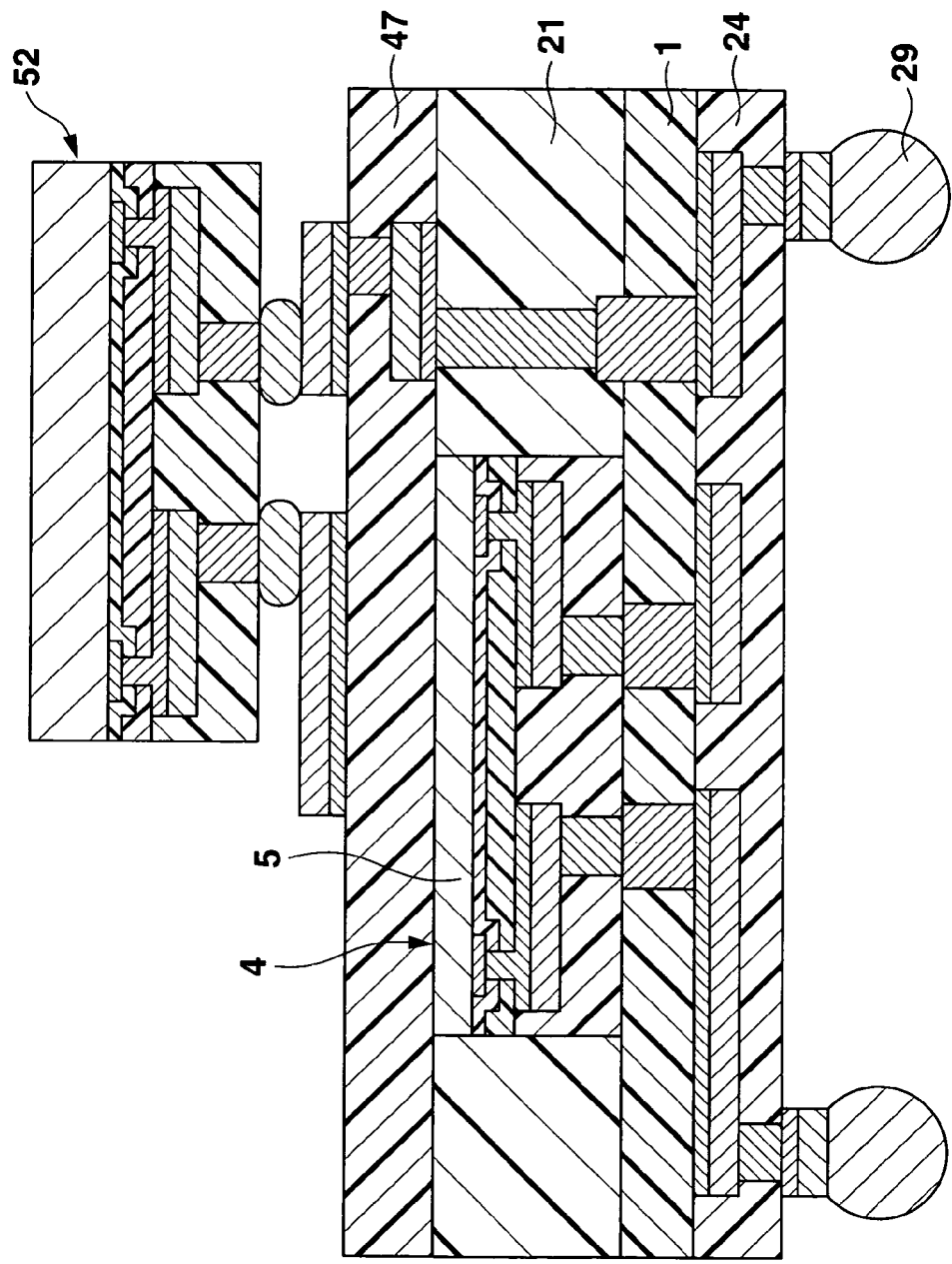
FIG. 27 is a sectional view of a semiconductor device as a fifth embodiment of this invention.

FIG. 27 shows a sectional view of a semiconductor device as a fifth embodiment of this invention. This semiconductor device is different from the semiconductor device shown in FIG. 26 in that thickness of a silicon substrate 5 of a semiconductor construct 4 is reduced and a insulating layer 21 is provided on an upper surface of a base plate 1 around the semiconductor construct 4 so that its upper surface may substantially form the same plane with an upper surface of the silicon substrate 5 of the semiconductor construct 4.

In this case, in a step as shown in FIG. 19, the insulating layer 21 is formed on the upper surface of the base plate 1 around the semiconductor construct 4 so that its upper surface may substantially form the same plane with an upper surface of the silicone substrate 5 of the semiconductor construct 4, and then upper surface sides of the silicon substrate 5 and the insulating layer 21 are properly polished. Moreover, in this semiconductor device, thickness can be reduced as much as the thickness of the silicon substrate 5 of the semiconductor construct 4 is reduced.

Sixth Embodiment

Figure 28:
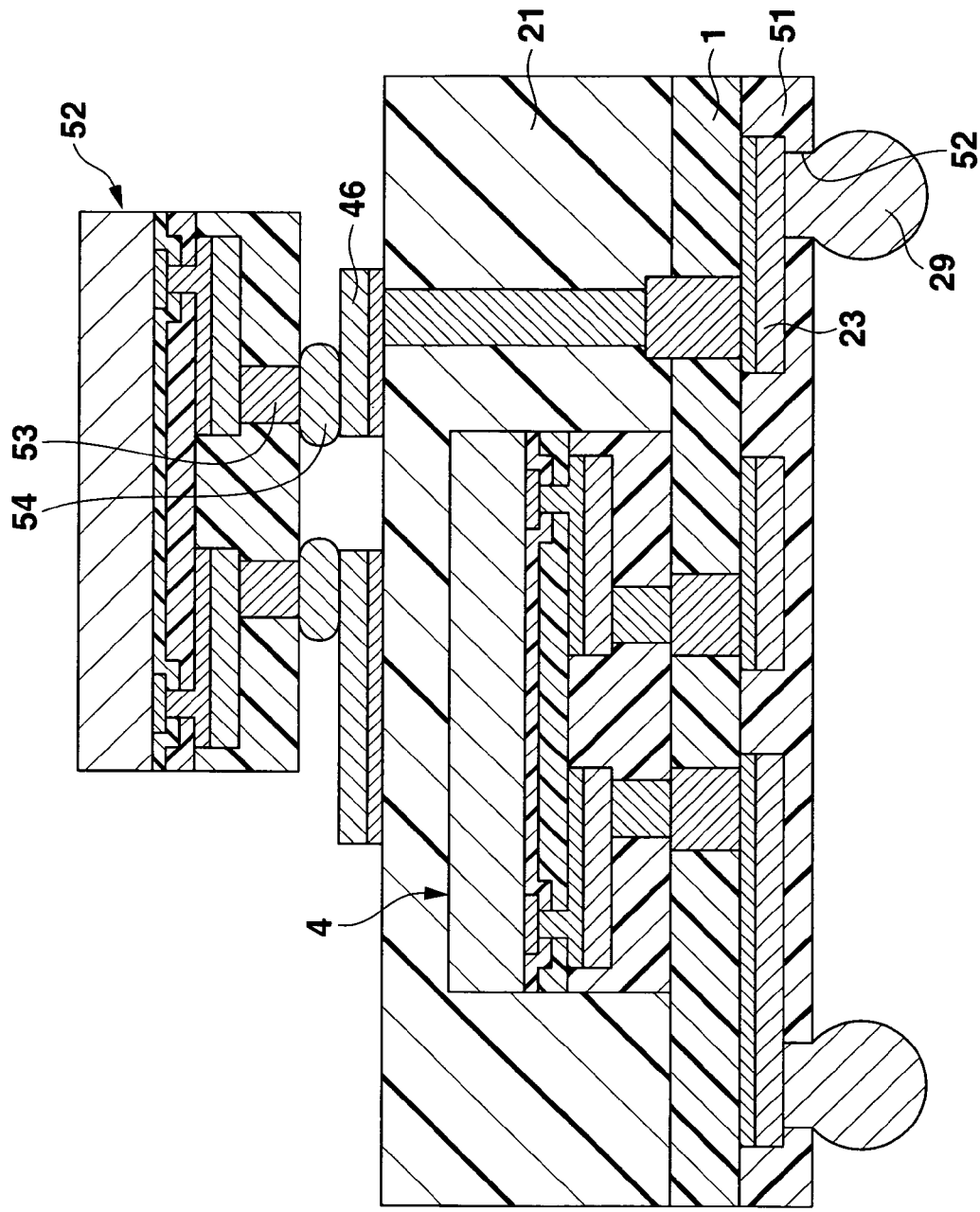
FIG. 28 is a sectional view of a semiconductor device as a sixth embodiment of this invention.

FIG. 28 shows a sectional view of a semiconductor device as a sixth embodiment of this invention. This semiconductor device is different from the semiconductor device shown in FIG. 16 in that both a lower layer wiring line and an upper layer wiring line are formed of one layer. That is, a lower layer insulating film 51 made of solder resist or the like is formed on lower surfaces of a lower surface wiring lines 23 and a base plate 1 by a screen printing method, a spin coat method or the like. A solder ball 29 is formed in an opening 52 formed in the lower layer insulating film 51 in a portion corresponding to a connection pad portion of the lower surface wiring line 23 in such a manner as to be connected to a lower surface of the connection pad portion of the lower surface wiring line 23. A solder ball 54 provided under a columnar electrode 53 of an additional semiconductor construct 52 is bonded to an upper surface of a connection pad portion of an upper layer wiring line 46.

MODIFICATIONS OF THE EMBODIMENTS

For example, in the first embodiment described above, cutting is implemented between the semiconductor constructs 4 adjacent to each other, but the present invention is not limited thereto. The cutting may be implemented with a set of two or more semiconductor constructs 4 to obtain multichip module type semiconductor devices. Further, a lower surface wiring line 23 connected to a vertical conductor 3 is provided on the lower surfaces of the base plate 1, and a solder ball 29 is connected to a connection pad portion of a first lower surface wiring line (wiring line) 23 via a vertical conductor 26 and a second lower layer wiring line 28, but the solder ball and electronic components may be directly bonded to a lower part of the vertical conductor 3. Moreover, for example, in the semiconductor device shown in FIG. 16, a semiconductor construct 52 called a CSP is installed on a connection pad portion of a second upper layer wiring line 51, but the present invention is not limited thereto. Other semiconductor constructs such as a bear chip and electronic components including chip components such as a condenser and a resistor may be installed.

Seventh Embodiment

Figure 29:
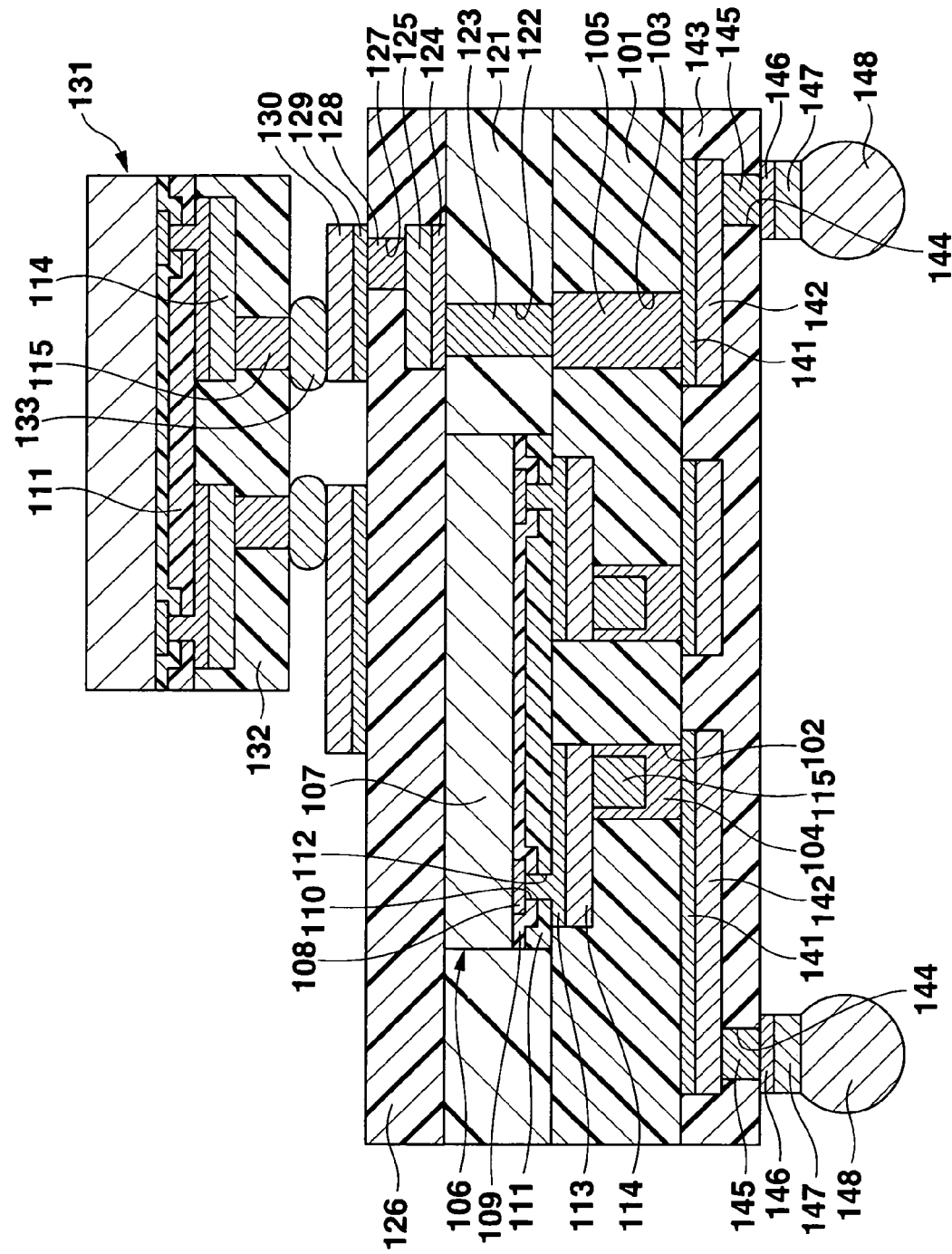
FIG. 29 is a sectional view of a semiconductor device as a seventh embodiment of this invention.

FIG. 29 shows a sectional view of a semiconductor device as a seventh embodiment of this invention. This semiconductor device has a planar square base plate 101. The base plate 101 is made of, for example, a material in which reinforcing materials such as glass fibers or aramid fibers are mixed into a thermosetting resin such as an epoxy-based resin, a polyimide-based resin. In this case, first and second openings or vertical through holes 102, 103 for vertical conduction are formed at a plurality of predetermined places in the base plate 101, and there are provided, in the first and second openings 102, 103, first and second vertical conductors 104, 105 which are formed by curing a conductive paste such as copper paste in an uncured state.

A planar square semiconductor construct 106 having a size somewhat smaller than that of the base plate 101 is directly secured (installed) face down at a predetermined place onto an upper surface of the base plate 101. The semiconductor construct 106 includes a silicon substrate (semiconductor substrate) 107. An integrated circuit (not shown) having a predetermined function is provided on a lower surface of the silicon substrate 107, and a plurality of connection pads 108 made of an aluminum-based metal or the like is provided in peripheral portions of the lower surface of the silicon substrate 107 so that they are connected to the integrated circuit. An insulating film 109 made of silicon oxide or the like is provided on the lower surface of the silicon substrate 107 except for a central portions of the connection pads 108. The central portion of the connection pad 108 is exposed via an opening 110 formed in the insulating film 109.

A protective film 111 made of an epoxy-based resin or a polyimide-based resin is provided on a lower surface of the insulating film 109. In this case, an opening 112 is formed in the protective film 111 in a portion corresponding to the opening 110 of the insulating film 109. Foundation metal layers 113 made of copper or the like are provided on a lower surface of the protective film 111. A wiring line (rewiring line) 114 made of copper is provided on an entire lower surface of the foundation metal layer 113. The metal layer 113 and the wiring line 114 are electrically connected at one end to the connection 108 via both the openings 110 and 112. A columnar electrode (external connection electrode) 115 made of copper is provided on a lower surface of a connection pad portion of the wiring line 114.

Here, viewed from a vertical direction, the first vertical conductors 104 are disposed in a area where the semiconductor construct 106 is installed, while the second vertical conductor 105 is disposed in an area outside the area where the semiconductor construct 106 is installed. Further, a diameter (plane size) of the first vertical conductor 104 (first opening 102) is somewhat larger than a diameter of the columnar electrode 115. Moreover, the semiconductor construct 106 is installed on the base plate 101 in a state in which the entire columnar electrode 115 has totally cut into a portion substantially at the center of an upper surface of the first vertical conductor 104 and in which the foundation metal layer 113 and the wiring line 114 are totally embedded into the upper surface of the base plate 101 and in which the lower surface of the protective film 111 is directly secured to the upper surface of the base plate 101.

An insulating layer 121 made of an epoxy-based resin or a polyimide-based resin is provided on the upper surface of the base plate 101 around the semiconductor construct 106 so that its upper surface may substantially form the same plane with an upper surface of the semiconductor construct 106. An opening or vertical through hole 122 for vertical conduction is formed through the insulating film 121 in a portion corresponding to the second vertical conductor 105 of the base plate 101, and a vertical conductor 123 formed by curing a conductive paste such as copper paste in an uncured state is provided in the opening 122 in such a manner as to be connected to an upper surface of the second vertical conductor 105. In this case, a diameter of the vertical conductor 123 (opening 122) is slightly smaller than a diameter of the second vertical conductor 105 (second opening 103).

A first upper layer foundation metal layer 124 made of copper or the like is provided on upper surfaces of the vertical conductor 123 and the insulating film 121. A first upper layer wiring line 125 made of copper is provided on an entire upper surface of the foundation metal layer 124. The first foundation metal layer 124 and wiring line 125 are electrically connected at one end to the upper surface of the vertical conductor 123.

An upper layer insulating film 126 made of a material similar to that of the base plate 101 is provided on the upper surface of the semiconductor construct 106, the upper surfaces of the first upper layer wiring line 125 and the insulating film 121. An opening 127 for vertical conduction is formed in the upper layer insulating film 126 in a portion substantially corresponding to the center of an upper surface of a connection pad portion of the first upper layer wiring line 125. A vertical conductor 128 formed by curing a conductive paste such as copper paste in an uncured state is provided in the opening 127 in such a manner as to be connected to a portion substantially at the center of the upper surface of the connection pad portion of the first upper layer wiring line 125. An upper surface of the conductor 128 is positioned in the same horizontal plane as the upper surface of the insulating film 126.

A second upper layer foundation metal layer 129 made of copper or the like is provided on upper surfaces of the vertical conductor 128 and the upper layer insulating film 126. A second upper layer wiring line 130 made of copper is provided on an entire upper surface of the foundation metal layer 129. The second foundation metal layer 129 and wiring line 130 are electrically connected at one end to the upper surface of the vertical conductor 128.

A solder ball 133 provided under the columnar electrode 115 of an additional semiconductor construct 131 is bonded to an upper surface of a connection pad portion of the second upper layer wiring line 130. The additional semiconductor construct 131 has the same basic configuration as that of the semiconductor construct 106, but is different from the semiconductor construct 106 in that a sealing film 132 made of an epoxy-based resin or a polyimide-based resin is provided on lower surfaces of the wiring lines 114 and the protective film 114 so that its lower surface may substantially form the same surface with a lower surface of the columnar electrode 115. This additional semiconductor construct 131 is generally called a CSP.

First lower layer foundation metal layers 141 made of copper or the like are provided on lower surfaces of the first and second vertical conductors 104, 105 and the base plate 101. A first lower surface wiring line 142 made of copper is provided on an entire lower surface of the first lower layer foundation metal layer 141. The first metal layer 141 and wiring line 142 are electrically connected at one end to the lower surfaces of the first and second vertical conductors 104, 105.

A lower layer insulating film 143 made of a material similar to that of the base plate 101 is provided on the lower surface of the first lower surface wiring line 142 and the base plate 101. Openings 144 for vertical conduction are provided in the lower layer insulating film 143 in a portions corresponding to connection pad portions of the first lower surface wiring lines 142. A vertical conductor 145 formed by curing a conductive paste such as copper paste in an uncured state is provided in the opening 144 in such a manner as to be connected to the lower surface of the connection pad portion of the first lower surface wiring line 142.

A second lower layer foundation metal layer 146 made of copper or the like is provided on lower surfaces of the vertical conductor 145 and the lower layer insulating film 143. A second lower layer wiring line 147 made of copper is provided on an entire lower surface of the foundation metal layer 146. The second foundation metal layer 146 and wiring line 147 are electrically connected at one end to the lower surface of the vertical conductor 145. A solder ball 148 is provided on a lower surface of a connection pad portion of the second lower layer wiring line 147. A plurality of solder balls 148 are arranged in a matrix form substantially in the whole area under the lower layer insulating film 143.

Figure 30:
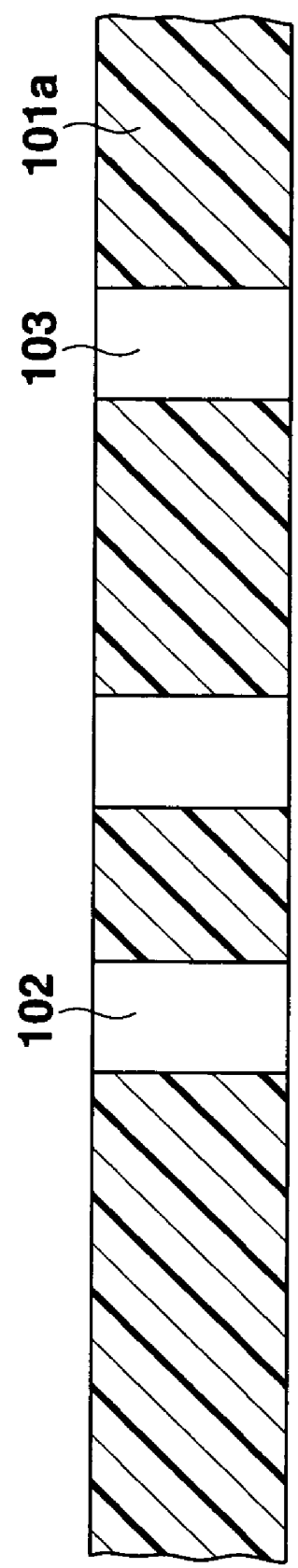
FIG. 30 is a sectional view of an assembly to explain an initial step in one example of a manufacturing method of the semiconductor device shown in FIG. 29.

Next, one example of a manufacturing method of this semiconductor device will be described. First, as shown in FIG. 30, a planar square base plate forming sheet 101a not limited to but made of a thermosetting resin containing reinforcing materials is prepared which has an area allowing a plurality of completed semiconductor devices shown in FIG. 29 to be formed. In this case, the thermosetting resin such as an epoxy-based resin which constitutes the base plate forming sheet 101a is in a semi-cured state. Next, the first and second openings 102, 103 are formed at a plurality of predetermined places of the base plate forming sheet 101a by laser processing which applies laser beam such as $CO_2$ laser.

Figure 31:
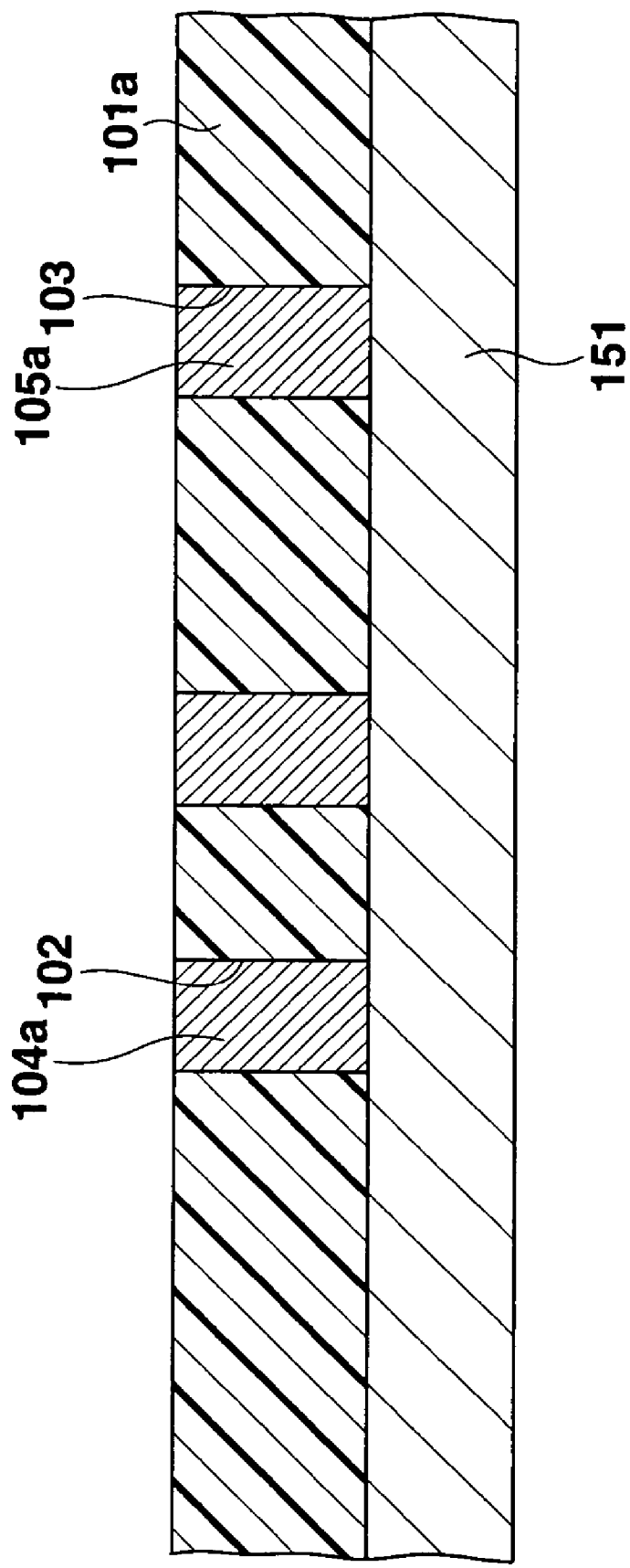
FIG. 31 is a sectional view of the assembly to explain a step following the step shown in FIG. 30.

Next, as shown in FIG. 31, a protective sheet 151 is prepared, and the base plate forming sheet 101a is mounted on an upper surface of the protective sheet 151. Then, first and second vertical conductor forming pastes 104a, 105a made of a conductive paste such as copper paste are filled into the first and second openings 102, 103 of the base plate forming sheet 101a by a screen printing method or the like.

Figure 32:
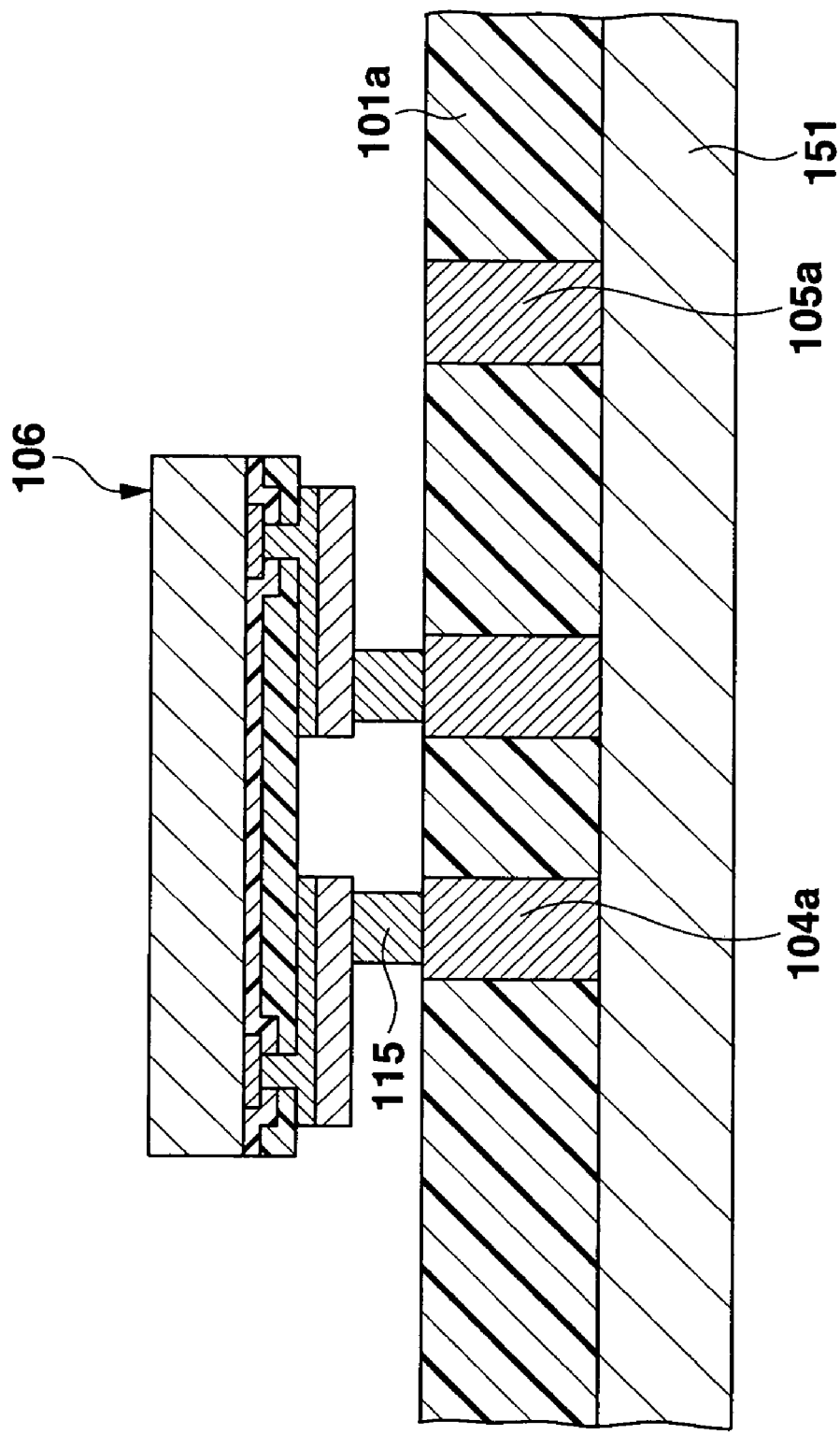
FIG. 32 is a sectional view of the assembly to explain a step following the step shown in FIG. 31.

Next, as shown in FIG. 32, the lower surface of the columnar electrode 115 of the semiconductor construct 106 is aligned with a portion substantially at the center of an upper surface of the first vertical conductor forming paste 104a, and then temporarily press-bonded (temporarily secured) thereto. That is, the lower surface of the columnar electrode 115 of the semiconductor construct 106 is temporarily press-bonded to the portion substantially at the center of the upper surface of the vertical conductor forming paste 104a in a preheated state together with application of a relatively low pressure by use of a bonding tool (not shown) with a heating mechanism. In this state, a plurality of semiconductor constructs 106 are temporarily secured onto the base plate forming sheet 101a in such a manner as to leave space between them.

Figure 33:
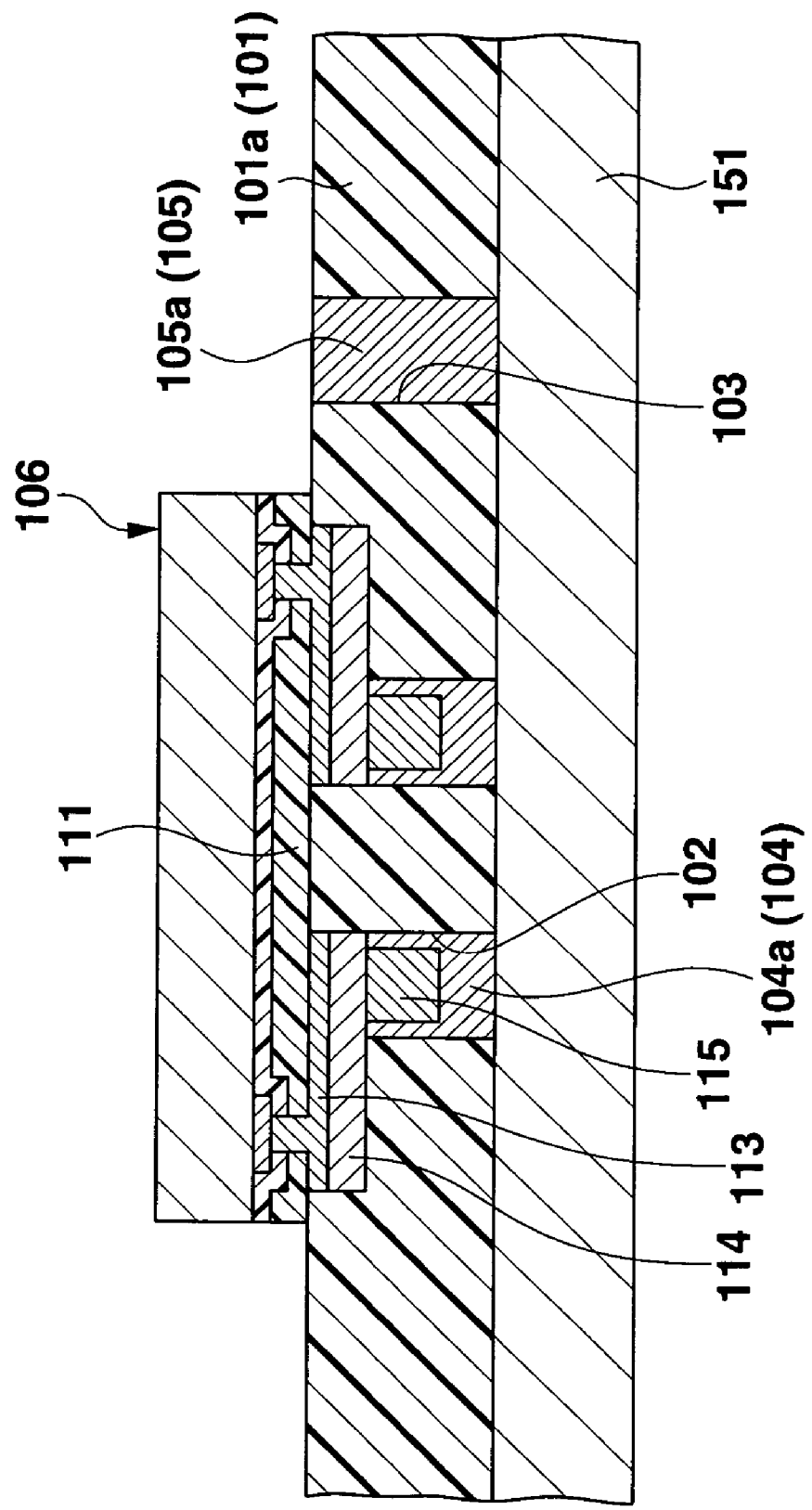
FIG. 33 is a sectional view of the assembly to explain a step following the step shown in FIG. 32.

Next, hot pressing is carried out from above and beneath using a pair of hot pressing plates (not shown). Then, as shown in FIG. 33, first, the columnar electrode 115 totally cuts into a portion substantially at the center of an upper surface of the first vertical conductor forming paste 104a. The foundation metal layer 113 and the wiring line 114 are totally embedded into the upper surface of the base plate forming sheet 101a while compressing the first vertical conductor forming paste 104a. The lower surface of the protective film 111 is in a state pressure-welded to the upper surface of the base plate forming sheet 101a. Then, a thermosetting resin such as an epoxy-based resin in the base plate forming sheet 101a cures, and thus the base plate 101 is formed. The first and second vertical conductor forming pastes 104a, 105a cure, so that the first and second vertical conductors 104, 105 are formed.

In this way, the semiconductor construct 106 is installed on the base plate 101 in a state in which the columnar electrode 115 has totally cut into the portion substantially at the center of an upper surface of the first vertical conductor 104 and in which the foundation metal layer 113 and the wiring line 114 are totally embedded into the upper surface of the base plate 101 and in which the lower surface of the protective film 111 is directly secured to the upper surface of the base plate 101.

Figure 34:
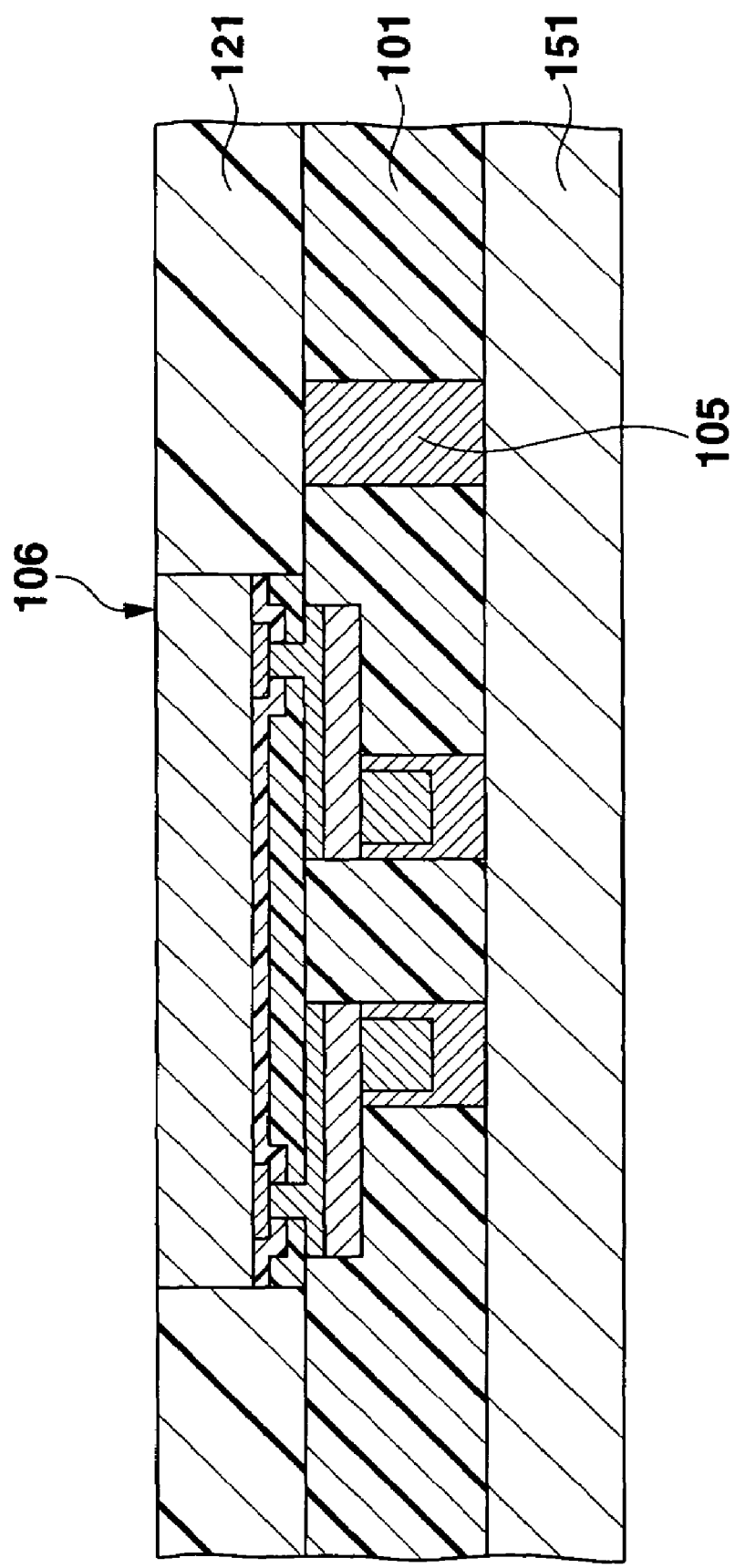
FIG. 34 is a sectional view of the assembly to explain a step following the step shown in FIG. 33.

Next, as shown in FIG. 34, a liquid thermosetting resin such as an epoxy-based resin is applied onto upper surfaces of the second vertical conductor 105 and the base plate 101 around the semiconductor construct 106 by a screen printing method, a spin coat method or the like, and cured, thereby securing the insulating layer 121 onto the upper surface of the base plate 101 and also securing it onto a side surface of the semiconductor construct 106. In this case, it is preferable that the upper surface of the insulating film 121 substantially forms the same plane with the upper surface of the semiconductor construct 106.

Figure 35:
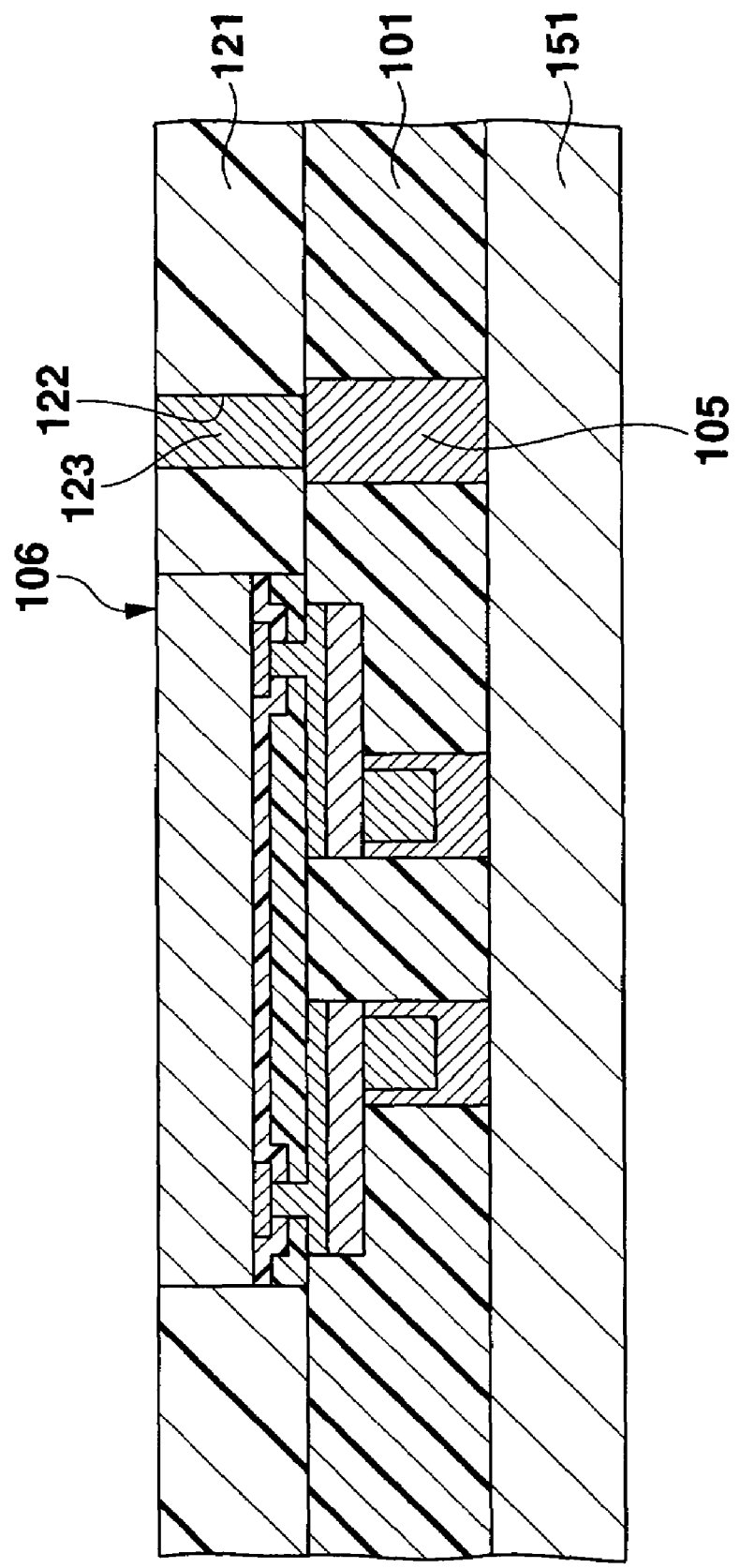
FIG. 35 is a sectional view of the assembly to explain a step following the step shown in FIG. 34.

Next, as shown in FIG. 35, the opening or vertical through hole 122 is formed in the insulating layer 121 substantially at the center of the upper surface of the second vertical conductor 105 by laser processing which applies laser beam such as $CO_2$ laser. Then, an upper conductor forming paste made of a conductive paste such as copper paste is filled into the opening 122 of the insulating layer 121 by the screen printing method or the like, and cured, thereby forming the vertical conductor 123 so that it is connected to the upper surface of the second vertical conductor 105. In this state, since the base plate 101 and the insulating layer 121 are cured, the protective sheet 151 may be removed.

Figure 36:
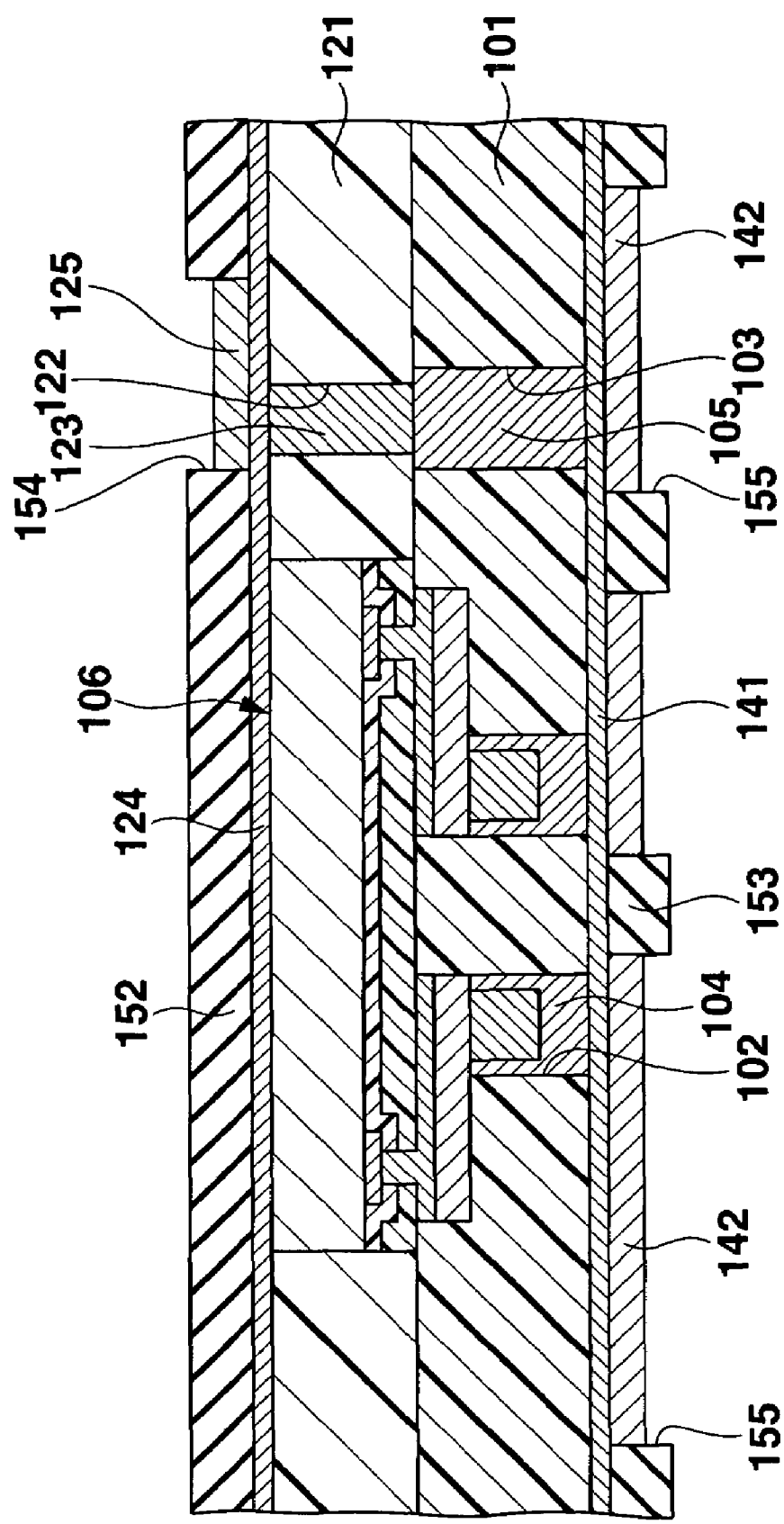
FIG. 36 is a sectional view of the assembly to explain a step following the step shown in FIG. 35.

Next, as shown in FIG. 36, the first upper layer foundation metal layer 124 is formed on the upper surface of the semiconductor construct 106 and the entire upper surfaces of the vertical conductor 123 and the insulating layer 121. Moreover, the first lower layer foundation metal layer 141 is formed on the entire lower surfaces of the first and second vertical conductors 104, 105 and the base plate 101. In this case, the first upper layer foundation metal layer 124 and the first lower layer foundation metal layer 141 may only be a copper layer formed by electroless plating, may only be a copper layer formed by sputtering, or may be layers in which a copper layer is formed by sputtering on a thin film layer such as titanium formed by sputtering.

Next, an upper layer plating resist film 152 is formed/patterned on the upper surface of the first upper layer foundation metal layer 124, and a lower layer plating resist film 153 is formed/patterned on a lower surface of the first lower layer foundation metal layer 141. In this case, an opening 154 is formed in the upper layer plating resist film 152 in a portion corresponding to an area where the first upper layer wiring line 125 is formed. Moreover, an opening 155 is formed in the lower layer plating resist film 153 in a portion corresponding to an area where the first lower layer wiring line 142 is formed.

Next, electrolytic plating of copper is carried out using the first upper layer foundation metal layer 124 and the first lower layer foundation metal layer 141 as plating current passages, thereby forming the first upper layer wiring line 125 on the upper surface of the first upper layer foundation metal layer 124 in the opening 154 of the upper layer plating resist film 152, and also forming the first lower layer wiring line 142 on the lower surface of the first lower layer foundation metal layer 141 in the opening 155 of the lower layer plating resist film 153.

In this case, since the cured first and second vertical conductors 104, 105 are formed in the first and second openings 102, 103 of the base plate 101, the lower surfaces of the first and second vertical conductors 104, 105 and the base plate 101 are flat in the same plane. As a result, the lower surfaces of the first lower layer foundation metal layers 141 formed on the entire lower surfaces of the first and second vertical conductors 104, 105 and the base plate 101 is also flat. Moreover, since the cured vertical conductor 123 is formed in the opening 122 of the insulating layer 121, the upper surfaces of the vertical conductor 123 and the insulating layer 121 are flat in the same plane. As a result, the upper surface of the first upper layer foundation metal layer 124 formed on the entire upper surfaces of the vertical conductor 123 and the insulating layer 121 is also flat.

Therefore, even if diameters of the first and second openings 102, 103 of the base plate 101 are reduced, it is possible to completely prevent air bubbles or the like from entering the first and second openings 102, 103 when the first lower layer wiring line 142 are formed on the lower surface of the first lower layer foundation metal layer 141 in the openings 155 of the lower layer plating resist film 153 by electrolytic plating. Moreover, even if a diameter of the opening 122 of the insulating layer 121 is reduced, it is possible to completely prevent air bubbles or the like from entering the opening 122 when the first upper layer wiring line 125 is formed on the upper surface of the first upper layer foundation metal layer 124 in the opening 154 of the upper layer plating resist film 152 by electrolytic plating.

Figure 37:
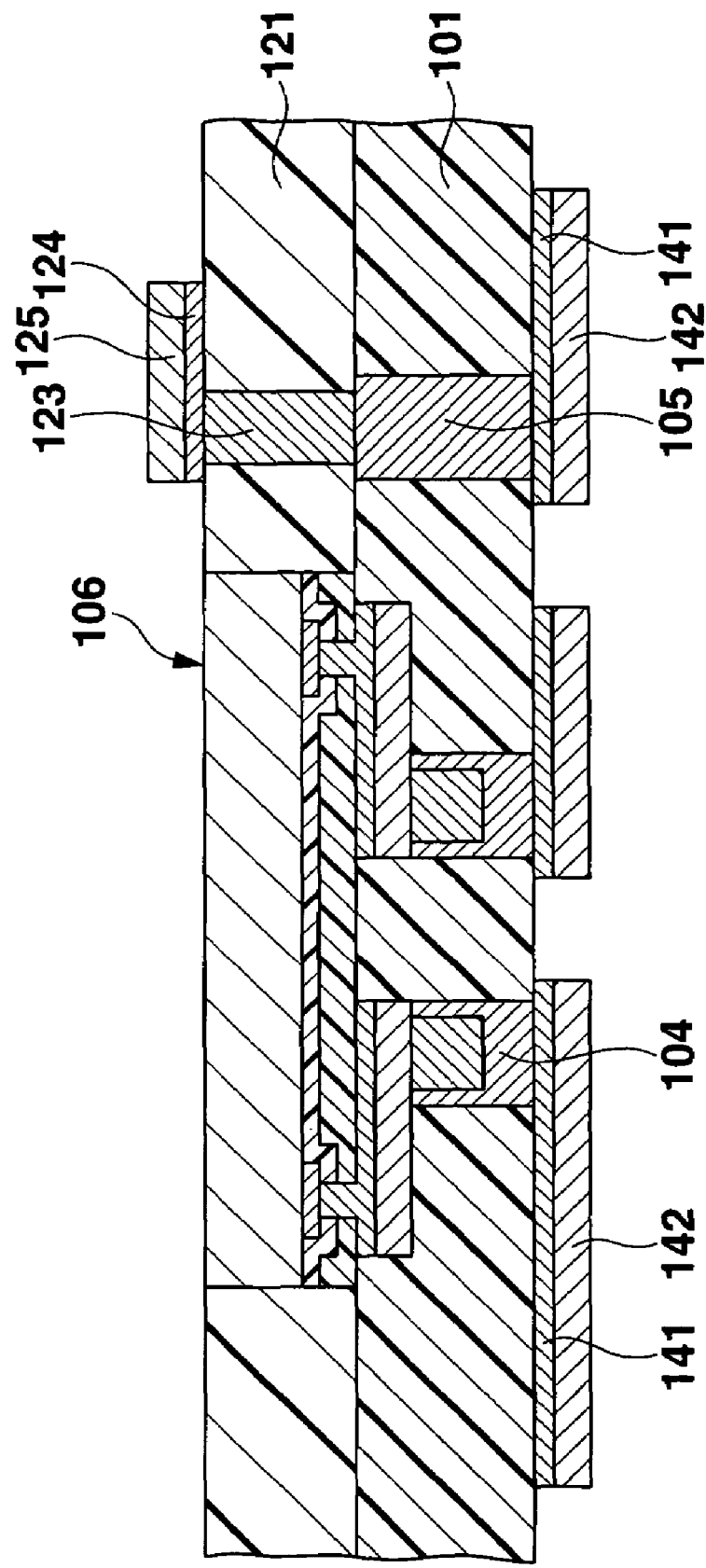
FIG. 37 is a sectional view of the assembly to explain a step following the step shown in FIG. 36.

Next, the plating resist films 152, 153 are removed, and then unnecessary portions of the first upper layer foundation metal layer 124 and the first lower layer foundation metal layer 141 are etched away using the first upper layer wiring line 125 and the first lower layer wiring line 142 as masks, with the result that the first upper layer foundation metal layer 124 remains only under the first upper layer wiring line 125 and that the first lower layer foundation metal layer 141 remains only on the first lower layer wiring line 142, as shown in FIG. 37. In this state, the first upper layer foundation metal layer 124 and the first upper layer wiring line 125 are connected at one end to the upper surface of the vertical conductor 123. Moreover, the first lower layer foundation metal layer 141 and the first lower layer wiring line 142 are electrically connected at one end to the lower surfaces of the first and second vertical conductors 104, 105.

Figure 38:
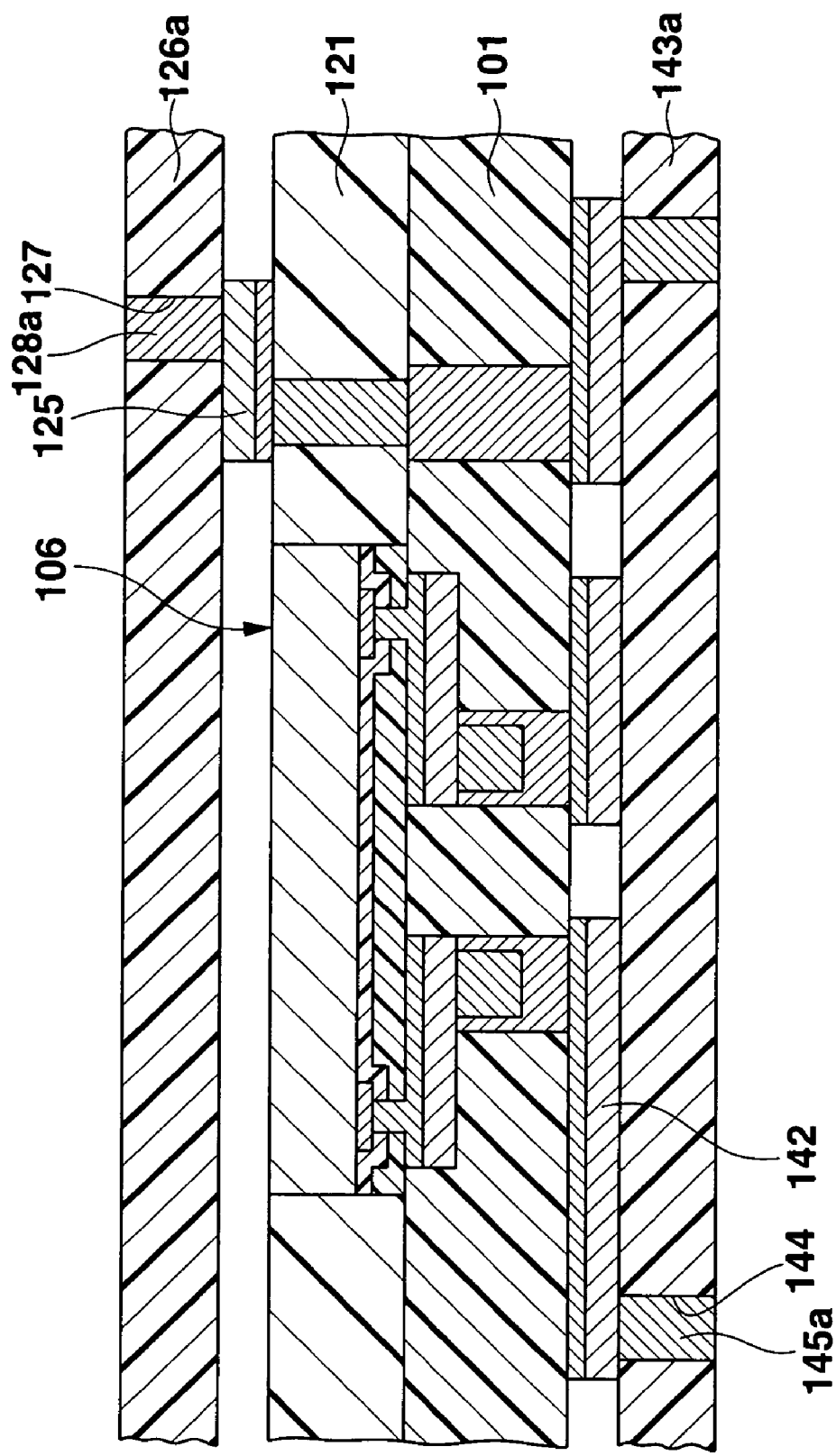
FIG. 38 is a sectional view of the assembly to explain a step following the step shown in FIG. 37.

Next, as shown in FIG. 38, planar square upper layer insulating film forming sheet 126a and lower layer insulating film forming sheet 143a, both of which are made of a thermosetting resin containing reinforcing materials are prepared. In this case, the thermosetting resin such as an epoxy-based resin or the like which constitutes the sheets 126a, 143a is in a semi-cured state. Further, vertical conductor forming pastes 128a and 145a made of a conductive paste such as copper paste are filled by the screen printing method or the like in the openings 127, 144 formed at a plurality of predetermined places of the sheets 126a and 143a by laser processing.

Furthermore, the first lower layer wiring line 142 formed under the base plate 101 is aligned with and disposed on an upper surface of the lower layer insulating film forming sheet 143a. The upper layer insulating film forming sheet 126a is aligned with and disposed on the upper surface of the first upper layer wiring line 125 formed on the insulating layer 121. In this state, a portion substantially at the center of a lower surface of the connection pad portion of the first lower layer wiring line 142 is disposed on the upper surface of the vertical conductor forming paste 145a. Further, a lower surface of the vertical conductor forming paste 128a is disposed substantially at the center of the upper surface of the connection pad portion of the first upper layer wiring line 125.

Figure 39:
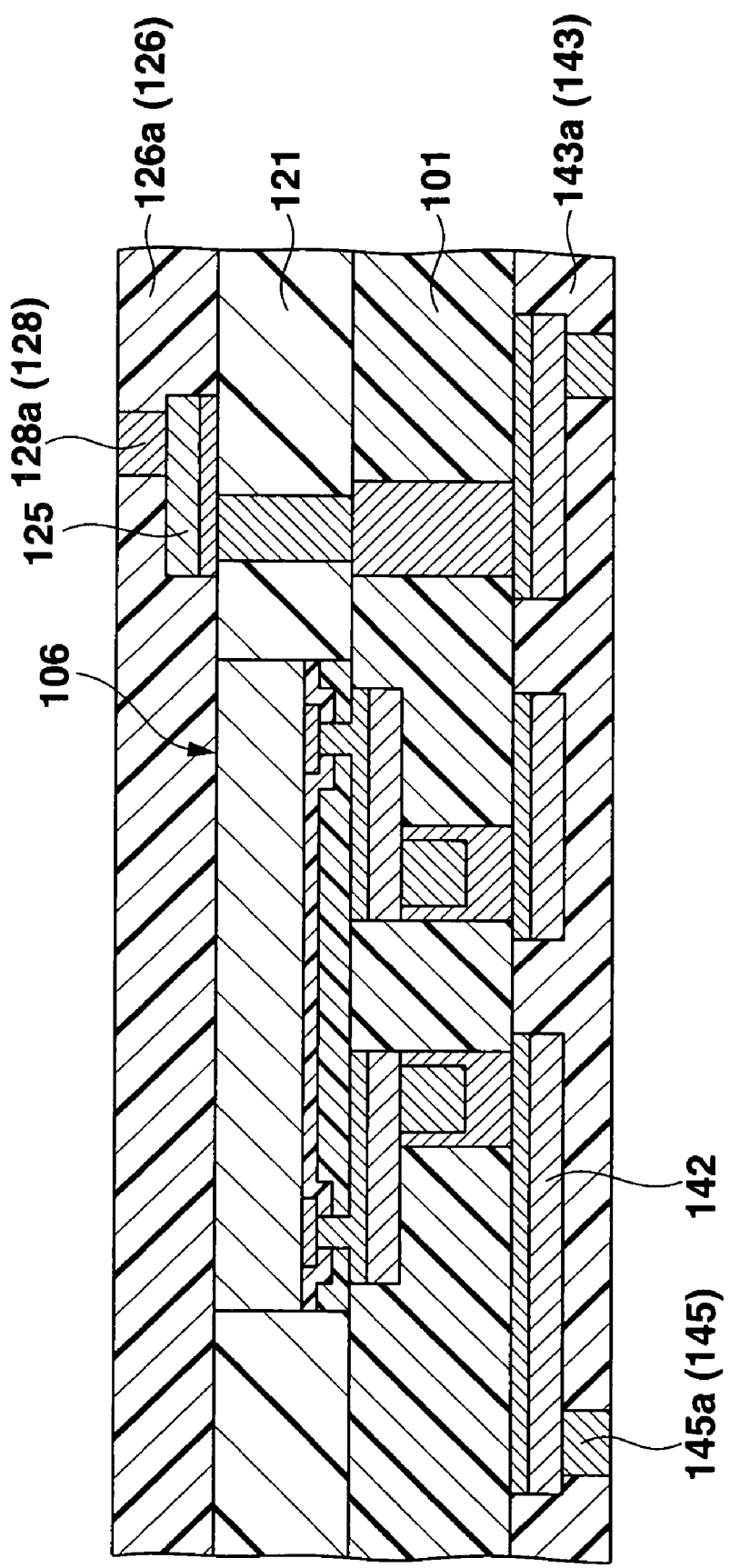
FIG. 39 is a sectional view of the assembly to explain a step following the step shown in FIG. 38.

Next, hot pressing is carried out from above and beneath using a pair of hot pressing plates (not shown). Then, as shown in FIG. 39, the thermosetting resin such as an epoxy-based resin or the like in the upper layer insulating film forming sheet 126a cures, and thus the upper layer insulating film 126 is formed on the upper surfaces of the first upper layer wiring line 125 and the insulating layer 121. Moreover, the vertical conductor forming paste 128a cures, so that the vertical conductor 128 is formed. In this state, a lower surface of the vertical conductor 128 is connected substantially to the center of an upper surface of the connection pad portion of the first upper layer wiring line 125.

Furthermore, the thermosetting resin such as an epoxy-based resin in the lower layer insulating film forming sheet 143a cures, and thus the lower layer insulating film 143 is formed on the lower surfaces of the first lower layer wiring line 142 and the base plate 1. Moreover, the vertical conductor forming paste 145a cures, so that the vertical conductor 145 is formed. In this state, an upper surface of the vertical conductor 145 is connected substantially to the center of a lower surface of the connection pad portion of the first lower layer wiring line 142.

Figure 40:
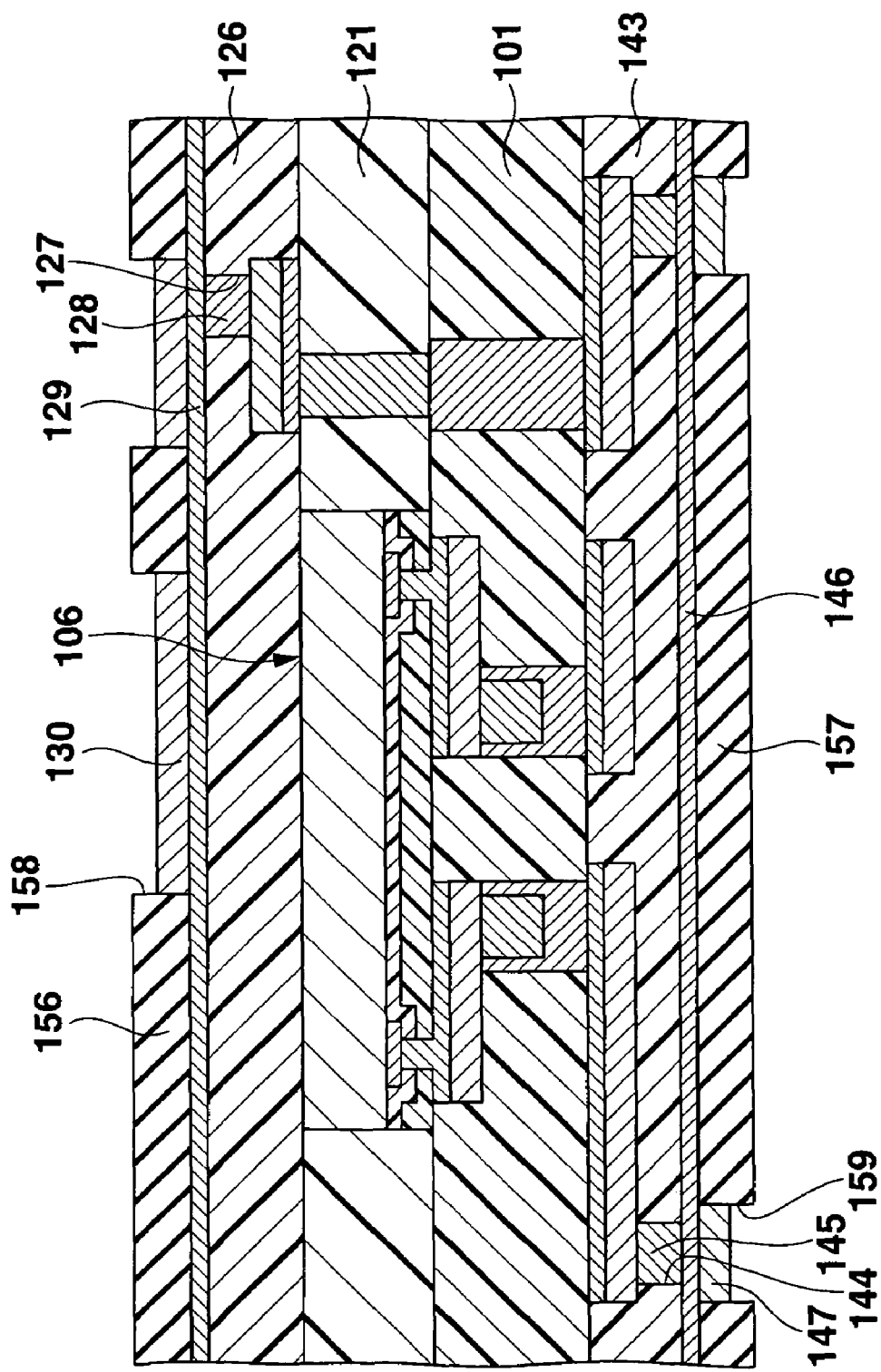
FIG. 40 is a sectional view of the assembly to explain a step following the step shown in FIG. 39.

Next, as shown in FIG. 40, by, for example, electroless plating of copper, the second upper layer foundation metal layer 129 is formed on the entire lower surfaces of the vertical conductor 128 and the upper layer insulating film 126, and the second lower layer foundation metal layer 146 is formed on the entire lower surfaces of the vertical conductors 145 and the lower layer insulating film 143. Next, an upper layer plating resist film 156 is formed/patterned on the upper surface of the second upper layer foundation metal layer 129, and a lower layer plating resist film 157 is formed/patterned on the lower surface of the second lower layer foundation metal layer 416. Thus, openings 158 are formed in the upper layer plating resist film 156 in portions corresponding and not corresponding to an area where the second upper layer wiring line 130 is to be formed. Moreover, openings 159 are formed in the lower layer plating resist film 157 in portions corresponding to areas where the second lower layer wiring line 147 are to be formed.

Next, electrolytic plating of copper is carried out using the second upper layer foundation metal layer 129 and the second lower layer foundation metal layer 146 as plating current passages, thereby forming the second upper layer wiring line 130 on the upper surface of the second upper layer foundation metal layer 129 in the opening 158 of the upper layer plating resist film 156, and also forming the second lower layer wiring line 147 on the lower surface of the second lower layer foundation metal layer 46 in the opening 159 of the lower layer plating resist film 157.

In this case as well, since the cured vertical conductor 128 is formed in the opening 127 of the upper layer insulating film 126, the upper surfaces of the vertical conductor 128 and the upper layer insulating film 126 are flat in the same plane. As a result, the upper surface of the second upper layer foundation metal layer 129 formed on the entire upper surfaces of the vertical conductor 128 and the upper layer insulating film 126 is also flat. Moreover, since the cured vertical conductor 415 is formed in the opening 144 of the lower layer insulating film 143, the lower surfaces of the vertical conductor 145 and the lower layer insulating film 143 are flat in the same plane. As a result, the lower surface of the second lower layer foundation metal layer 146 formed on the entire lower surfaces of the vertical conductor 145 and the lower layer insulating film 413 is also flat.

Therefore, even if a diameter of the opening 127 of the upper layer insulating film 126 is reduced, it is possible to completely prevent air bubbles or the like from entering the opening 127 of the upper layer insulating film 126 when the second upper layer wiring line 130 is formed on the upper surface of the second upper layer foundation metal layer 129 in the opening 158 of the upper layer plating resist film 516 by electrolytic plating. Moreover, even if a diameter of the opening 144 of the lower layer insulating film 143 is reduced, it is possible to completely prevent air bubbles or the like from entering the opening 144 of the lower layer insulating film 43 when the second lower layer wiring line 147 is formed on the lower surface of the second lower layer foundation metal layer 146 in the opening 159 of the lower layer plating resist film 157 by electrolytic plating.

Figure 41:
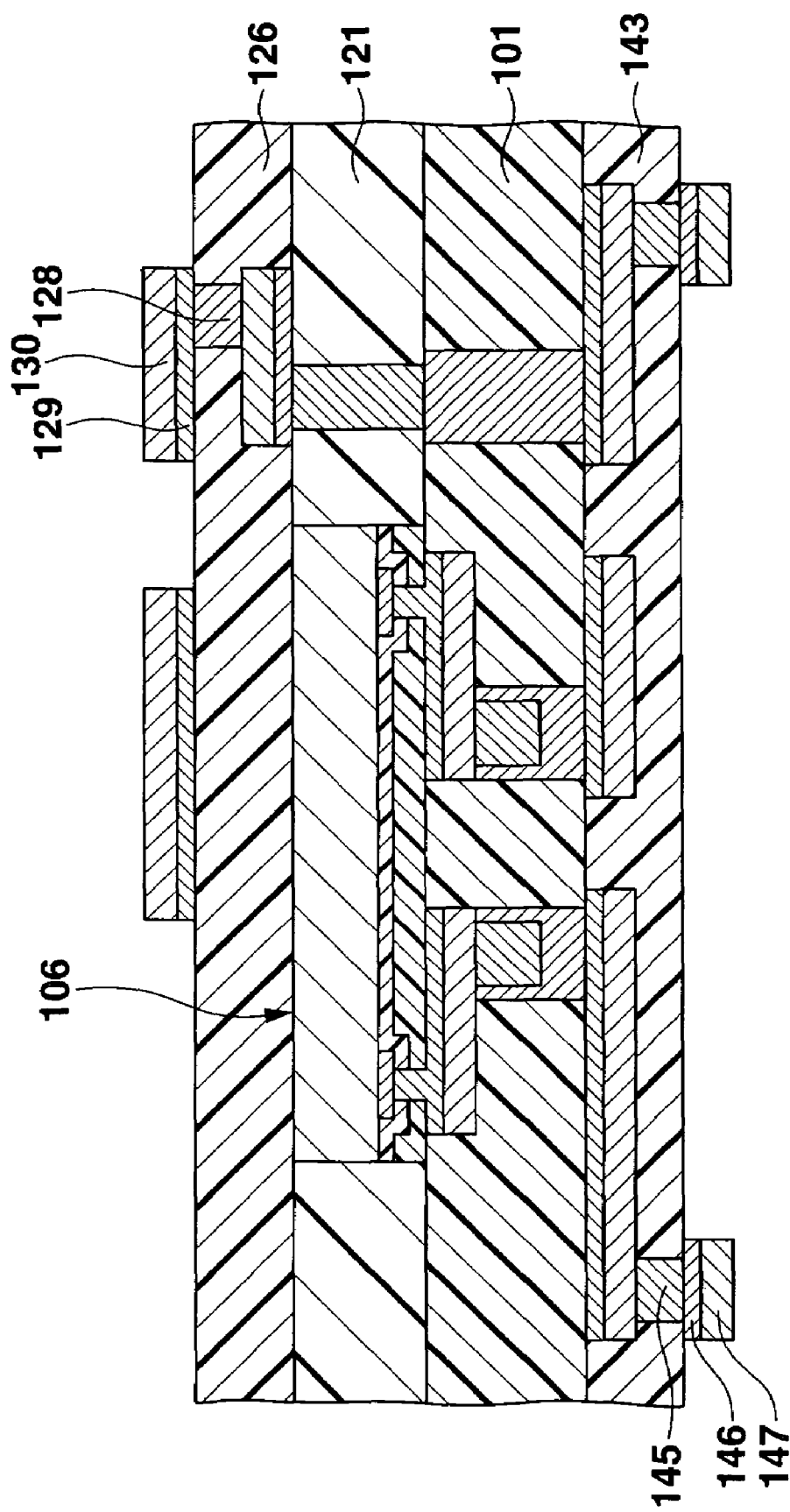
FIG. 41 is a sectional view of the assembly to explain a step following the step shown in FIG. 40.

Next, both the plating resist films 156, 158 are removed, and then unnecessary portions of the second upper layer foundation metal layer 129 and the second lower layer foundation metal layer 146 are etched and removed using the second upper layer wiring line 130 and the second lower layer wiring line 147 as masks, with the result that the second upper layer foundation metal layer 129 remains only under the second upper layer wiring line 130 and that the second lower layer foundation metal layer 146 remains only on the second lower layer wiring line 147, as shown in FIG. 41. In this state, the second upper layer foundation metal layer 129 and the second upper layer wiring line 130 are connected at one end to the upper surface of the vertical conductor 128. Moreover, the second metal layer 146 and wiring line 147 are electrically connected at one end to the lower surface of the vertical conductor 145.

Figure 42:
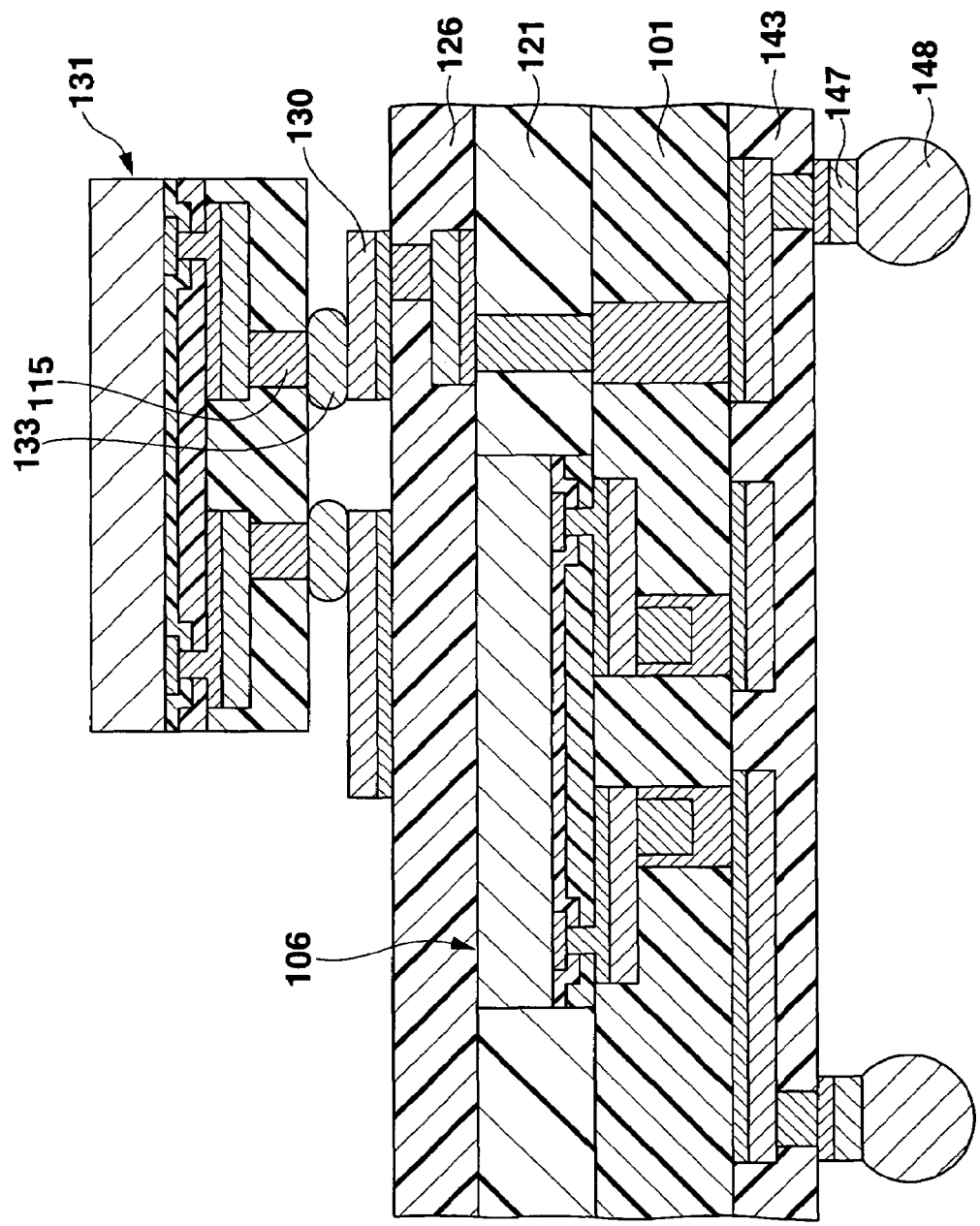
FIG. 42 is a sectional view of the assembly to explain a step following the step shown in FIG. 41.

Next, as shown in FIG. 42, the solder ball 148 is formed on a lower surface of a connection pad portion of the second lower layer wiring line 147. Then, the solder ball 133 under the columnar electrode 115 of the separately manufactured semiconductor construct 131 is bonded to the upper surface of the connection pad portion of the second upper layer wiring line 130. Then, the upper layer insulating film 126, the insulating layer 121, the base plate 1 and the lower layer insulating film 143 are cut between the semiconductor constructs 106 adjacent to each other, so that a plurality of semiconductor devices shown in FIG. 29 are obtained. It is to be noted that the upper layer insulating film 126, the insulating layer 121, the base plate 101 and the lower layer insulating film 143 may be cut before the semiconductor constructs 131 are installed, and the semiconductor constructs 131 may be installed after cutting them.

In the meantime, in the conventional semiconductor device described above, the semiconductor construct having a plurality of columnar electrodes on an upper surface side thereof is bonded to an upper surface of a base plate via a bonding layer. An insulating layer is provided on the upper surface of the base plate around the semiconductor construct. An upper layer insulating film is provided on upper surfaces of the semiconductor construct and the insulating layer. An upper layer wiring line is provided on an upper surface of the upper layer insulating film via the opening of the upper layer insulating film in such a manner as to connect the upper layer wiring line to the columnar electrode of the semiconductor construct. A part except for a connection pad portion of the upper layer wiring line is covered with an overcoat film. A solder ball is provided on the connection pad portion of the upper layer wiring line. Therefore, a structure of the conventional semiconductor device does not allow installation of an additional semiconductor construct.

On the contrary, in the semiconductor device shown in FIG. 29, the second upper layer wiring line 130 is provided on the upper surface of the upper layer insulating film 126, and the second upper layer wiring line 130 is electrically connected to the first lower layer wiring line 42 via the vertical conductor 127, the first upper layer wiring line 125 and the vertical conductors 123, 105, so that the additional semiconductor construct 31 can be installed on the second upper layer wiring line 30.

EIGHTH EMBODIMENT

Figure 43:
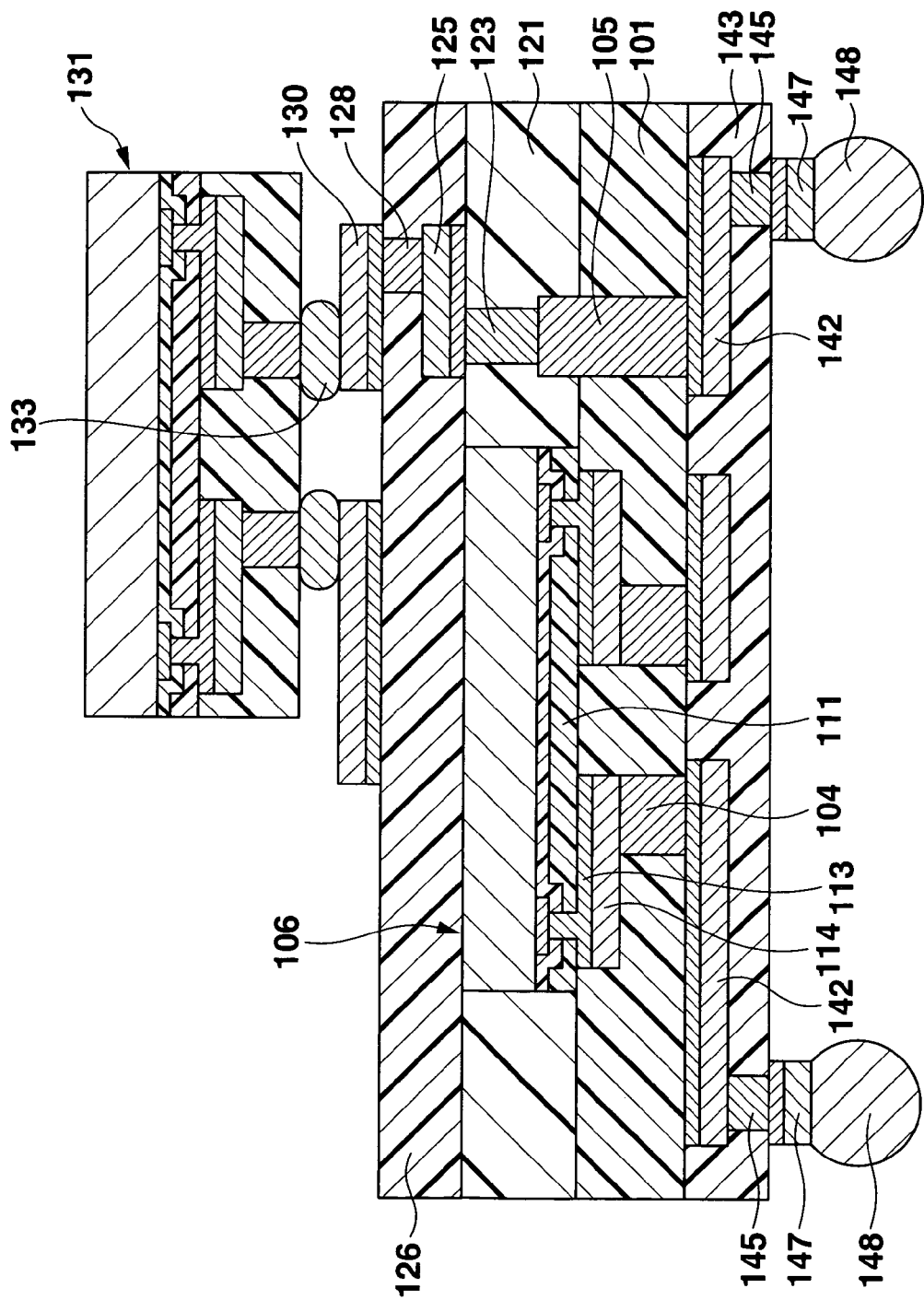
FIG. 43 is a sectional view of a semiconductor device as an eighth embodiment of this invention.

FIG. 43 shows a sectional view of a semiconductor device as an eighth embodiment of this invention. This semiconductor device is different from the semiconductor device shown in FIG. 29 in that a main semiconductor construct 106 has a structure in which a columnar electrode 115 is not provided on a lower surface of a connection pad portion of a wiring line 114. In this case, a foundation metal layer 113 and the wiring line (rewiring line) 114 are totally embedded into an upper surface of a base plate 101 in a state where the lower surfaces of their connection pad portions are connected to an upper surface of the first vertical conductor 104, and a lower surface of a protective film 111 is directly secured onto the upper surface of the base plate 101. Further, an upper portion of a second vertical conductor 105 protrudes from the upper surface of the base plate 101 and is disposed in an insulating layer 121.

Figure 44:
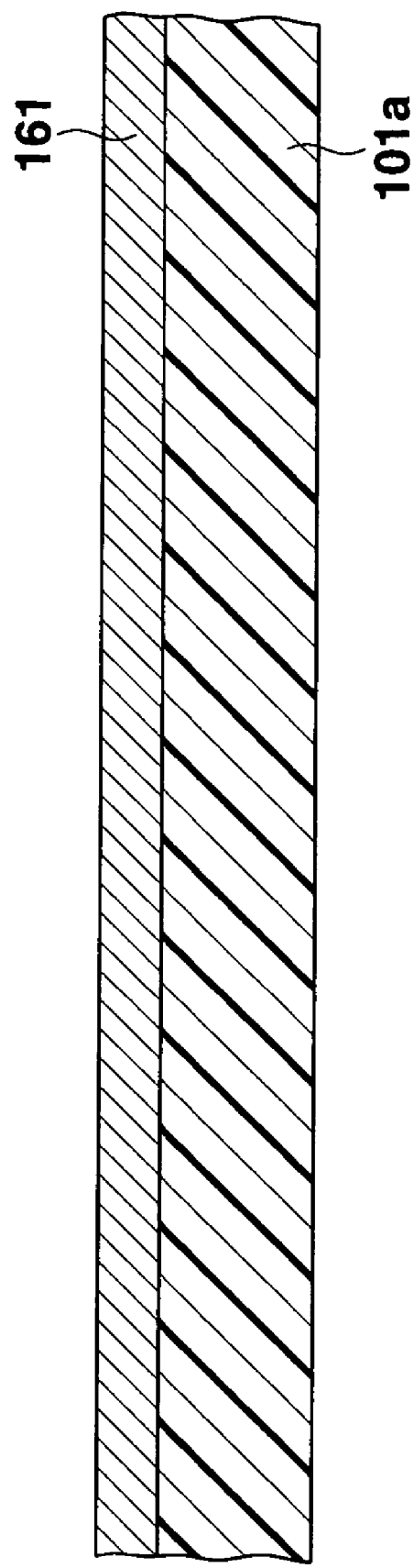
FIG. 44 is a sectional view of an assembly to explain a predetermined step in one example of a manufacturing method of the semiconductor device shown in FIG. 43.

Next, one example of a manufacturing method of this semiconductor device will be described. First, as shown in FIG. 44, a planar square base plate forming sheet 101a not limited to but made of a thermosetting resin containing reinforcing materials is prepared which has an area allowing a plurality of completed semiconductor devices shown in FIG. 43 to be formed. In this case as well, the thermosetting resin such as an epoxy-based resin which constitutes the base plate forming sheet 101a is in a semi-cured state. Next, a sheet 161 for formation of a protrusion described later is affixed onto an upper surface of the base plate forming sheet 101a.

Figure 45:
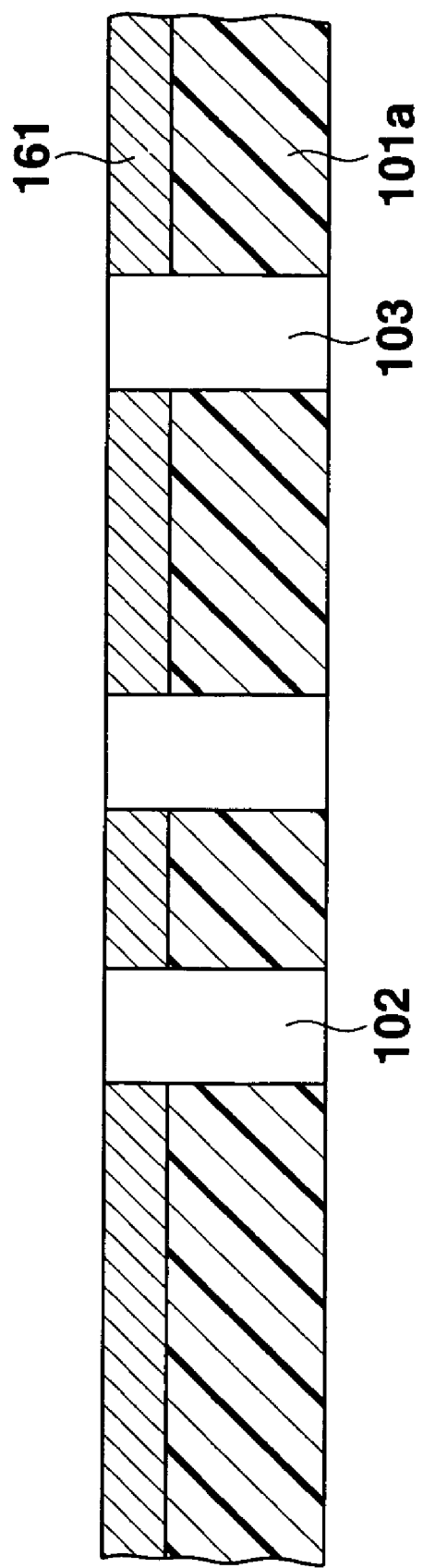
FIG. 45 is a sectional view of the assembly to explain a step following the step shown in FIG. 44.
Figure 46:
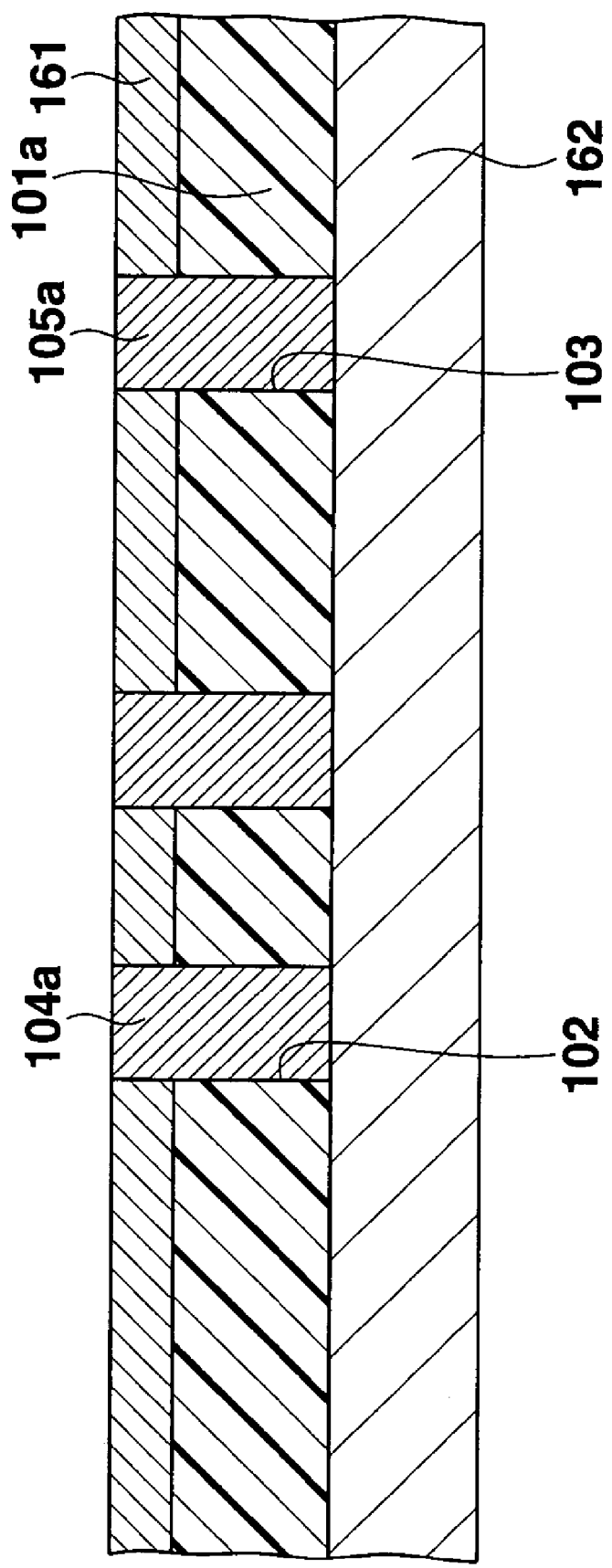
FIG. 46 is a sectional view of the assembly to explain a step following the step shown in FIG. 45.
Figure 47:
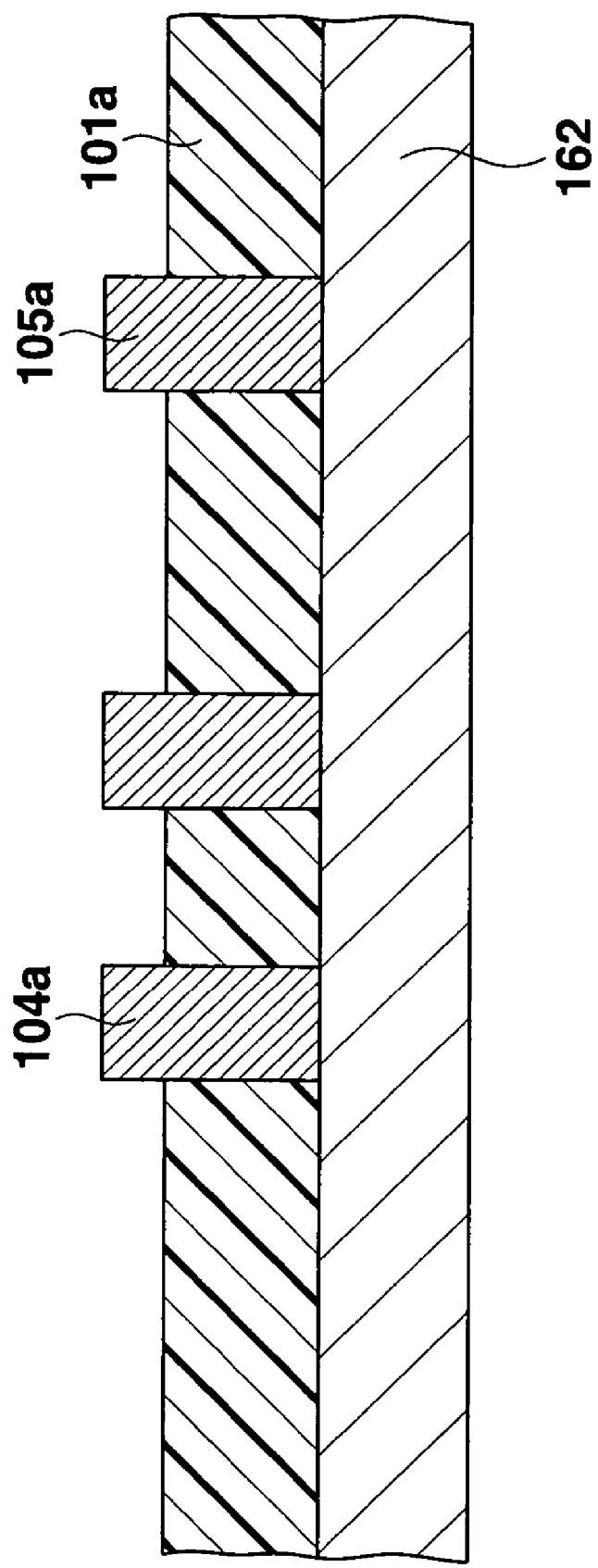
FIG. 47 is a sectional view of the assembly to explain a step following the step shown in FIG. 46.

Next, as shown in FIG. 45, first and second openings 102, 103 are formed at a plurality of predetermined places of the base plate forming sheet 101a and the protrusion forming sheet 161 by laser processing which applies laser beam such as $CO_2$ laser. Next, as shown in FIG. 46, a protective sheet 162 is prepared, and the base plate forming sheet 101a is mounted on an upper surface of the protective sheet 162. Then, first and second vertical conductor forming pastes 104a, 105a made of a conductive paste such as copper paste are filled into the first and second openings 102, 103 of the base plate forming sheet 101a and the protrusion forming sheet 161 by a screen printing method or the like. Next, if the protrusion forming sheet 161 is removed, upper portions of the first and second vertical conductor forming pastes 104a, 105a will be in a state protruding from the upper surface of the base plate forming sheet 101a to the extent corresponding to thickness of the protrusion forming sheet 161, as shown in FIG. 47.

Figure 48:
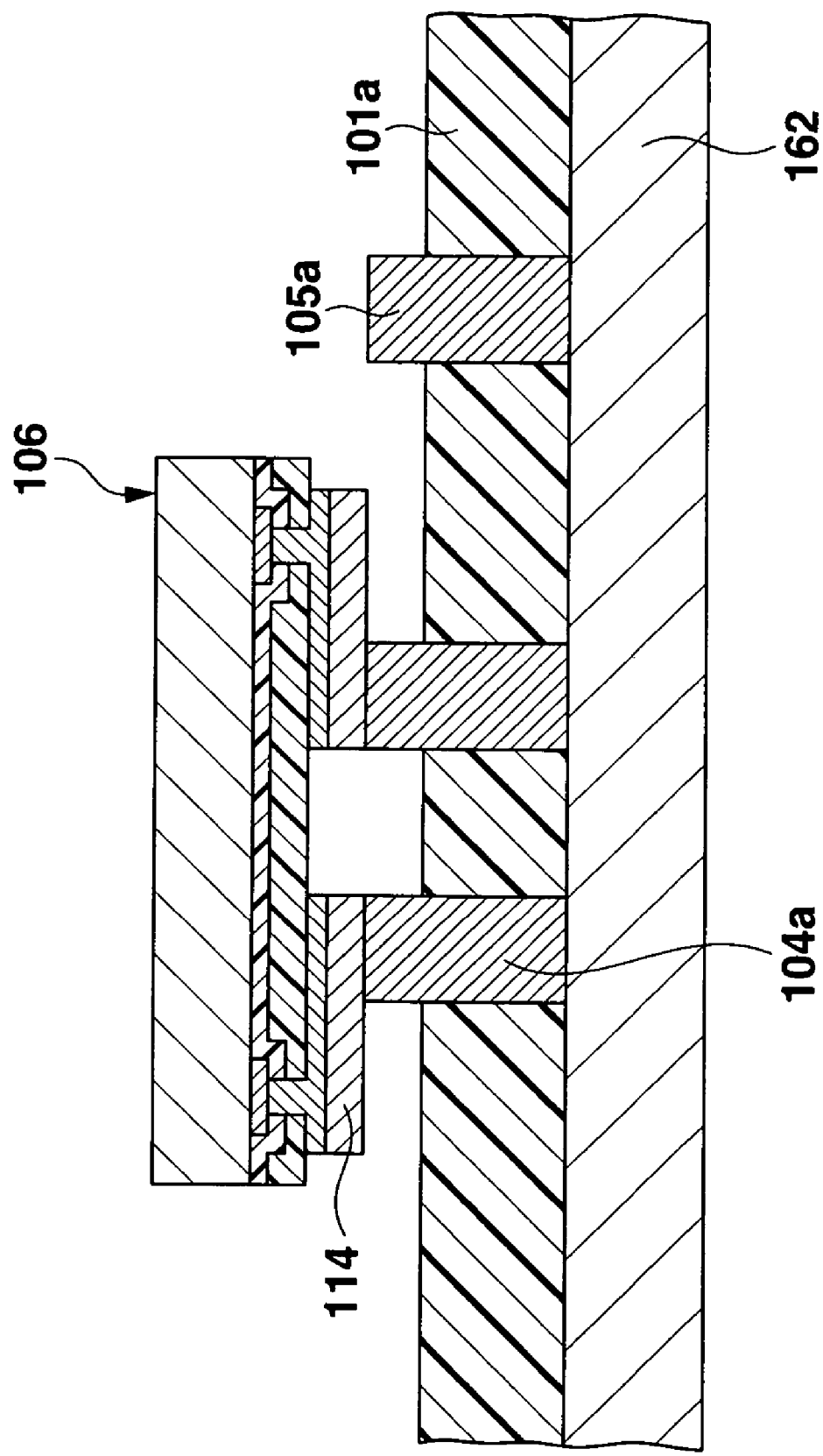
FIG. 48 is a sectional view of the assembly to explain a step following the step shown in FIG. 47.

Next, as shown in FIG. 48, a lower surface of a connection pad portion of the wiring line 114 of the semiconductor constructs 106 is aligned with the upper surface of the first vertical conductor forming paste 104a protruding from the upper surface of the base plate forming sheet 101a, and then temporarily press-bonded (temporarily secured) thereto. That is, the lower surface of the connection pad portion of the wiring line 114 of the semiconductor constructs 106 is temporarily press-bonded to the upper surface of the first vertical conductor forming paste 104a in a preheated state together with application of a relatively low pressure by use of a bonding tool (not shown) with a heating mechanism. In this state, a plurality of semiconductor constructs 6 are temporarily secured onto the base plate forming sheet 11a in such a manner as to leave space between them.

Figure 49:
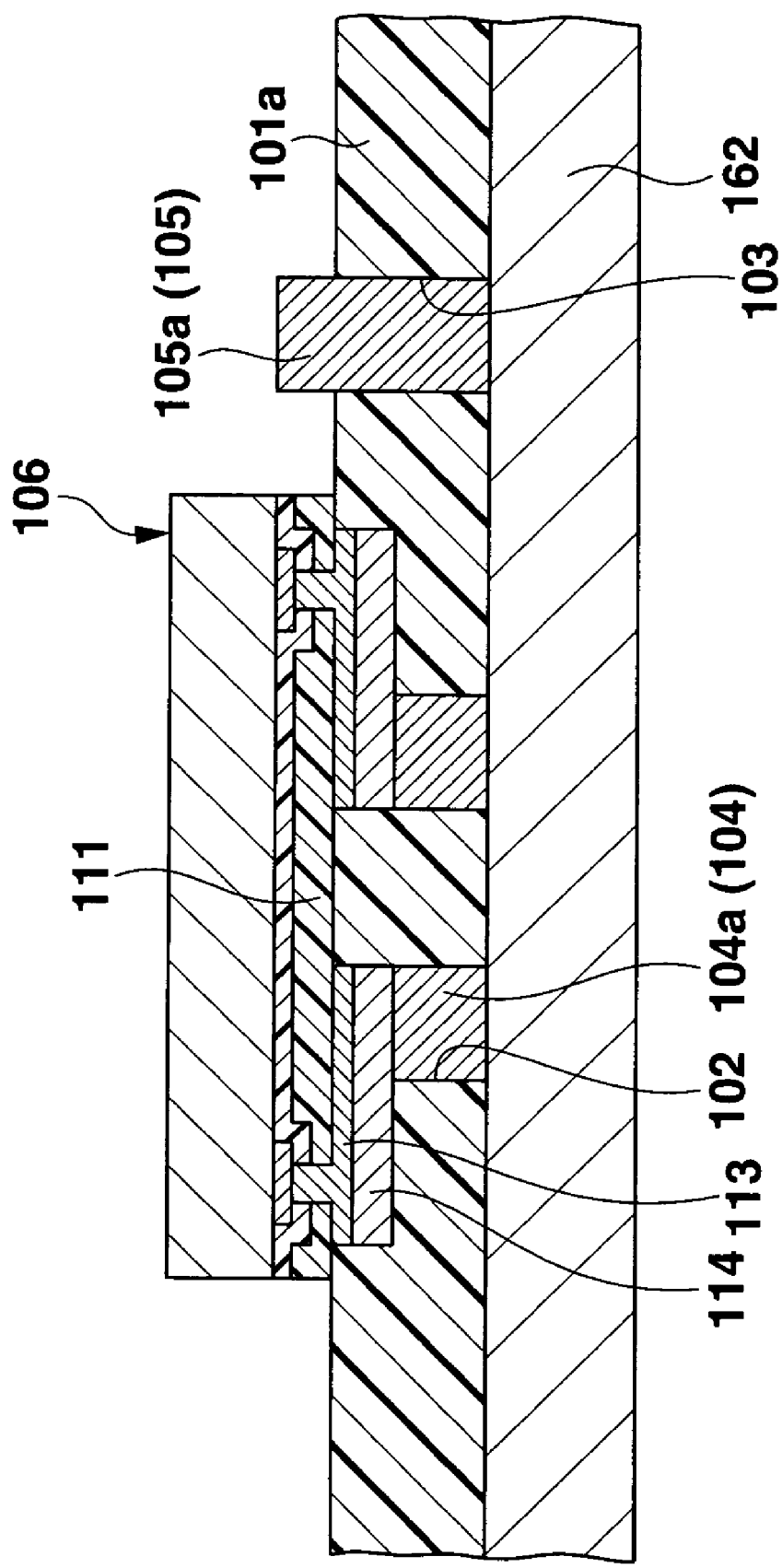
FIG. 49 is a sectional view of the assembly to explain a step following the step shown in FIG. 48.

Next, hot pressing is carried out from above and beneath using a pair of hot pressing plates (not shown). Then, as shown in FIG. 49, first, the protrusion of the first vertical conductor forming paste 104a protruding from the upper surface of the base plate forming sheet 101a is completely pressed into the opening 102 of the base plate forming sheet 101a by the lower surface of the connection pad portion of the wiring line 114 of the semiconductor constructs 106. Then, the foundation metal layer 113 and the wiring line 114 are totally embedded into the upper surface of the base plate forming sheet 101a while compressing the vertical conductor forming paste 104a. The lower surface of the protective film 111 is in a state pressure-welded to the upper surface of the base plate forming sheet 101a. Then, a thermosetting resin such as an epoxy-based resin in the base plate forming sheet 1a cures, and thus the base plate 1 is formed. The first and second vertical conductor forming pastes 104a, 105a cure, so that the first and second vertical conductors 104, 105 are formed. In this case, the second vertical conductor 105 is only heated and not pressurized, and its upper portion is therefore still protruding from an upper surface of the base plate 101.

Thus, the semiconductor construct 106 is directly secured face down at the predetermined place onto the upper surface of the base plate 101. That is, the foundation metal layer 113 and the wiring line 114 are totally embedded into the upper surface of the base plate 101 in a state where lower surfaces of their connection pad portions are connected to an upper surface of the first vertical conductor 104, and a lower surface of a protective film 111 is directly secured onto the upper surface of the base plate 101. Here, in a state shown in FIG. 48, the upper portion of the first vertical conductor forming paste 104a protrudes from the upper surface of the base plate forming sheet 101a such that the lower surface of the connection pad portion of the wiring line 114 whose lower surface is entirely flat is reliably and rigidly secured onto the upper surface of the first vertical conductor 104.

Figure 50:
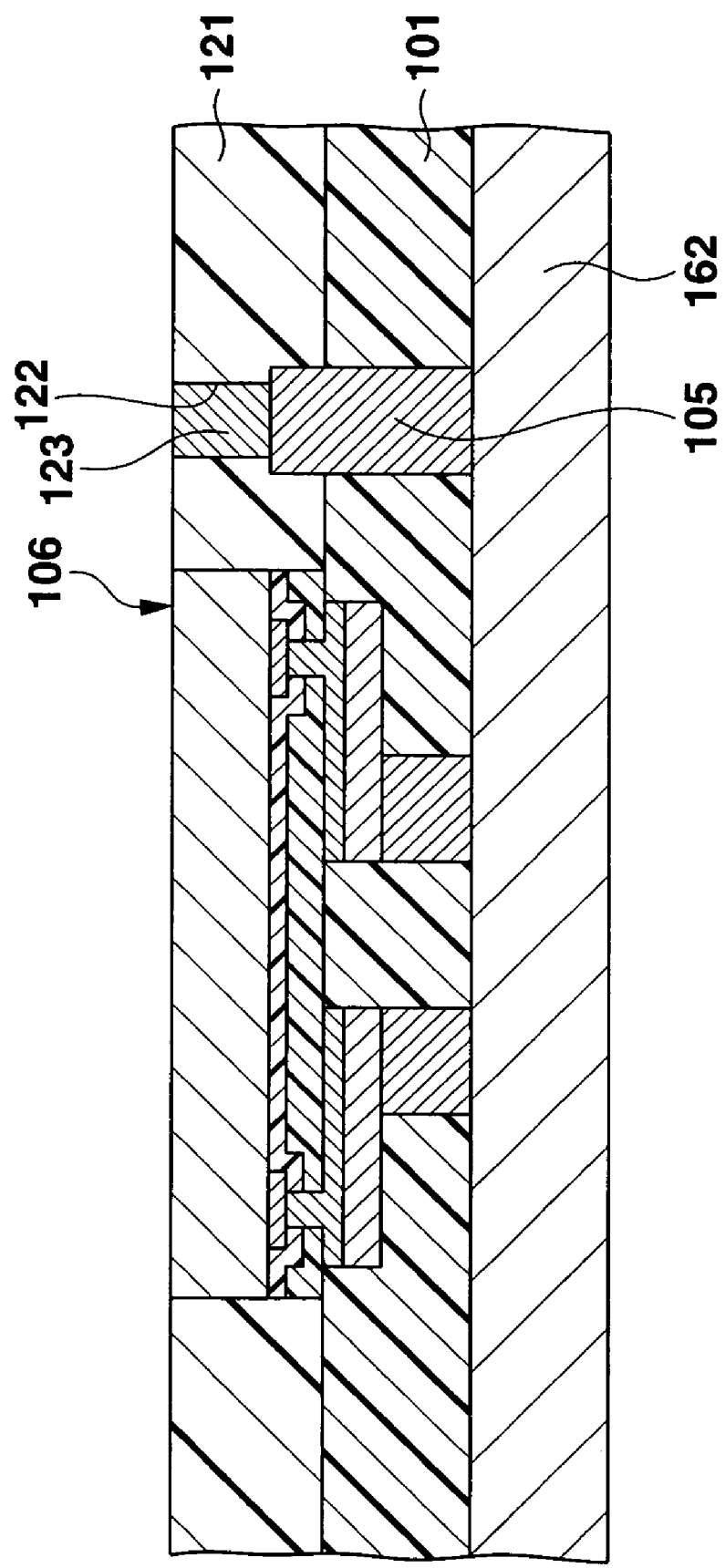
FIG. 50 is a sectional view of the assembly to explain a step following the step shown in FIG. 49.

Next, as shown in FIG. 50, a liquid thermosetting resin such as an epoxy-based resin is applied onto upper surfaces of the second vertical conductor 105 and the base plate 101 around the semiconductor construct 106 by a screen printing method, a spin coat method or the like, and cured, thereby forming the insulating layer 121 so that its upper surface may substantially form the same surface with an upper surface of the semiconductor construct 106.

Next, an opening 122 is formed in the insulating layer 121 substantially at the center of the upper surface of the second vertical conductor 105 by laser processing which applies laser beam such as $CO_2$ laser. Then, an upper conductor forming paste made of a conductive paste such as copper paste is filled into the opening 122 of the insulating layer 211 by the screen printing method or the like, and cured, thereby forming the vertical conductor 123 so that it is connected to the upper surface of the second vertical conductor 105. Then, the protective sheet 162 is removed. The following steps are the same as those in the first embodiment described above, and will not be described.

NINTH EMBODIMENT

Figure 51:
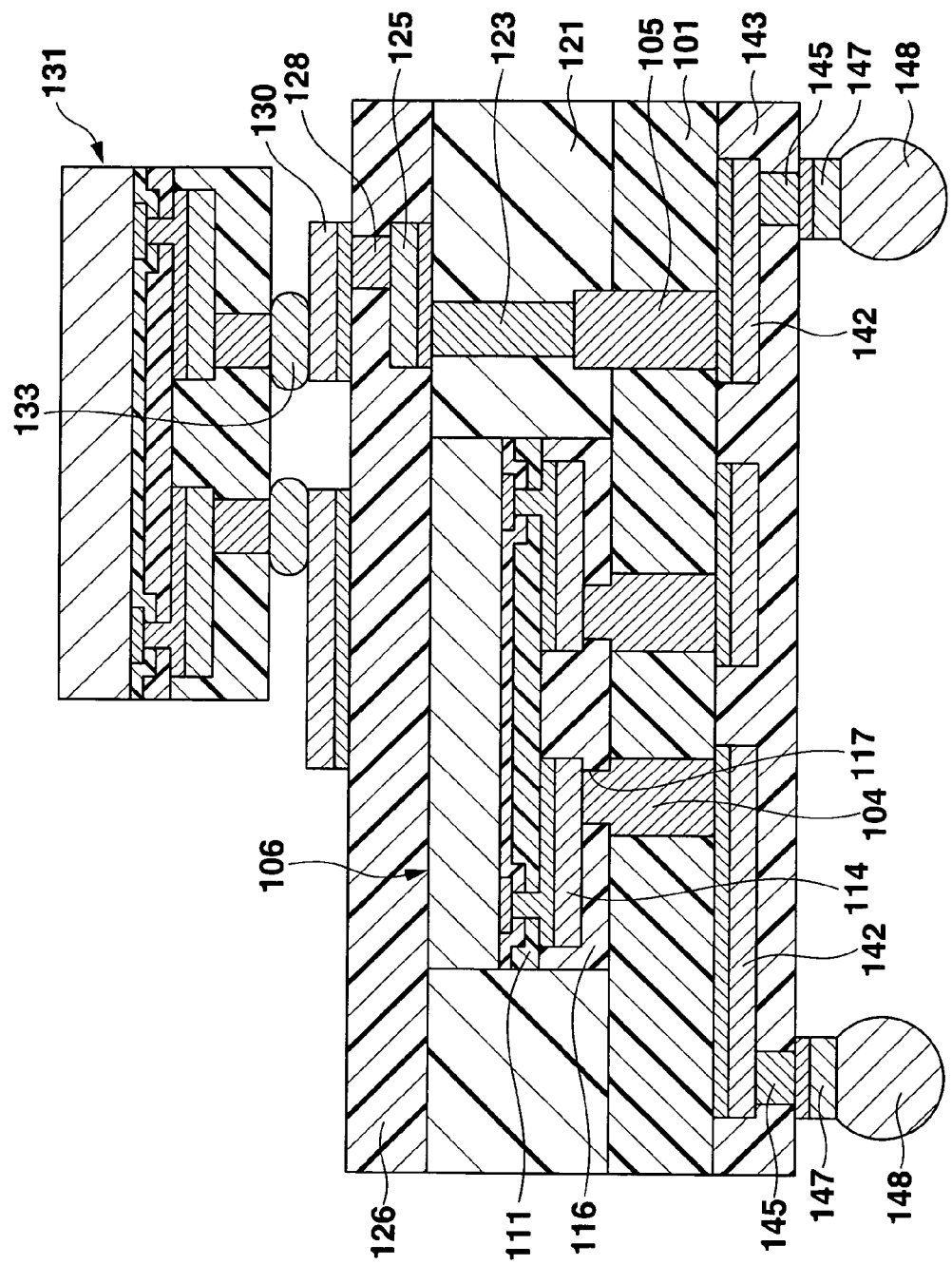
FIG. 51 is a sectional view of a semiconductor device as a ninth embodiment of this invention.

FIG. 51 shows a sectional view of a semiconductor device as a ninth embodiment of this invention. This semiconductor device is different from the semiconductor device shown in FIG. 43 in that a main semiconductor construct 106 has a structure in which an overcoat film 116 made of a solder resist or the like is provided on lower surfaces of a wiring line 114 and a protective film 111 and in which an opening 117 is provided in the overcoat film 116 in a portion corresponding to a connection pad portion of the wiring line 114. In this case, the main semiconductor construct 106 is mounted on a base plate 101 in a state where a protrusion from an upper surface of a base plate 101 of a first vertical conductor 4 enters the opening 117 of the overcoat film 116 to be connected to a lower surface of the connection pad portion of the wiring line 114 and where a lower surface of the overcoat film 116 is directly secured onto the upper surface of the base plate 1.

TENTH EMBODIMENT

Figure 52:
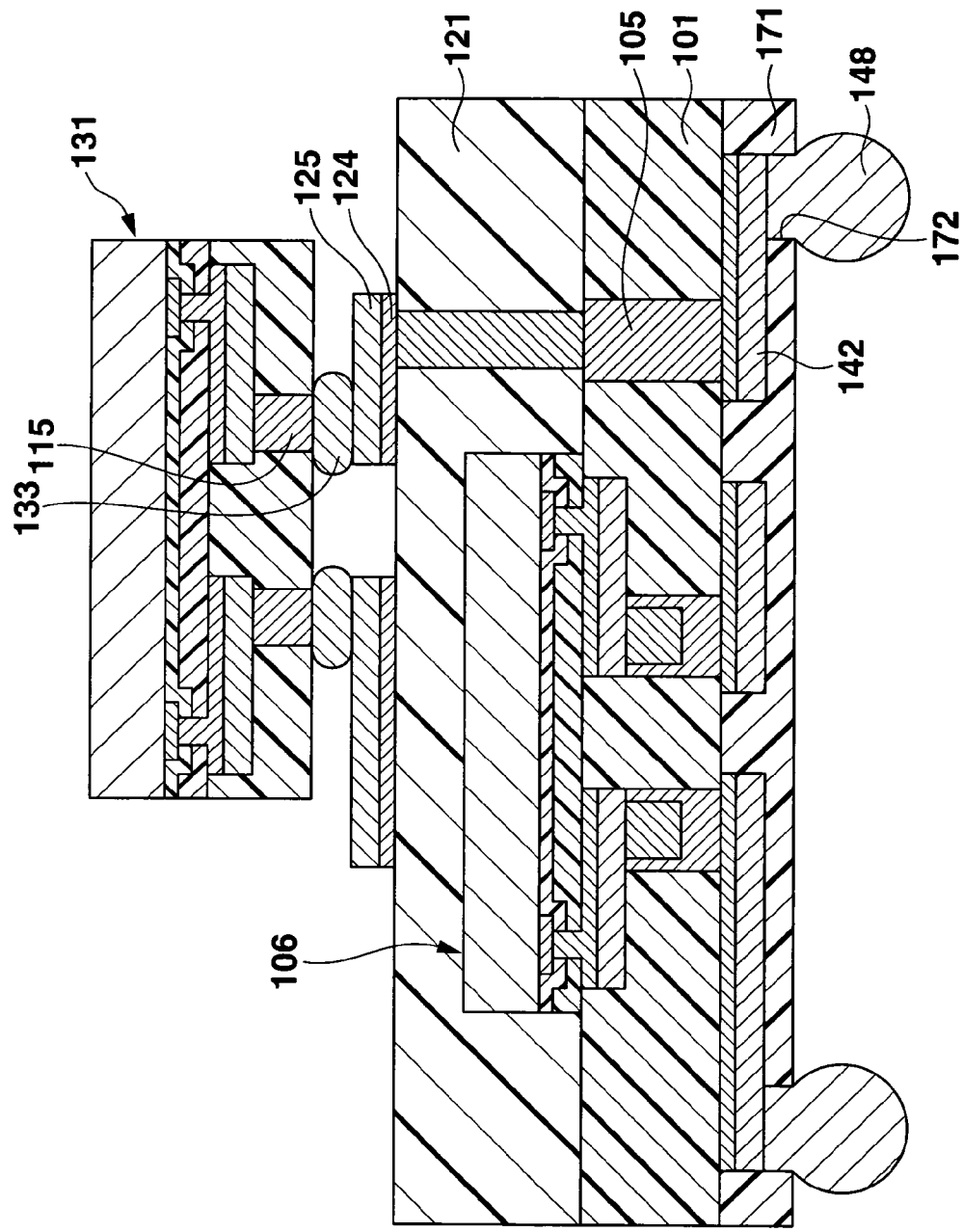
FIG. 52 is a sectional view of a semiconductor device as a tenth embodiment of this invention.

FIG. 52 shows a sectional view of a semiconductor device as a tenth embodiment of this invention. This semiconductor device is largely different from the semiconductor device shown in FIG. 29 in that both a lower wiring layer line and an upper layer wiring line are formed of one layer. That is, a lower layer insulating film 171 made of a solder resist or the like is formed on lower surfaces of a lower layer wiring line 142 and a base plate 101 by a screen printing method, a spin coat method or the like. A solder ball 148 is formed in and under an opening 172 formed in the lower layer insulating film 171 at a position corresponding to a connection pad portion of the lower layer wiring line 142 in such a manner as to be connected to a lower surface of the connection pad portion of the lower layer wiring line 142.

An insulating layer 121 is formed on an upper surface of a semiconductor construct 106 and upper surfaces of a second vertical conductor 105 and the base plate 101 around the semiconductor construct 106. Upper layer foundation metal layers 124 and upper layer wiring lines 125 provided thereon are formed on an upper surface of an insulating layer 121. A solder ball 133 provided under a columnar electrode 115 of an additional semiconductor construct 131 is bonded to an upper surface of a connection pad portion of the upper layer wiring line 125. In this case, the insulating layer 121 is formed on the upper surface of the semiconductor construct 106 and the upper surfaces of the second vertical conductor 105 and the base plate 101 around the semiconductor construct 106 in a bonding step as shown in FIG. 34.

OTHER EMBODIMENTS

For example, in the seventh embodiment described above, cutting is implemented between the semiconductor constructs 106 adjacent to each other, but the present invention is not limited thereto. The cutting may be implemented with a set of two or more semiconductor constructs 106 to obtain multichip module type semiconductor devices. Further, the first lower layer wiring line 142 electrically connected to the vertical conductor 103 is provided on the lower surface of the base plate 101, and the solder ball 148 is connected to a connection pad portion of the first lower surface wiring line (wiring line) 142 via the vertical conductor 145 and the second lower layer wiring line 147, but the solder ball and electronic components may be directly bonded to a lower part of the vertical conductor 105. Moreover, for example, in the seventh embodiment described above, the additional semiconductor construct 131 called a CSP is installed on the connection pad portion of the second upper layer wiring line 130, but the present invention is not limited thereto. Other semiconductor constructs such as a bear chip and electronic components including chip components such as a condenser and a resistor may be installed.

According to this invention, the vertical conductor is provided in the opening formed in the base plate made of an insulating material including at least a thermosetting resin. Therefore, even if the diameter of the opening for vertical conduction formed in the base plate is reduced, it is possible to completely prevent air bubbles or the like from entering the opening when electrolytic plating is carried out to form the lower layer wiring line under the vertical conductor and the base plate.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general invention concept as defined by the appended claims and their equivalents.

What is claimed is:

1. A method of manufacturing a semiconductor device, comprising:
    forming a plurality of openings penetrating in a thickness direction in a base plate forming sheet made of material including a thermosetting resin in a semi-cured state;
    filling a vertical conductor forming paste including a conductive paste into each of the openings of the base plate forming sheet;
    arranging a plurality of semiconductor constructs each having a semiconductor substrate and a plurality of external connection electrodes provided on one surface of the semiconductor substrate in such a manner as to leave space between them on the vertical conductor forming paste and the base plate forming sheet;
    curing the thermosetting resin in the base plate forming sheet to form a base plate, curing the vertical conductor forming paste to form a plurality of vertical conductors, and securing the semiconductor constructs onto the base plate in a state where the external connection electrodes are respectively connected to the vertical conductors;
    forming an insulating layer on the base plate around the semiconductor constructs; and
    cutting the insulating layer and the base plate between the semiconductor constructs, thus obtaining a plurality of semiconductor devices each including at least one semiconductor construct.

2. The manufacturing method according to claim 1, wherein each of the semiconductor constructs has a sealing film formed between the external connection electrodes of the semiconductor substrate, and the sealing film is secured to the base plate.

3. The manufacturing method according to claim 2, wherein the semiconductor construct includes a construct in which a lower surface of the sealing film forms the same plane with a lower surface of each of the external connection electrodes.

4. The manufacturing method according to claim 1, wherein forming the openings in the base plate forming sheet includes affixing a protrusion forming sheet onto the base plate forming sheet to form the openings in the base plate forming sheet and the protrusion forming sheet.

5. The manufacturing method according to claim 4, wherein filling the vertical conductor forming paste into the each of openings of the base plate forming sheet includes disposing a protective sheet under the base plate forming sheet, filling the vertical conductor forming paste into the opening of the base plate forming sheet and the protrusion forming sheet, and then releasing the protrusion forming sheet to protrude an upper portion of the vertical conductor forming paste onto the base plate forming sheet.

6. The manufacturing method according to claim 5, wherein arranging said a plurality of semiconductor constructs on the vertical conductor forming paste and the base plate forming sheet includes preheating the semiconductor constructs, and temporarily securing, by hot pressing, the external connection electrodes of each of the semiconductor constructs to a protrusion protruding on the base plate forming sheet of the vertical conductor forming paste.

7. The manufacturing method according to claim 6, wherein securing the semiconductor constructs onto the base plate in the state where the external connection electrodes are respectively connected to the vertical conductors includes pushing, by pressurization, the protrusion of the vertical conductor forming paste protruding on the base plate forming sheet into the opening of the base plate forming sheet by a lower surface of the semiconductor construct, and pressure-welding the lower surface of the semiconductor construct to upper surfaces of the vertical conductor forming paste and the base plate forming sheet.

8. The manufacturing method according to claim 7, comprising releasing the protective sheet after securing the external connection electrode of the semiconductor construct onto the base plate in the state connected to the vertical conductor.

9. The manufacturing method according to claim 1, wherein each of the semiconductor constructs includes a construct in which a lower portion of each of the external connection electrodes protrudes from a lower surface of the sealing film.

10. The manufacturing method according to claim 9, wherein filling the vertical conductor forming paste into the opening of the base plate forming sheet includes disposing a protective sheet under the base plate forming sheet, and filling the vertical conductor forming paste into the opening of the base plate forming sheet.

11. The manufacturing method according to claim 10, wherein arranging the semiconductor constructs on the vertical conductor forming paste and the base plate forming sheet includes preheating the semiconductor constructs, and temporarily securing, by hot pressing, the columnar external connection electrodes of the semiconductor constructs protruding from the sealing film to the vertical conductor forming pastes.

12. The manufacturing method according to claim 1, wherein securing the semiconductor constructions onto the base plate in the state where the external connection electrodes are respectively connected to the vertical conductors includes causing, by pressurization, the external connection electrodes of each of the semiconductor constructs to cut into the vertical conductor forming pastes.

13. The manufacturing method according to claim 12, comprising affixing a protective sheet to the base plate forming sheet before causing the external connection electrode of the semiconductor construct to cut into the vertical conductor forming paste.

14. The manufacturing method according to claim 13, comprising releasing the protective sheet after causing the external connection electrodes of the semiconductor construct to cut into the vertical conductor forming pastes.

15. The manufacturing method according to claim 1, comprising forming a plurality of lower layer wiring lines under the vertical conductor and the base plate in such a manner as to connect the lower layer wiring lines to the vertical conductors.

16. A method of manufacturing a semiconductor device, comprising:
 providing a base plate having a first vertical conductor and a second vertical conductor which have a predetermined thickness and penetrate in a direction of the thickness of the base plate;
 providing a plurality of semiconductor constructs each having a columnar electrodes connected to connection pads on a semiconductor substrate;
 thermally press-bonding the columnar electrodes to the first vertical conductors;
 covering a periphery of each of the semiconductor constructs with an insulating layer;
 forming a conductive member connected to the second vertical conductor; and
 cutting the insulating layer and the base plate between the semiconductor constructs, and thus obtaining a plurality of semiconductor devices each including at least one semiconductor construct.

* * * * *